(12) United States Patent
Facchetti et al.

(10) Patent No.: US 12,364,155 B2
(45) Date of Patent: Jul. 15, 2025

(54) POLYMER COMPOSITIONS FOR VERTICAL CHANNEL ORGANIC ELECTROCHEMICAL TRANSISTORS AND COMPLEMENTARY LOGIC CIRCUITS

(71) Applicants: Northwestern University, Evanston, IL (US); Flexterra, Inc., Skokie, IL (US)

(72) Inventors: Antonio F. Facchetti, Chicago, IL (US); Tobin J. Marks, Evanston, IL (US); Wei Huang, Sichuan (CN); Jianhua Chen, Guangdong (CN); Yu Xia, Northbrook, IL (US)

(73) Assignees: Northwestern University, Evanston, IL (US); Flexterra, Inc., Skokie, IL (US)

( * ) Notice: Subject to any disclaimer, the term of this patent is extended or adjusted under 35 U.S.C. 154(b) by 633 days.

(21) Appl. No.: 17/857,596

(22) Filed: Jul. 5, 2022

(65) Prior Publication Data
US 2023/0022693 A1     Jan. 26, 2023

Related U.S. Application Data

(60) Provisional application No. 63/218,596, filed on Jul. 6, 2021.

(51) Int. Cl.
*H01L 27/28* (2006.01)
*C08L 65/00* (2006.01)
(Continued)

(52) U.S. Cl.
CPC .......... *H10K 85/113* (2023.02); *C08L 65/00* (2013.01); *C09D 5/24* (2013.01); *C09D 165/00* (2013.01);
(Continued)

(58) Field of Classification Search
CPC ............... H01L 27/283; H01L 51/0036; H01L 51/0043; H01L 51/0566; C08L 65/00;
(Continued)

(56) References Cited

U.S. PATENT DOCUMENTS

| | | | | |
|---|---|---|---|---|
| 2008/0014373 A1* | 1/2008 | Muramatsu | .......... | G02B 5/3058 428/98 |
| 2014/0338735 A1* | 11/2014 | Allemand | ............ | H05K 9/0092 136/255 |
| 2015/0065664 A1* | 3/2015 | Konno | .................... | C08G 75/14 525/537 |

FOREIGN PATENT DOCUMENTS

| WO | WO 2006/013906 A1 | 2/2006 | |
|---|---|---|---|
| WO | WO-2018043807 A1 * | 3/2018 | ................ C08J 3/11 |

(Continued)

OTHER PUBLICATIONS

Yan, Yujie, et al. "High-performance organic electrochemical transistors with nanoscale channel length and their application to artificial synapse." *ACS Applied Materials & Interfaces* 12.44 (2020): 49915-49925.
(Continued)

*Primary Examiner* — Bijan Ahvazi
(74) *Attorney, Agent, or Firm* — Bell & Manning LLC

(57) ABSTRACT

Photocurable compositions that combine redox-active semiconducting organic polymers with photocurable organic molecules are provided. Upon exposure to radiation, the photocurable compositions form ion-permeable, electrically conductive crosslinked organic films that can be used as conducting channels in n-channel or p-channel organic electrochemical transistors, including vertical organic electrochemical transistors (vOECTs). The vOECTs can be incorporated in complementary electronic circuits.

16 Claims, 49 Drawing Sheets

(51) Int. Cl.

| | |
|---|---|
| *C09D 5/24* | (2006.01) |
| *C09D 165/00* | (2006.01) |
| *H01G 9/22* | (2013.01) |
| *H01G 9/26* | (2006.01) |
| *H01L 51/00* | (2006.01) |
| *H10K 19/10* | (2023.01) |
| *H10K 85/10* | (2023.01) |
| *H10K 10/46* | (2023.01) |

(52) U.S. Cl.
CPC ............... *H01G 9/22* (2013.01); *H01G 9/26* (2013.01); *H10K 19/10* (2023.02); *H10K 85/151* (2023.02); *H10K 10/488* (2023.02)

(58) Field of Classification Search
CPC .......... C09D 5/24; C09D 165/00; H01G 9/22; H01G 9/26
See application file for complete search history.

(56) References Cited

FOREIGN PATENT DOCUMENTS

| WO | WO-2020076882 A1 * | 4/2020 | ........... C08G 61/124 |
|---|---|---|---|
| WO | WO 2023/114560 A2 | 6/2023 | |

OTHER PUBLICATIONS

Zeglio, Erica, and Olle Inganäs. "Active materials for organic electrochemical transistors." *Advanced Materials* 30.44 (2018): 1800941.

Lenz, Jakob, et al. "Vertical, electrolyte-gated organic transistors show continuous operation in the MA cm-2 regime and artificial synaptic behaviour." *Nature nanotechnology* 14.6 (2019): 579-585.

Mary J. Donahue et al., "High Performance Vertical Organic Electrochemical Transistors," Advanced Materials (2018), vol. 30, No. 5; 1705031.

Hanyu Jia et al., "Engineering Donor-Acceptor Conjugated Polymers for High-Performance and Fast-Response Organic Electrochemical Transistors," Journal of Materials Chemistry C (2021), vol. 9, No. 14; pp. 4927-4934.

Maximilian Moser et al., "Polaron Delocalization in Donor-Acceptor Polymers and its Impact on Organic Electrochemical Transistor Performance," *Angew. Chem. Int. Ed.* 2021, vol. 60; pp. 7777-7785.

Zhi Wang et al., "Cinnamate-Functionalized Natural Carbohydrates as Photopatternable Gate Dielectrics for Organic Transistors," *Chem. Mater.* 2019, vol. 31; pp. 7608-7617.

Ariana Villarroel Marquez et al., "Organic Electrochemical Transistors (OECTs) toward Flexible and Wearable Bioelectronics," *Molecules* 2020, vol. 25, 5288; pp. 1-25. doi:10.3390/molecules25225288.

Benoit Piro et al., "Fabrication and Use of Organic Electrochemical Transistors for Sensing of Metabolites in Aqueous Media," *Applied Sciences* 2018, vol. 8, No. 928; pp. 1-33. doi:10.3390/app8060928.

Alexander Giovannitti et al., "Energetic Control of Redox-Active Polymers toward Safe Organic Bioelectronic Materials;" pp. 1-9. https://doi.org/10.1002/adma.201908047.

Marios Sophocleous et al., "Organic Electrochemical Transistors as an Emerging Platform for Bio-Sensing Applications: A Review," *IEEE Sensors Journal*, Feb. 15, 2021, vol. 21, No. 4; pp. 3977-4006.

David Ohayon et al., "Influence of side chains on the n-type organic electrochemical transistor performance," *ACS Applied Materials & Interfaces*; downloaded May 7, 2022; pp. 1-39. Doi:10.1021/acsami.0c18599.

Alexander Giovannitti et al., "N-type organic electrochemical transistors with stability in water," *Nature Communications*, Published Oct. 7, 2016, 7:13066, DOI: 10.1038/ncomms13066; pp. 1-10.

Ji Hwan Kim et al., "Designing Polymeric Mixed Conductors and Their Application to Electrochemical-Transistor-Based Biosensors," *Macromol. Biosci.* Aug. 2020, vol. 20, 2000211 (1 of 18).

Hengda Sun et al., "n-Type organic electrochemical transistors: materials and challenges," *J. Mater. Chem. C.* 2018, vol. 6; pp. 11778-11784.

Hengda Sun et al., "Complementary Logic Circuits Based on High-Performance n-Type Organic Electrochemical Transistors," *Advanced Materials* 2018, vol. 30; pp. 1704916 (1 of 7).

Erjuan Guo et al., "Vertical Organic permeable dual-base transistors for logic circuits," *Nature Communications* (2020), vol. 11:4725; pp. 1-9. https://doi.org/10.1038/s41467-020-18576-5.

Hans Kleemann et al., "A Review of Vertical Organic Transistors," *Adv. Funct. Mater.* 2020, vol. 30; pp. 1907113 (1 of 23).

The International Search Report and Written Opinion issued on Sep. 8, 2023 for international patent application No. PCT/US22/73413; pp. 13 pages.

* cited by examiner

FIG. 1E
co-monomers
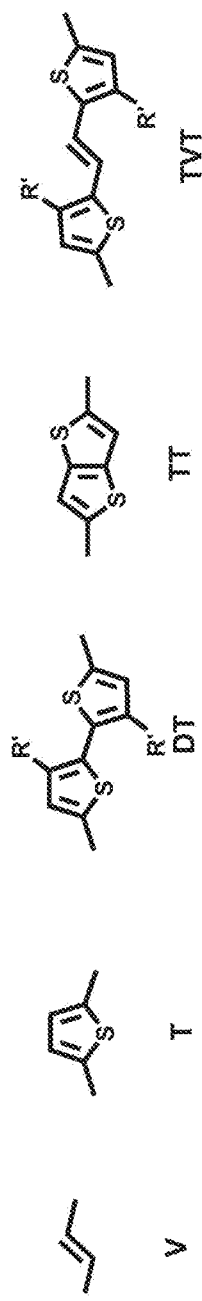
Side chains
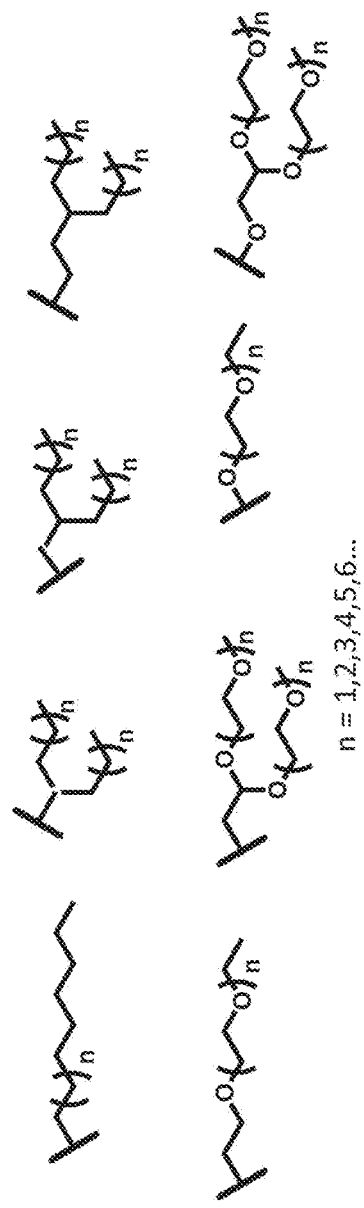

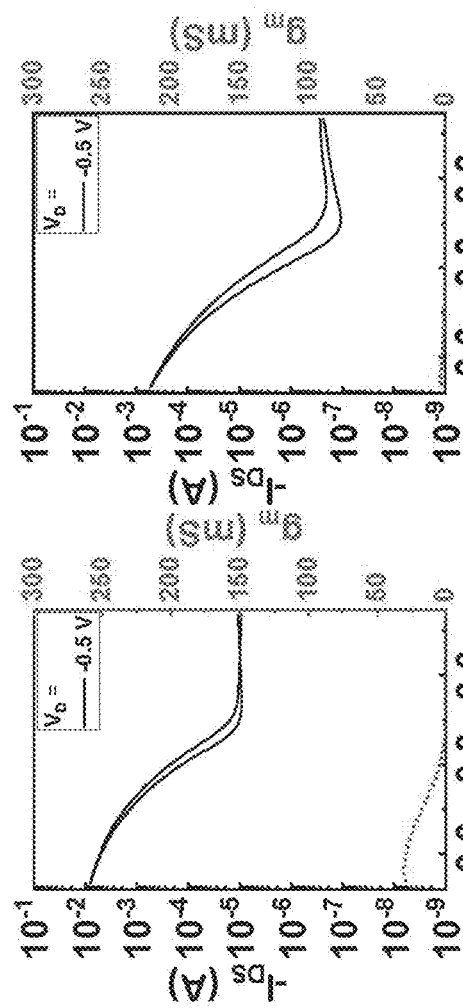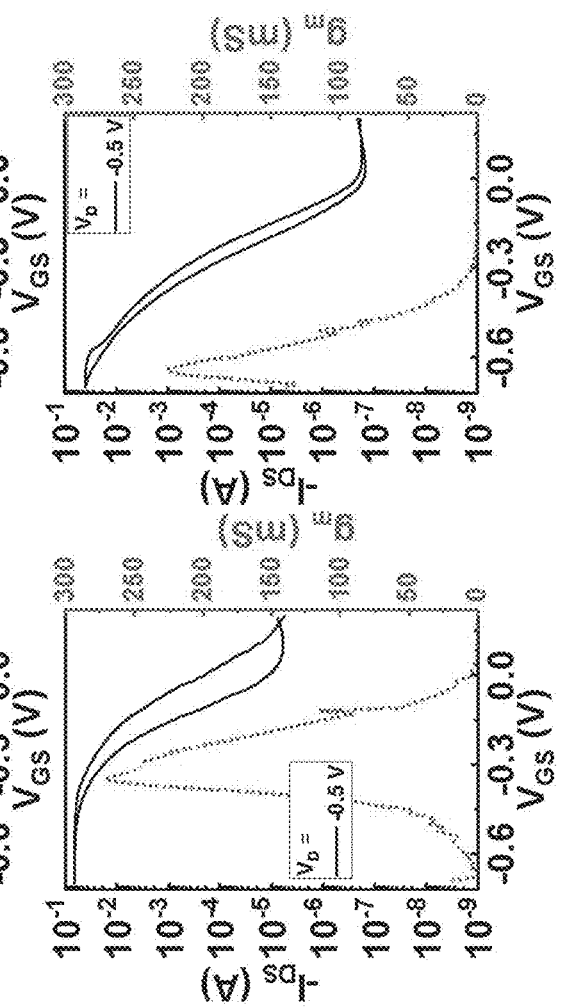
FIG. 14A  FIG. 14B  FIG. 14C  FIG. 14D

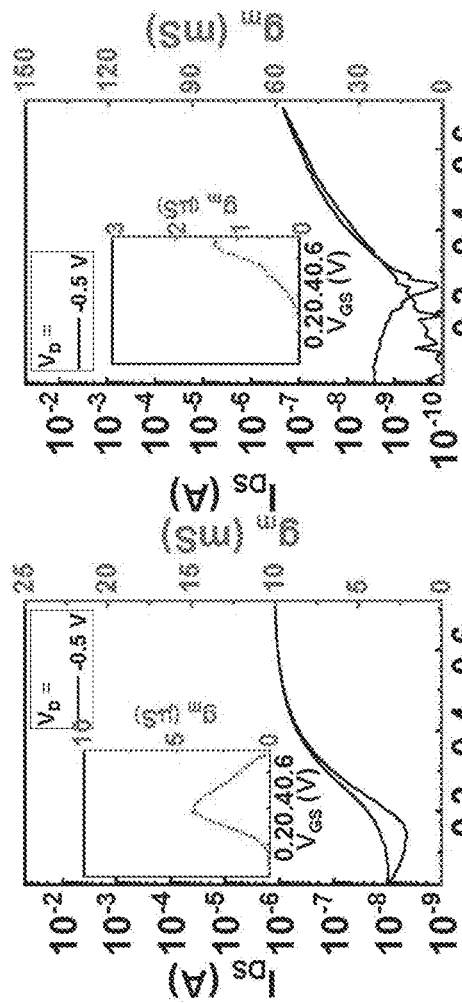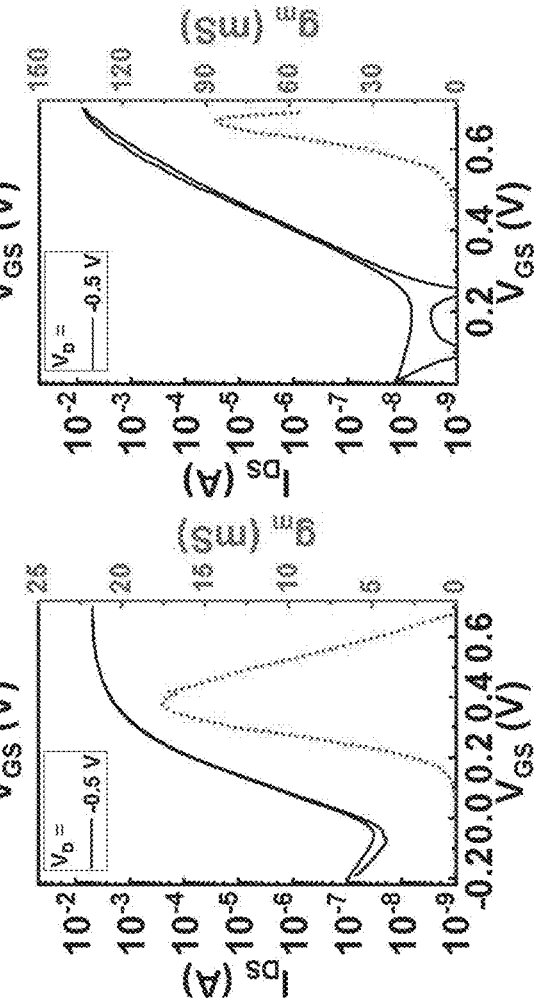

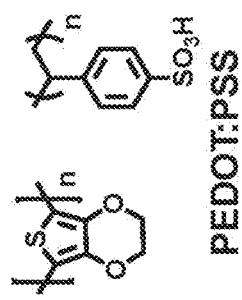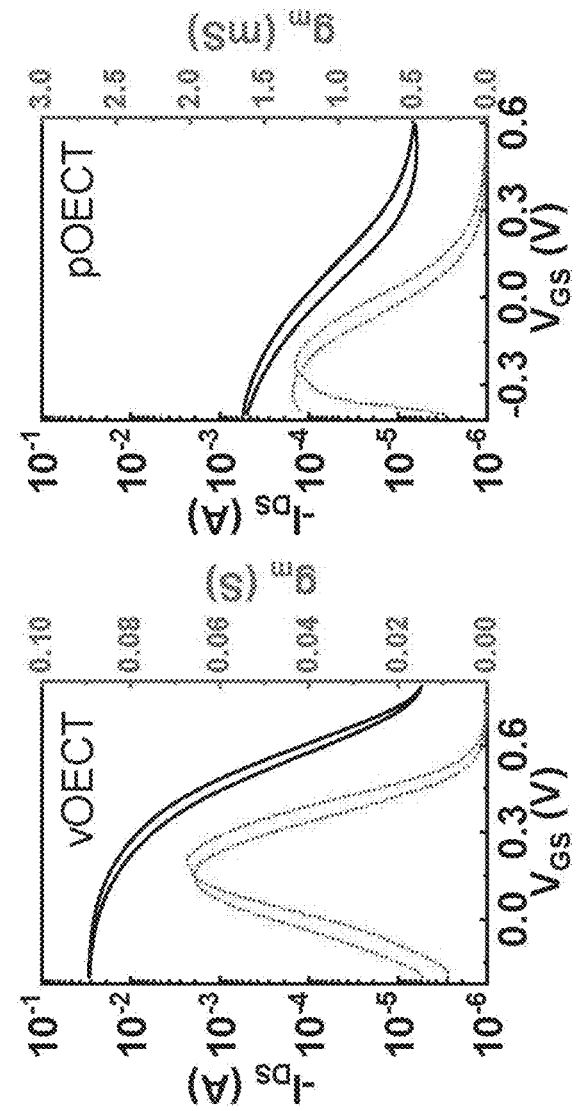
FIG. 15A
FIG. 15B
FIG. 15C

POLYMER COMPOSITIONS FOR VERTICAL CHANNEL ORGANIC ELECTROCHEMICAL TRANSISTORS AND COMPLEMENTARY LOGIC CIRCUITS

CROSS-REFERENCE TO RELATED APPLICATIONS

The present application claims priority to U.S. provisional patent application No. 63/218,596 that was filed Jul. 6, 2021, the entire contents of which are incorporated herein by reference.

REFERENCE TO GOVERNMENT RIGHTS

This invention was made with government support under 1720139 awarded by the National Science Foundation, under 70NANB19H005 awarded by the National Institute of Standards and Technology, and under FA9550-18-1-0320 awarded by the Air Force Office of Scientific Research. The government has certain rights in the invention.

BACKGROUND

Organic electrochemical transistors (OECTs) are attractive for bioelectronics, wearable electronics, and artificial neuromorphic electronics because of their low driving voltage, low power consumption, high transconductance, and facile integration in mechanically flexible platforms. However, further OECT development faces several challenges, including poor electron-transporting (n-type) OECT performance versus their hole-transporting (p-type) counterparts. This unbalanced p-type and n-type OECT performance prevents efficient integration into complementary circuits, and the poor n-type OECT performance leads to inferior sensitivity to in vivo relevant analyte cations (e.g., $Na^+$, $K^+$, $Mg^{2+}$, $Ca^{2+}$, $Fe^{3+}$, $Cu^{2+}$ and $Zn^{2+}$), severely hindering OECT biosensor development. The best performing conventional OECTs (cOECTs), having planar source/drain electrode architectures, require small channel lengths (L), along with a precisely-patterned semiconducting layer and electrode covering with passive materials, to yield high transconductance ($g_m$) and fast switching (~ms range) devices. This requires complex fabrication methodologies, including multi-step photolithographic and wet/dry etching steps. Furthermore, conventional photolithography can only reliably realize features/L of ~1 μm, and while printing and laser cutting have simplified cOECT fabrication, it comes at the expense of performance. Moreover, to increase $g_m$, OECTs based on thick semiconducting films are typically employed, inevitably compromising the switching speed since high $g_m$ values require efficient ion exchange between the electrolyte and the bulk semiconductor.

Previously reported, pioneering vertical organic transistor architectures required either a permeable/ultra-thin (e.g., single-layer graphene) electrode or very complex photolithographic processes to accurately register the nanoscopic electrode/semiconductor layers for effective gate field modulation. (Kleemann, H. et al., Adv. Funct. Mater. 30, 1907113 (2020); Yan, Y. et al., ACS Appl. Mater. Interfaces 12, 49915-49925 (2020); Guo, E. et al. Nat. Commun. 11, 4725 (2020): Lenz, J. et al., Nat. Nanotechnol. 14, 579-585 (2019).) One vertical OECT (vOECT) reported to date, based on p-type PEDOT:PSS, achieved $I_{ON,A}$ and $g_{m,A}$ of 821 A/cm$^2$ and 25.38 μS/μm$^2$, respectively, but it required an ion-permeable silver (Ag) nanowire-based electrode to function. (Yan, Y. et al., 2020.) Ag is electrochemically unstable, thus cycling stability and enhancing gate leakage current, while using a depletion mode semiconductor (PEDOT:PSS) results in low $I_{on}$:$I_{off}$.

SUMMARY

Polymer compositions based on redox-active semiconducting organic polymers, ion-permeable, electrically conductive organic films formed from the polymer compositions, and vOECTs that incorporate the organic films as electrically conducting channels and complementary electronic circuits that incorporate the vOECTs are provided. Methods for photopatterning the polymer compositions to form patterned crosslinked organic films and methods of fabricating the vOECTs are further provided.

Some embodiments of the polymer compositions include a blend of: a redox-active, semiconducting organic polymer; and a photocurable organic molecule. Some embodiments of the polymer compositions omit the photocurable organic molecules. These include compositions in which the semiconducting organic polymer comprises polystyrene sulfonate or poly(benzimidazobenzophenanthroline). The polymer compositions may be provided in the form of solutions or organic films. In organic films that include the photocurable organic molecule, the photocurable organic molecule is in the form of organic polymer molecules.

One embodiment of a method of forming a crosslinked organic film from a composition that includes photocurable organic molecules includes the steps of: forming a coating of the composition on a substrate, the composition comprising a redox-active semiconducting organic polymer and photocurable organic molecules dissolved in a solvent or a solvent mixture on a substrate: and exposing at least a portion of the coating to radiation that induces crosslinking between the photocurable organic molecules to form a crosslinked organic polymer Once embodiment of a vertical organic electrochemical transistor includes: a source: a drain; an ion-permeable semiconducting channel comprising an organic film in electrical communication with the source and the drain, the organic film comprising: a redox-active, semiconducting organic polymer and, optionally, a crosslinked organic polymer that is functionalized with a radiation-absorbing functional group blended with the a redox-active, semiconducting organic polymer: an electrolyte in contact with the ion-permeable semiconducting channel; and a gate in contact with the organic electrolyte One embodiment of a complementary circuit includes: a first vertical organic electrochemical transistor electrically connected to a complementary channel vertical organic electrochemical transistor, wherein the first vertical organic electrochemical transistor includes: (i) a source: (ii) a drain: (iii) an ion-permeable semiconducting channel comprising an organic film in electrical communication with the source and the drain, the organic film comprising: a redox-active, semiconducting organic polymer and, optionally, a crosslinked organic polymer that is functionalized with a radiation-absorbing functional group blended with the a redox-active, semiconducting organic polymer; an electrolyte in contact with the ion-permeable semiconducting channel; and (iv) a gate in contact with the organic electrolyte.

An embodiment of a method of making a vertical organic electrochemical transistor includes the steps of: forming a first electrode; applying a composition on a surface of the first electrode, the composition comprising a blend of a redox-active, semiconducting organic polymer and a photocurable organic molecule: exposing at least a portion of the composition to radiation that induces crosslinking the photocurable organic molecules to form a crosslinked organic film; forming a second electrode on a surface of the crosslinked organic film; placing an electrolyte in contact with the crosslinked organic film; and placing a gate in contact with the electrolyte

BRIEF DESCRIPTION OF THE DRAWINGS

Illustrative embodiments of the invention will hereafter be described with reference to the accompanying drawings, wherein like numerals denote like elements.

FIGS. 1D and 1E show the structures of monomers (FIG. 1D), co-monomers and side-chains (FIG. 1E) for illustrative examples of redox-active semiconducting polymers.

FIGS. 3F-3I show representative chemical structures of polymers that can be used as polymer-based electrolytes.

FIG. 4A shows an illustration of a vertically stacked complementary inverter (VSCI) based on vOECTs. FIG. 4B shows a top view of the VSCI, as described in Example 1, where the Au electrode locations are indicated. FIG. 4C shows voltage output characteristics of the VSCI, along with the voltage gain. FIG. 4D shows switching stability of the VSCI with a switching frequency of 10 Hz. FIG. 4E shows the output characteristics for a 5-stage ring oscillator, as described in Example 1, FIGS. 4F-4G show images of NAND (FIG. 4F) and NOR (FIG. 4G) circuits, as described in Example 1, and FIG. 4I shows the corresponding voltage input/output characteristics. FIG. 4H shows an image of a rectifier, and FIG. 4J shows the corresponding output characteristics. Note, in images in FIGS. 4F-4H, the electrolytes and Ag/AgCl are not applied in order to provide a better view of the channel areas.

(2018); Khodagholy, D. et al. *Nat. Commun.* 4, 2133 (2013); Moser, M. et al. *Adv. Mater.* 32, e2002748 (2020); Giovannitti, A. et al. *Adv. Mater.* 32, e1908047 (2020); Wang, Y. et al. *Chem. Mater.* 31, 9797-9806 (2019).)

Figures 7A, 7B:
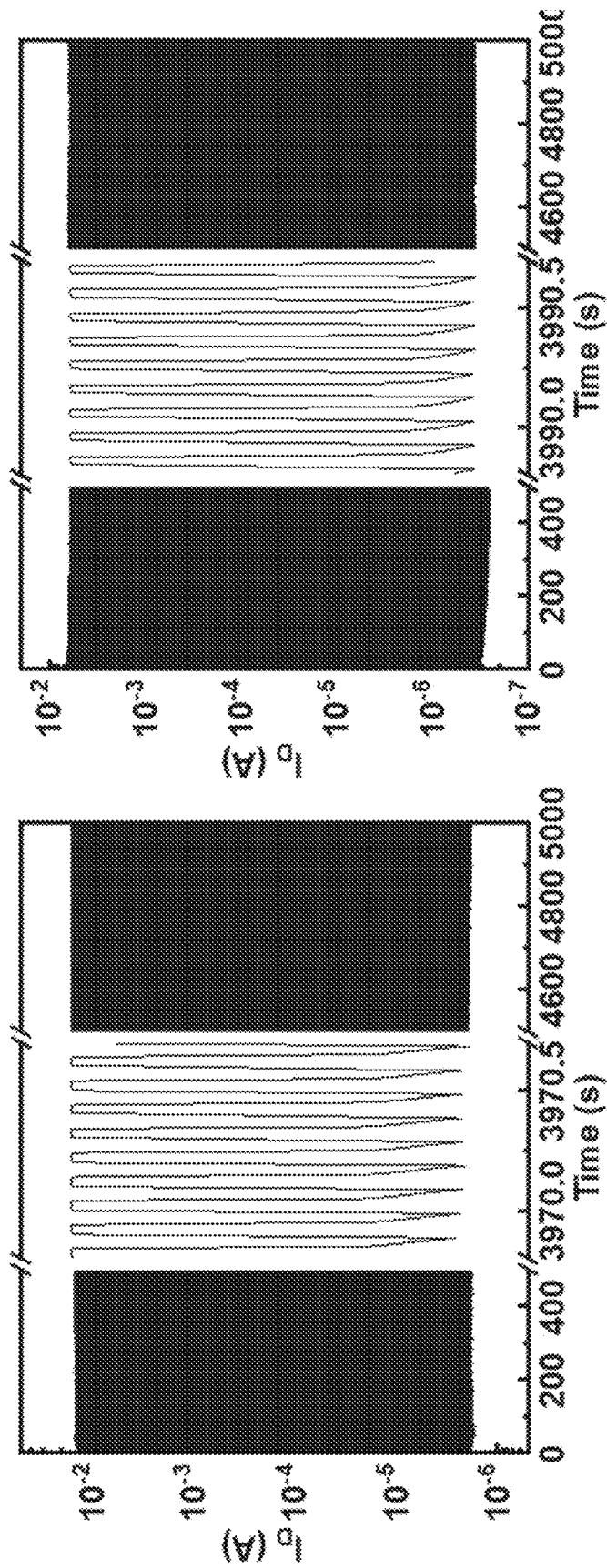
Figure 7D:
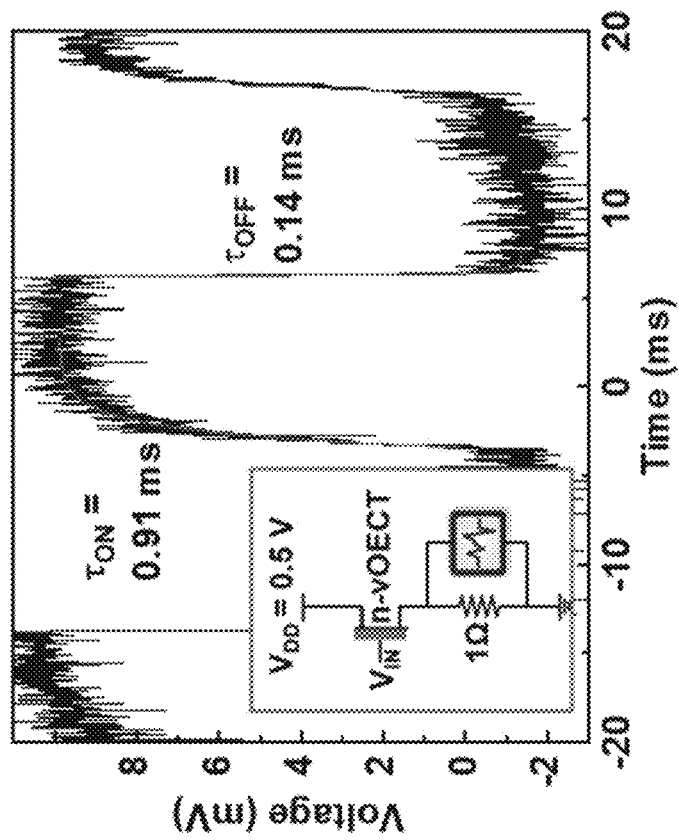
Figure 7C:
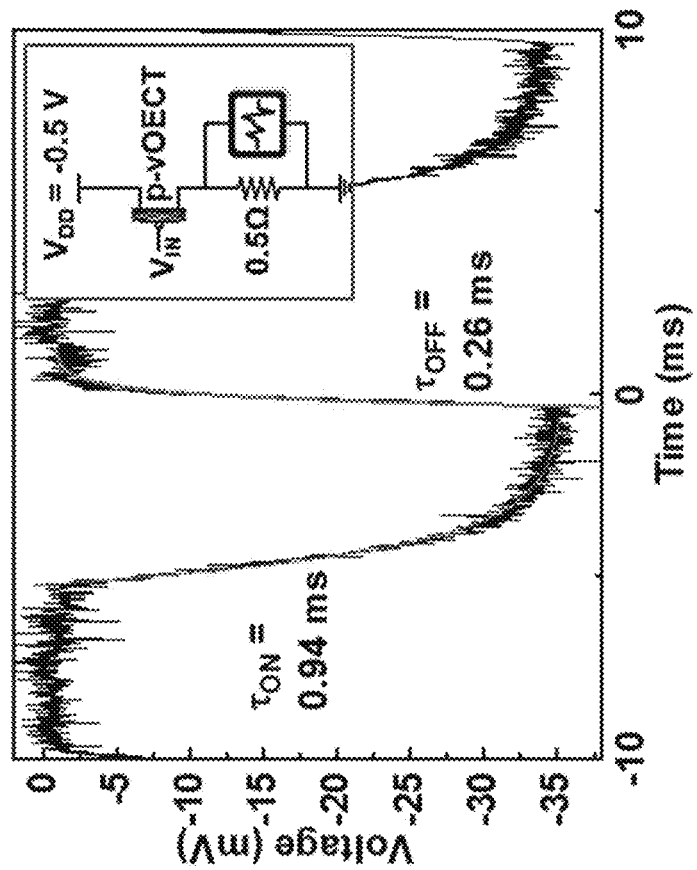

FIGS. 7A-7B show cycling stability of (FIG. 7A) a vOECT having a channel comprising p-type gDPP-g2T and (FIG. 7B) a vOECT having a channel comprising n-type Homo-gDPP vOECTs, where $V_D=-0.1$ V, $V_G$ is switching between 0 V and −0.7 V at a frequency of 10 Hz for the p-type vOECT, and $V_D=+0.1$ V, $V_G$ is switching between 0 V and +0.7 V at a frequency of 10 Hz for n-type vOECT, as described in Example 1. FIGS. 7C-7D show transient response of the p-type (FIG. 7C) and n-type (FIG. 7D) vOECTs, where the transient behavior was monitored by measuring the small voltage variation on a resistor through an oscilloscope (see insets of FIGS. 7C and 7D for setups). Note, for both vOECTs W=d=30 μm.

Figure 8:
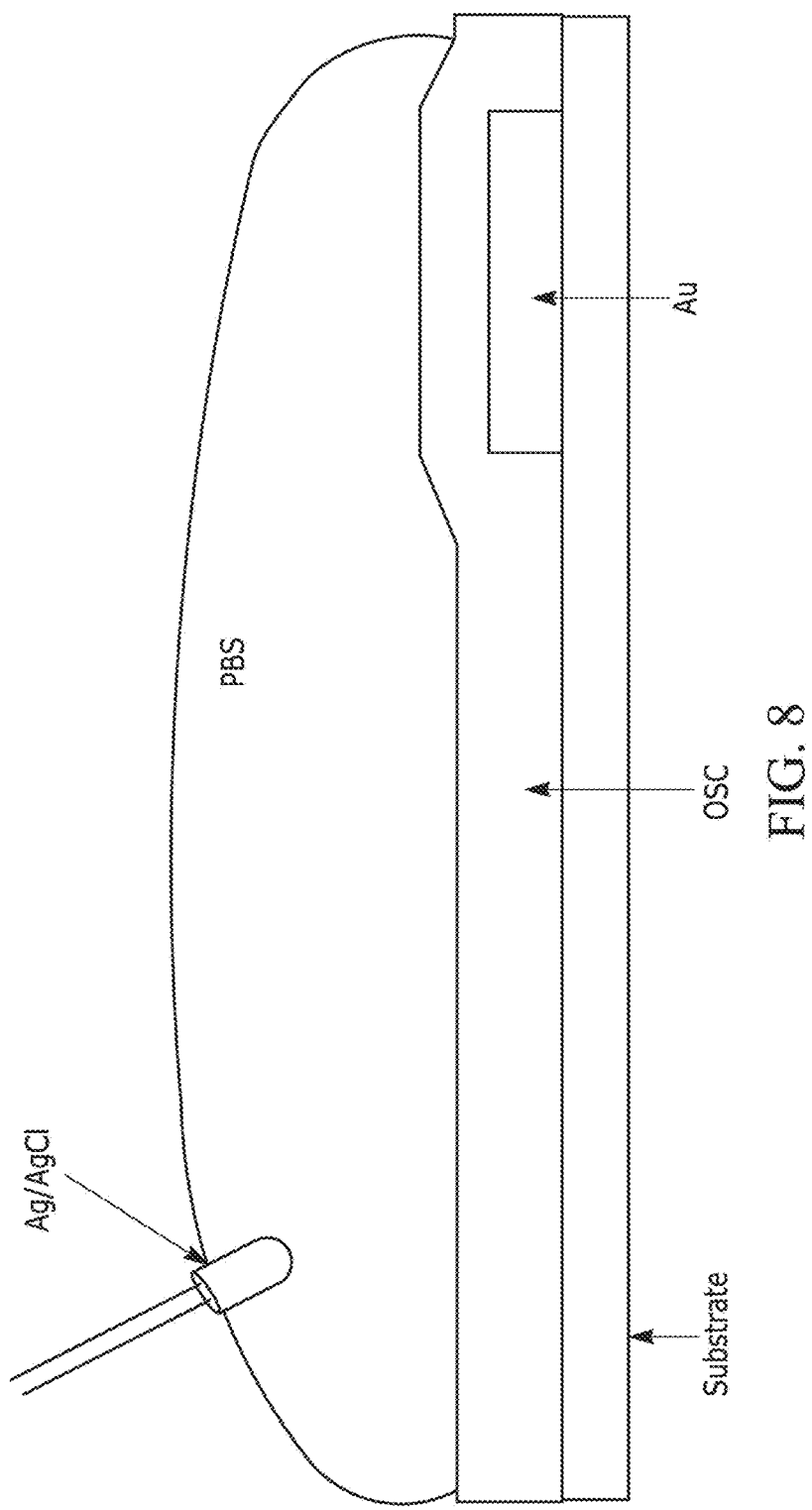

FIG. 8 is a cross-sectional illustration of an electrolyte capacitor based on p-type gDPP-g2T:Cin Cell films.

Figure 9A:
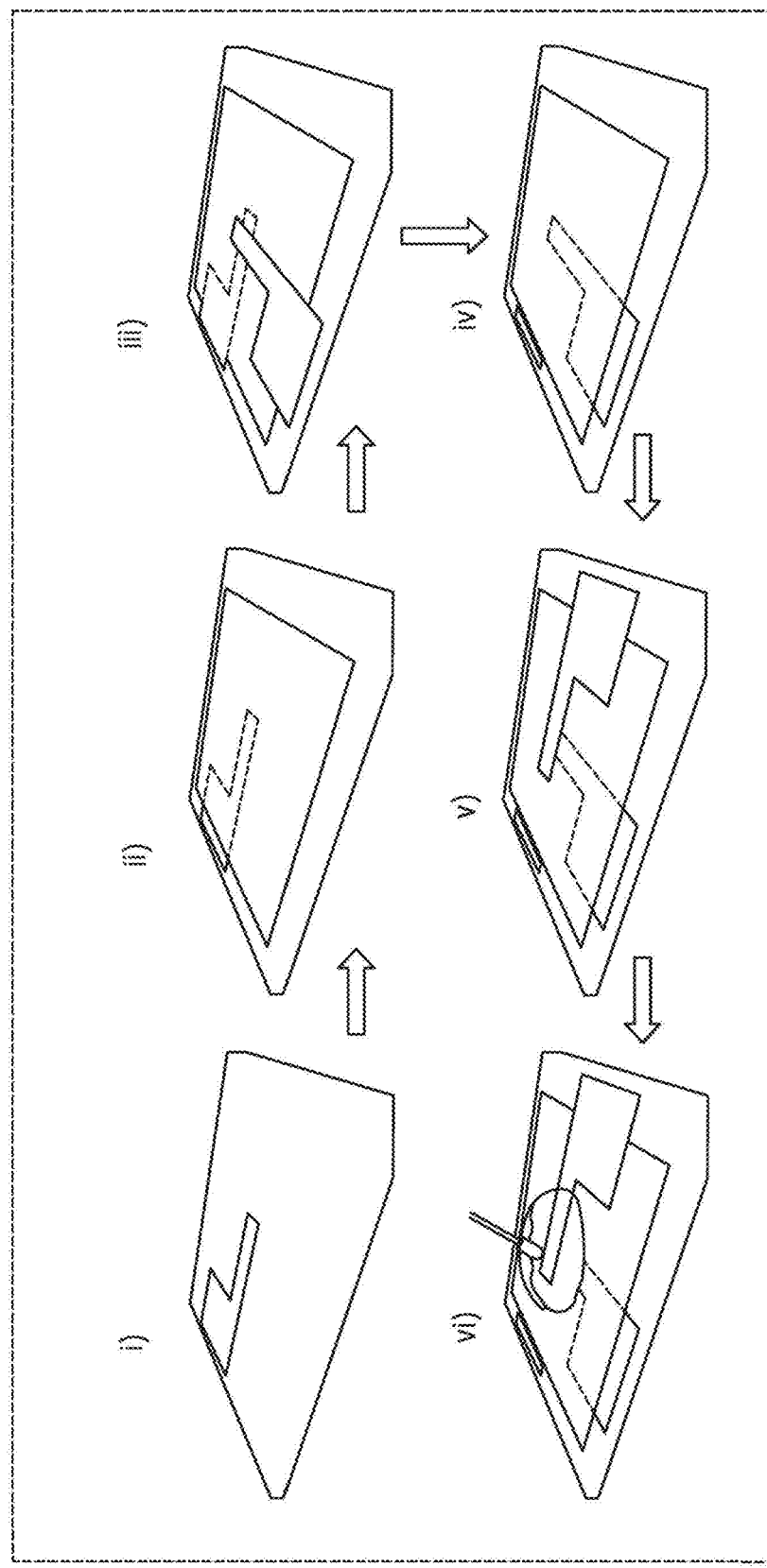
Figure 9B:
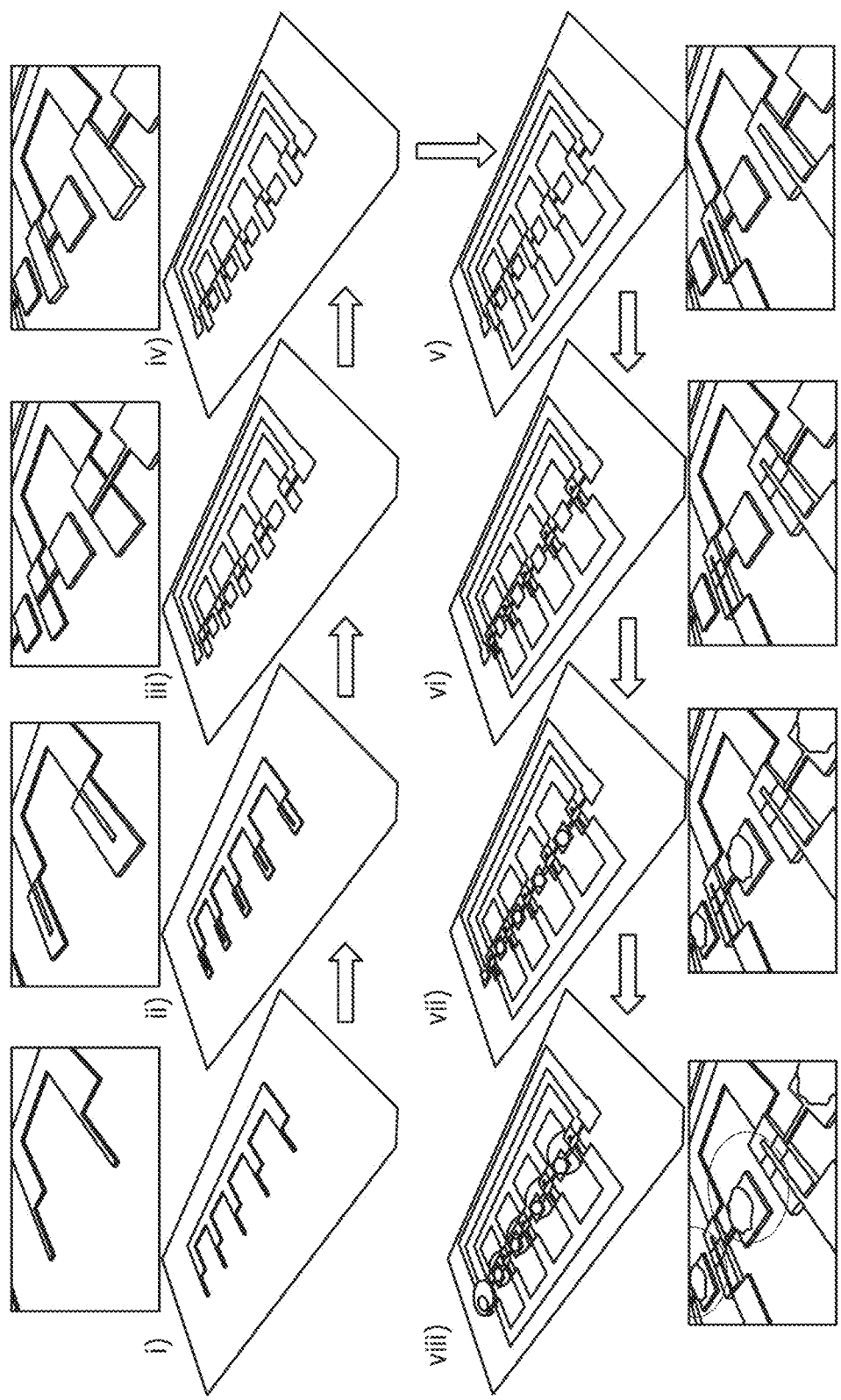

FIGS. 9A-9B show a fabrication process for the vertically stacked complementary inverter (VSCI) (FIG. 9A) and 5-stage ring oscillator (FIG. 9B) based on a VSCI. For the Inverter: FIG. 9A, panel i). Thermal evaporation of the bottom Au electrodes ($V_{DD}$) with a shadow mask; panel ii) Spin-coating/photo-crosslinking of the p-type semiconducting layer; panel iii). Thermal evaporation of the middle electrodes ($V_{OUT}$) with a shadow mask; panel iv). Spin-coating/photo-crosslinking of the n-type semiconducting layer; panel v). Thermal evaporation of top electrodes (GND) with a shadow mask; panel vi). Application of the PBS electrolyte and Ag/AgCl electrode. For the Ring Oscillator (enlarged plots are also provided): FIG. 9B, panel i). Thermal evaporation of the bottom Au electrodes ($V_{DD}$) with a shadow mask; panel ii) Spin-coating/photopatterning of the p-type semiconducting layer; panel iii). Thermal evaporation of the middle electrodes (VOUT) with a shadow mask; panel iv). Spin-coating/photopatterning of the n-type semiconducting layer; panel v). Thermal evaporation of top electrodes (GND) with a shadow mask; panel vi). Spin-coating/photopatterning of the Cin-Cell encapsulation layer, where the channel areas and Middle electrode acting as $V_{OUT}$ are left open; panel vii). Application of the Ag/AgCl paste on top of the Middle electrode VOUT region; viii) Apply the PBS electrolyte.

Figure 10A:
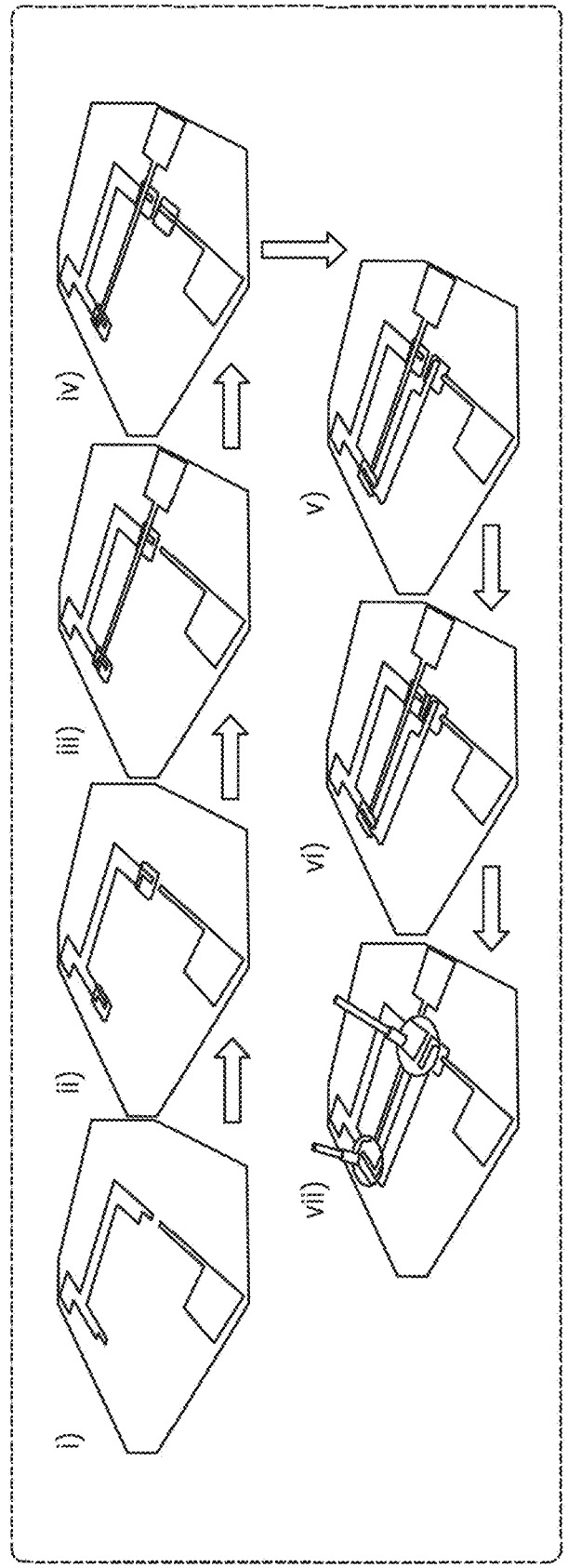
Figure 10B:
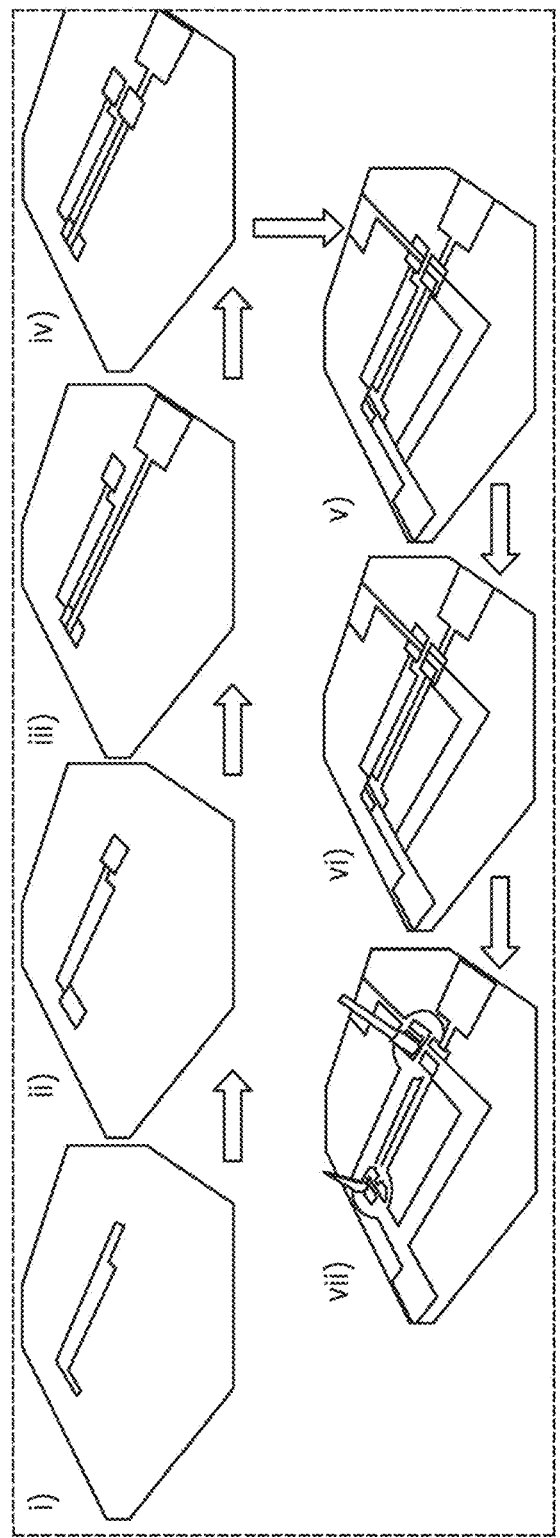
Figure 10C:
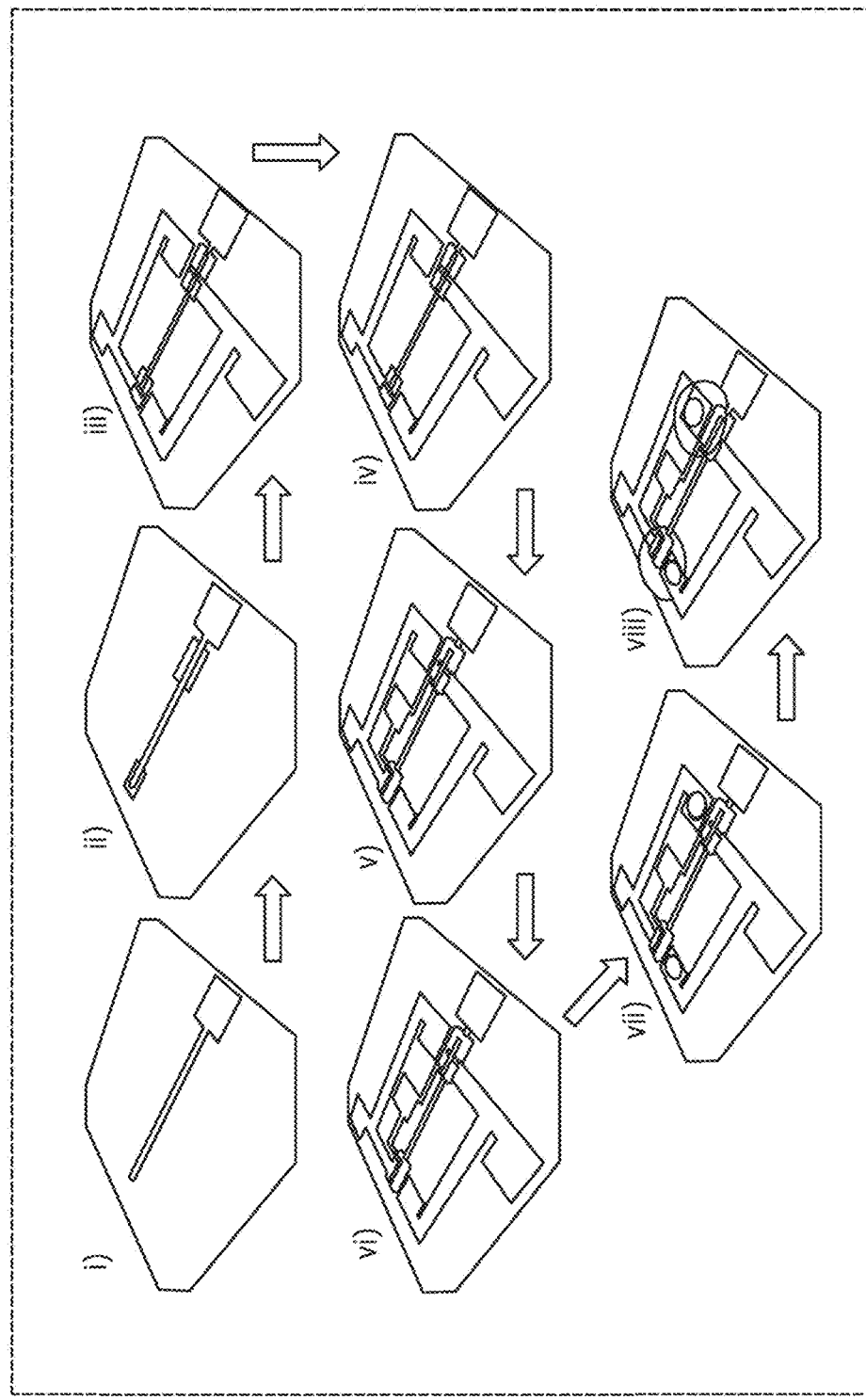

FIGS. 10A-10C show a fabrication process for the NAND (FIG. 10A), NOR (FIG. 10B), and rectifier (FIG. 10C) based on vOECTs. For the NAND: FIG. 10A, panel i). Thermal evaporation of the bottom Au electrodes ($V_{DD}$, and GND) with a shadow mask; panel ii) Spin-coating/photopatterning of the p-type semiconducting layer; panel iii). Thermal evaporation of the middle electrodes ($V_{OUT}$) with a shadow mask; panel iv). Spin-coating/photopatterning of the n-type semiconducting layer; panel v). Thermal evaporation of top electrodes with a shadow mask; panel vi). Spin-coating/photopatterning of the Cin-Cell encapsulation layer, where the channel areas are left open; panel vii). Apply the PBS electrolyte and Ag/AgCl electrode. For the NOR: FIG. 10B, panel i). Thermal evaporation of the bottom Au electrodes with a shadow mask; panel ii) Spin-coating/photopatterning of the p-type semiconducting layer; panel iii). Thermal evaporation of the middle electrodes ($V_{OUT}$) with a shadow mask; panel iv). Spin-coating/photopatterning of the n-type semiconducting layer; panel v). Thermal evaporation of top electrodes ($V_{DD}$, and GND) with a shadow mask; panel vi). Spin-coating/photopatterning of the Cin-Cell encapsulation layer, where the channel areas are left open; panel vii). Apply the PBS electrolyte and Ag/AgCl electrode. For the NOR: FIG. 10C, panel i). Thermal evaporation of the bottom Au electrodes ($V_{OUT}$) with a shadow mask; panel ii) Spin-coating/photo-crosslinking of the p-type semiconducting layer; panel iii). Thermal evaporation of the middle electrodes ($V_{IN+}$, and $V_{IN-}$) with another shadow mask; panel iv). Spin-coating/photo-crosslinking of the n-type semiconducting layer; panel v). Thermal evaporation of top electrodes (GND) with a shadow mask; panel vi). Spin-coating/photopatterning of the Cin-Cell encapsulation layer, where the channel areas and the Middle electrode acting as $V_{IN}$ are left open; panel vii). Application of the Ag/AgCl paste on top of the middle electrode $V_{IN}$ region; panel viii) Apply the PBS electrolyte.

Figure 11:
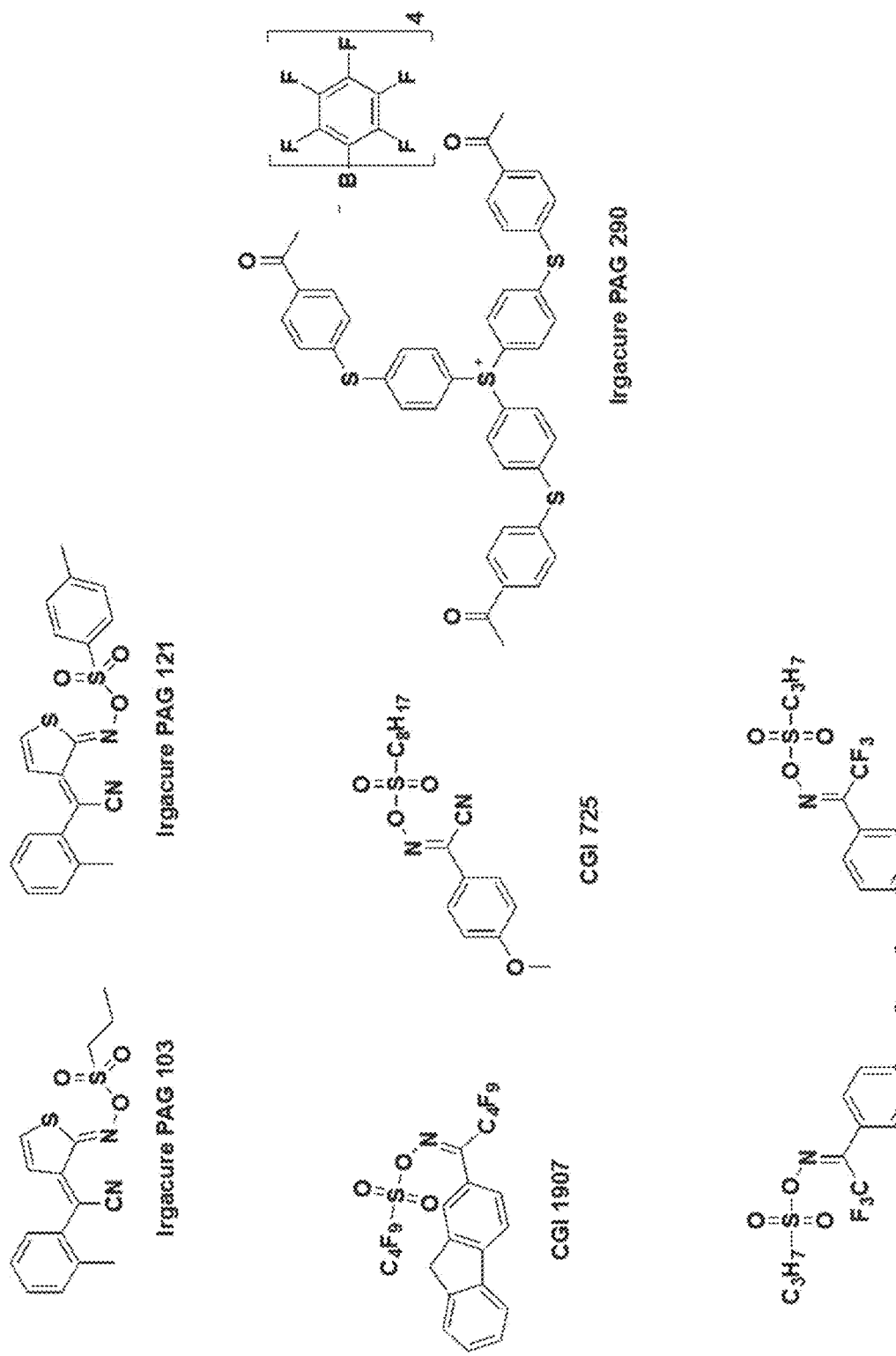

FIG. 11 shows the figures of various crosslinking initiators that can be used in the photopatternable compositions.

Figure 12:
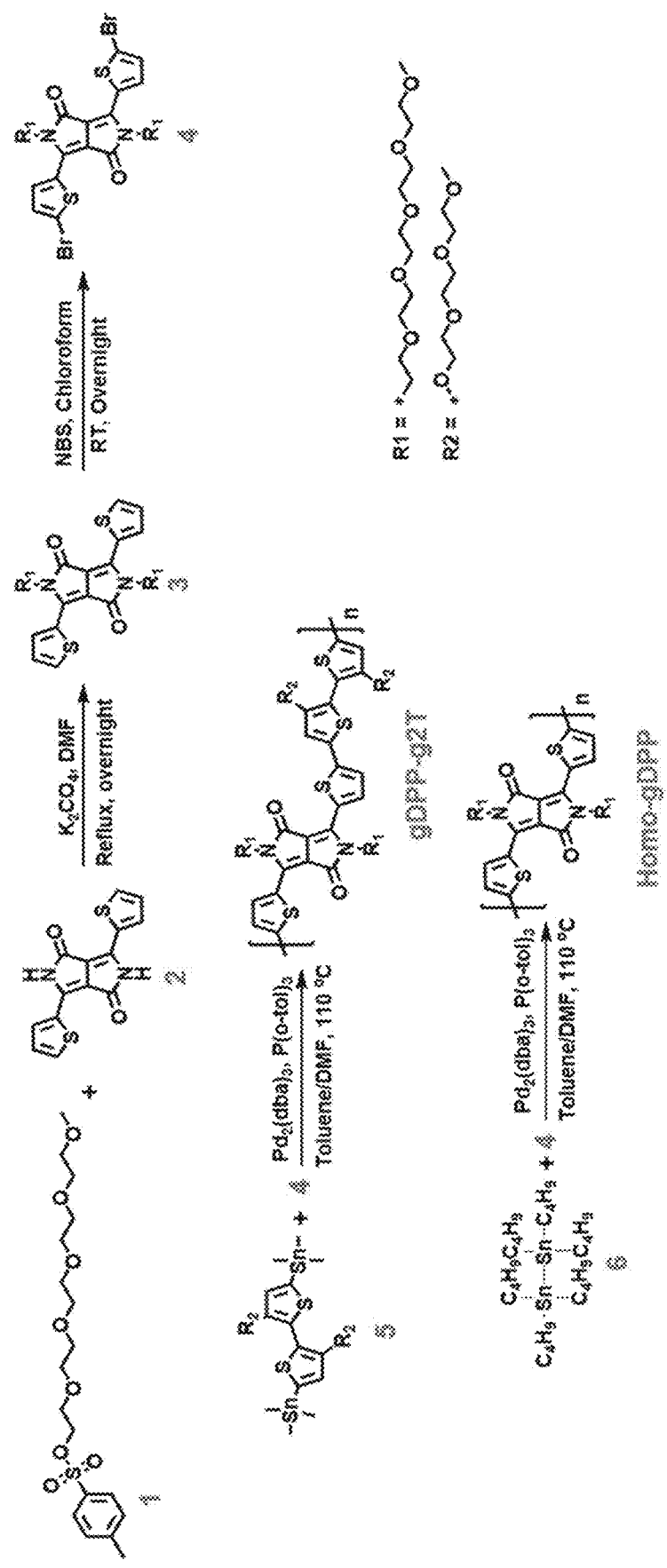

FIG. 12. Scheme 1. Synthetic route to the semiconducting polymers gDPP-g2T (p-type) and Homo-gDPP (n-type).

Figure 13:
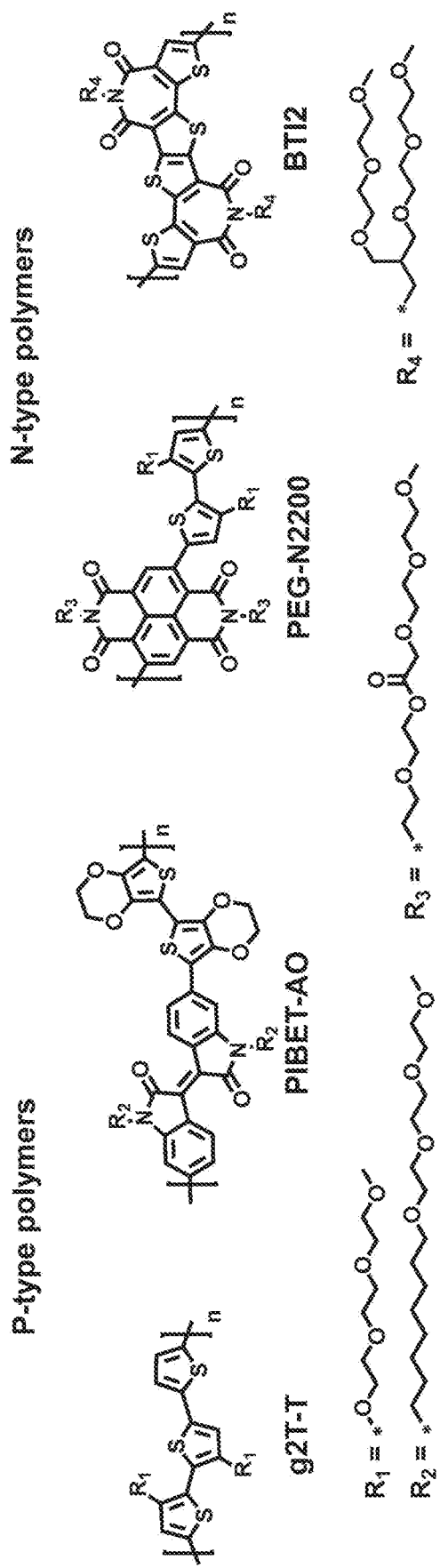

FIG. 13. Chemical structures of the redox-active semiconducting polymers, from left to right: g2T-T (p-type); PIBET-AO (p-type); PEG-N2200 (n-type); and BTI2 (n-type).

FIGS. 14A-14H. Representative transfer and $g_m$ characteristics of planar (FIGS. 14A, 14B, 14E, 14F) and vertical (FIGS. 14C, 14D, 14G, 14H) OECTs based on g2T-T (FIGS. 14A, 14C), PIBET-AO (FIGS. 14B, 14D), PEG-N2200 (FIGS. 14E, 14G), and BTI2 (FIGS. 14F, 14H). W and d are both 30 μm. For PEG-N2200 and BTI2 based planar OECTs, the $g_m$s were too small when the plot with the same scale as that in the vOECT counterparts, thus insets showing a magnified Y axis are included.

FIGS. 15A-15C show the chemical structure of PEDOT:PSS (FIG. 15A) and the transfer and transconductance characteristics of a PEDOT:PSS-based vOECT (FIG. 15B) and pOECT (FIG. 15C).

Figure 16:
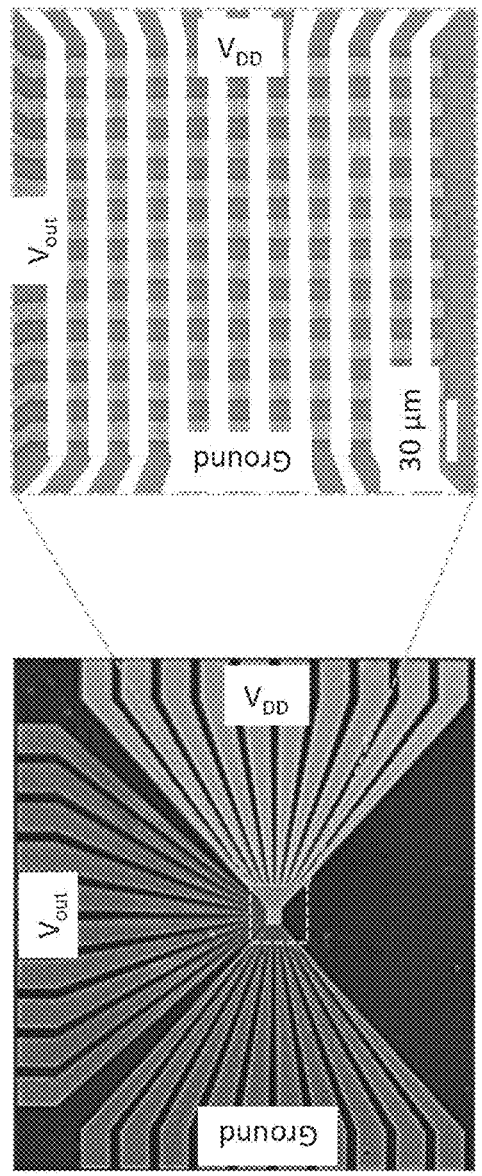

FIG. 16 shows an optical image of a matrix of VSCIs (left) with a magnified view of the central part of the matrix (right).

Figure 17:
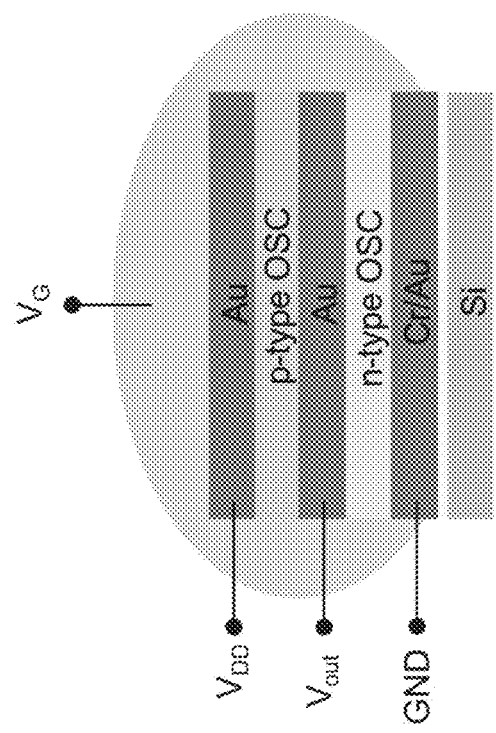

FIG. 17 shows a schematic of a cross-sectional view of a single VSCI pixel of a VSCI matrix.

Figure 18:
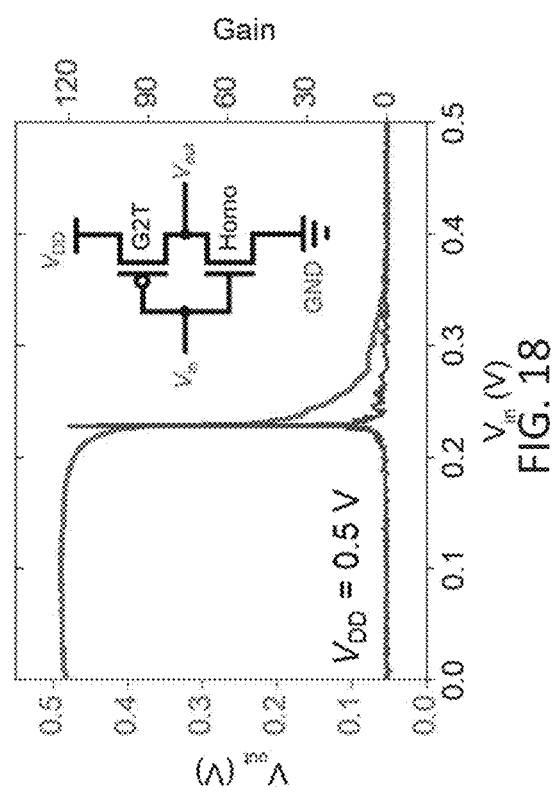

FIG. 18 shows representative $V_{out}$-$V_{in}$ (and Gain) plots (inset; VSCI circuit schematic) for the VSCI matrix of Example 4.

Figure 19A:
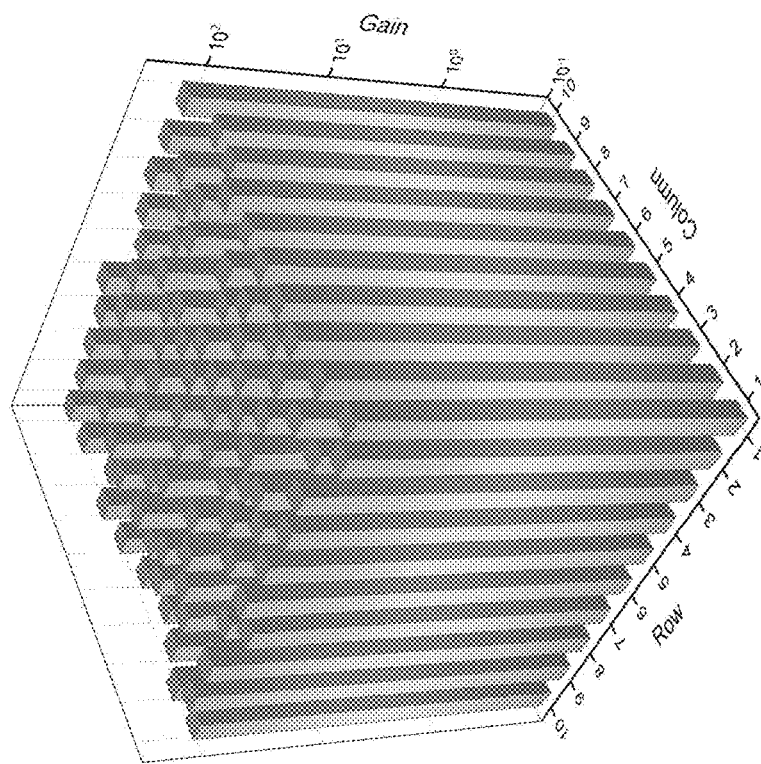
Figure 19B:
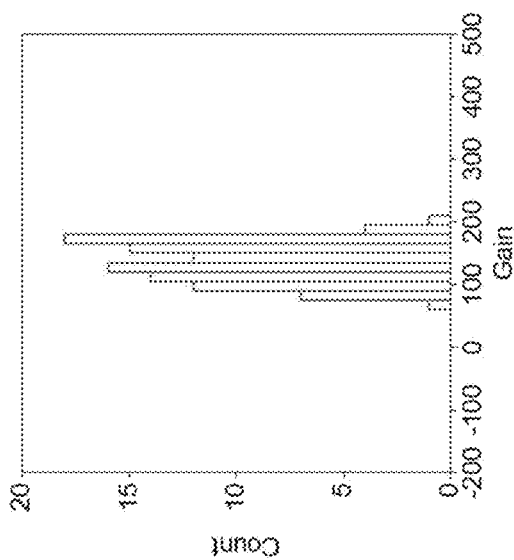

FIGS. 19A and 19B show statistical distributions of the gains across the VSCI matrix of Example 4.

Figures 20A, 20B, 20C:
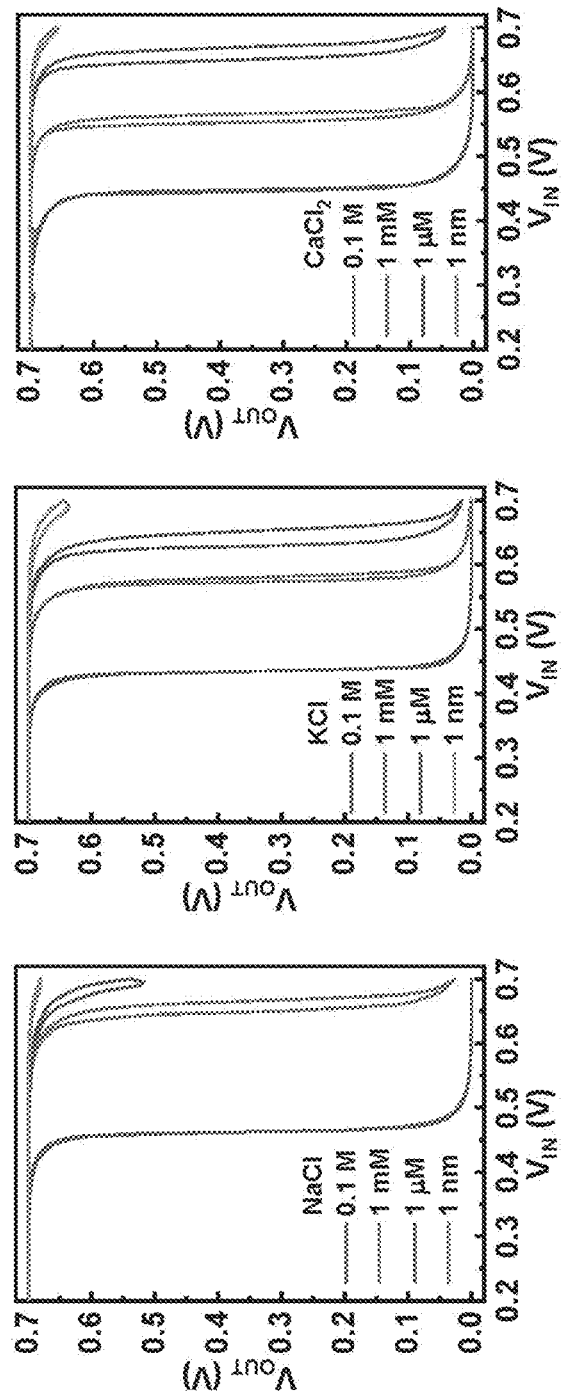

FIGS. 20A-20C show the measured transfer characteristics of a vertically stacked complementary inverter based on a vOECT at the indicated concentrations using: (FIG. 20A) NaCl, (FIG. 20B) KCl, and (FIG. 20C) $CaCl_2$ as the electrolytes, as described in Example 4.

Figure 21A:
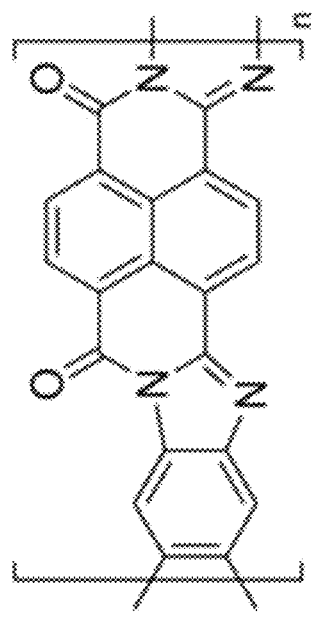
Figure 21C:
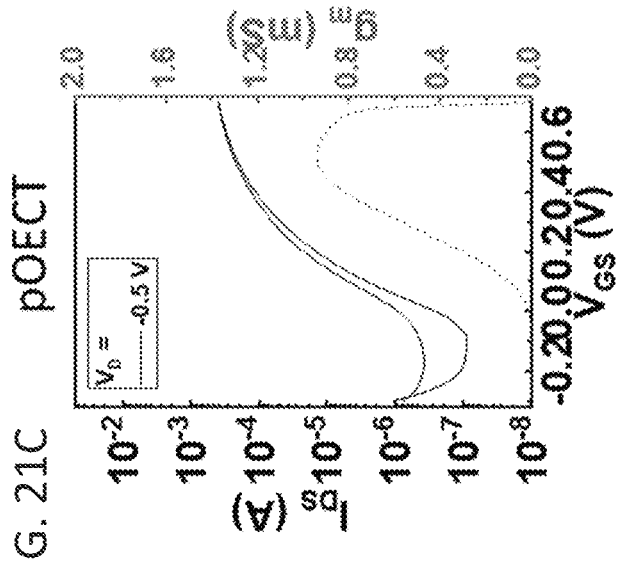
Figure 21B:
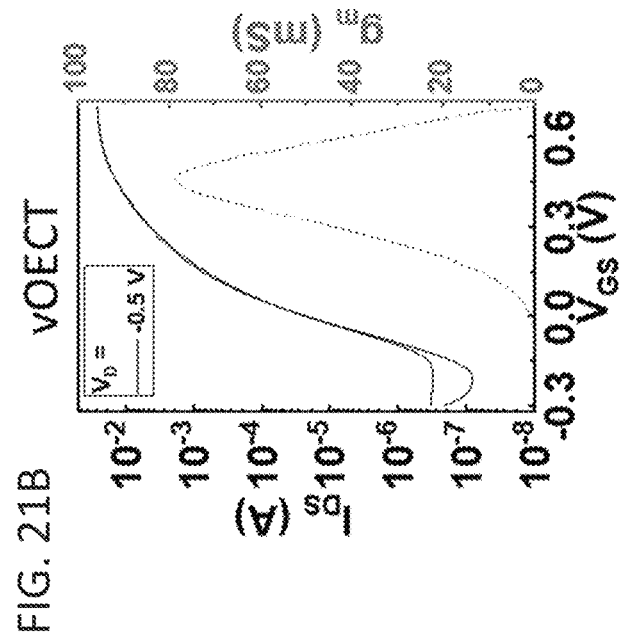

FIGS. 21A-21C show the chemical structure of BBL (FIG. 21A) and the transfer and transconductance characteristics of a BBL-based vOECT (FIG. 21B) and pOECT (FIG. 21C).

DETAILED DESCRIPTION

Polymer compositions based on redox-active semiconducting organic polymers with or without photocurable organic molecules and organic films formed from the polymer compositions are provided. Also provided are vOECTs that incorporate the organic films as electrically conducting channels and complementary electronic circuits that incorporate the vOECTs. Methods for photopatterning the polymer compositions that include the photocurable organic molecules to form patterned crosslinked organic films and methods of fabricating the vOECTs are further provided.

In compositions comprising the photocurable organic molecules, said molecules can enhance the long-term stability of the compositions and/or films. In these embodiments, by balancing the ratio of the two polymer components in the films, the properties of the films can be tailored for various applications. For example, structurally robust, crosslinked organic films with excellent ion-permeabilities that are well-suited for use as conducting channels in vOECTs can be formed.

The vOECTs are characterized by high current densities and transconductance, short transient times, and stable switching cycles. Moreover, because the organic semiconductor films lend themselves to implementation in simple and scalable vertical device architectures, both p- and n-channel vOECTs can be fabricated with balanced and ultra-high-performance characteristics, enabling their use in high-performance complementary circuits. As such, the vOECTs and complementary circuits can be used in a wide range of applications, including wearables, implantable, and/or stretchable devices.

Figure 1A:
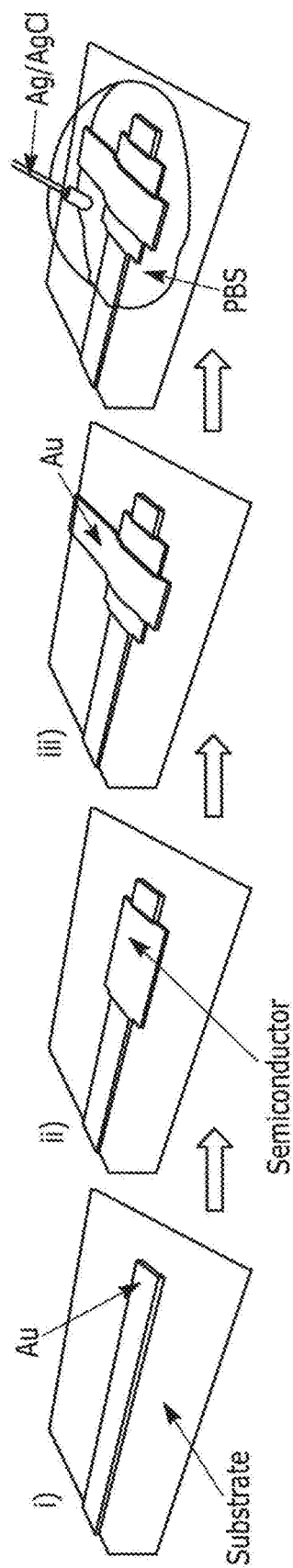
FIG. 1A shows a fabrication scheme and illustrative materials for the fabrication of a vertical organic electrochemical transistor (vOECT). Panel i) shows the thermal evaporation of a gold (Au) bottom source electrode with a shadow mask; panel ii) shows the spin-coating/photopatterning of a semiconducting layer; panel iii) shows the thermal evaporation of a gold top drain electrode with a shadow mask; and panel iv) shows the application of a PBS electrolyte and a Ag/AgCl gate electrode.
Figure 1B:
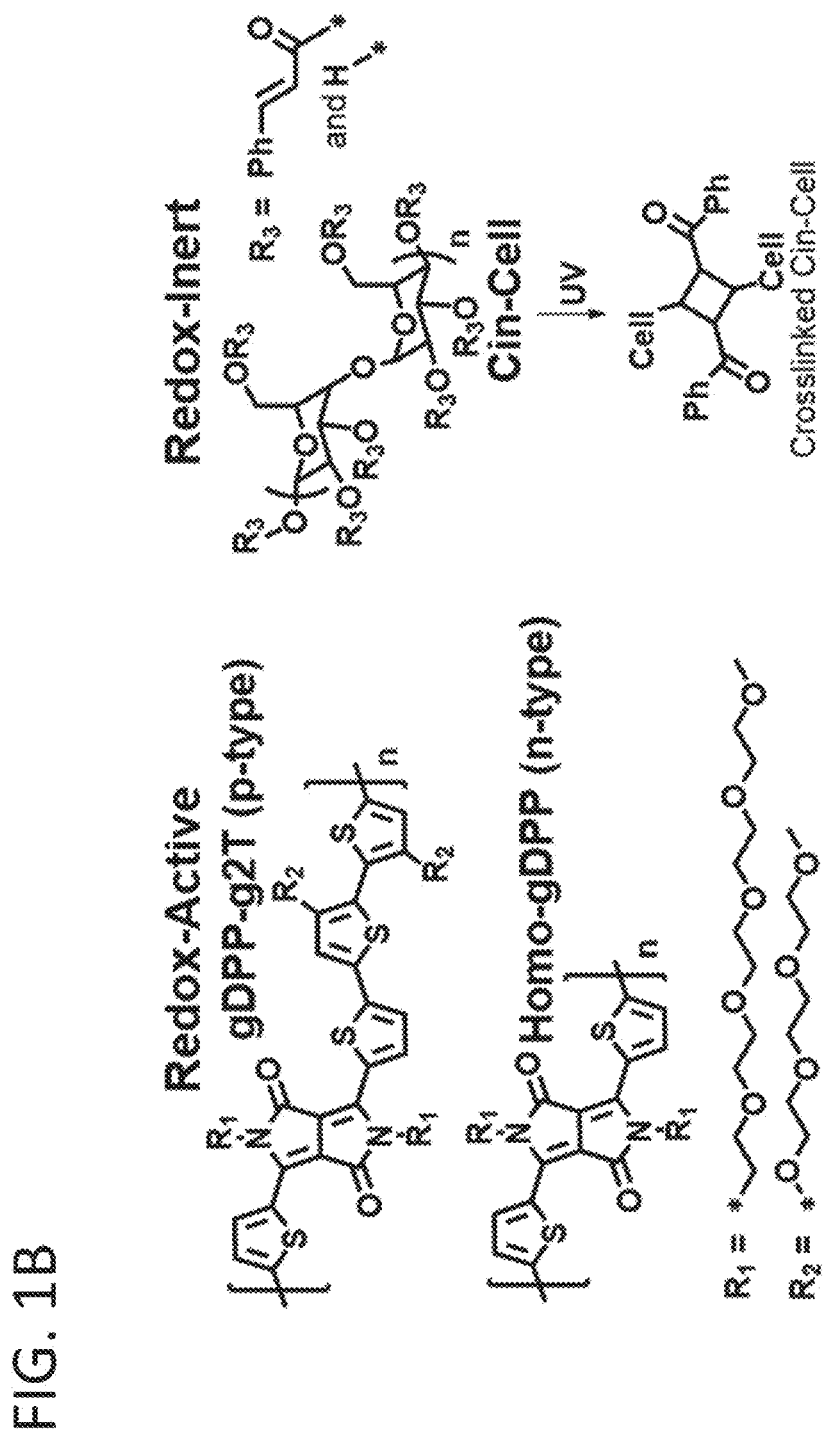
FIG. 1B shows chemical structures of the redox-active semiconducting polymers [gDPP-g2T (p-type); Homo-gDPP (n-type)], and the redox-inactive crosslinkable polymer [Cin-Cell; crosslinking occurs via a photo-induced 2+2 cycloaddition reaction].
Figure 1C:
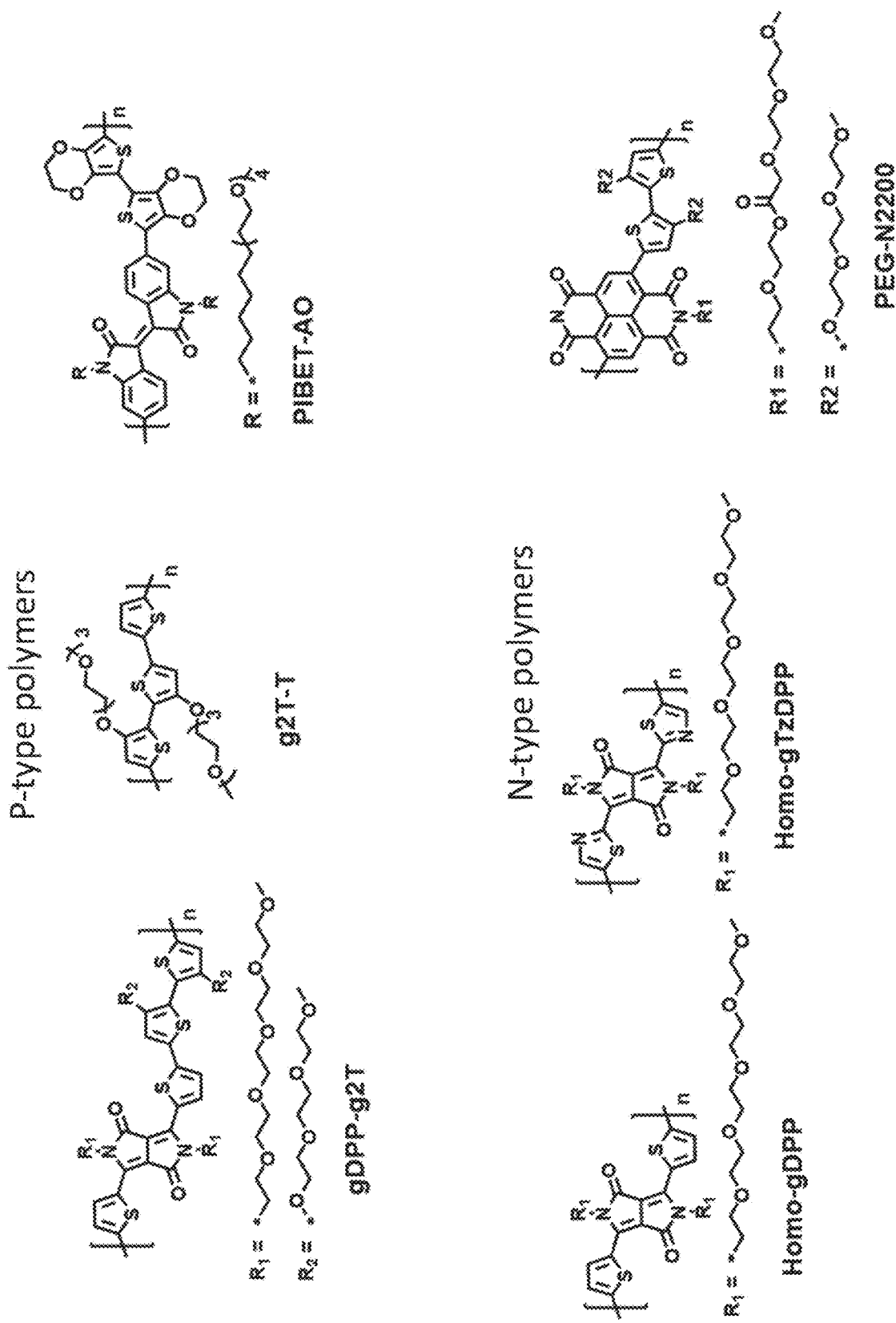
FIG. 1C shows the chemical structures of some other redox-active semiconducting polymers that can be used in vOECTs.
Figure 1D:
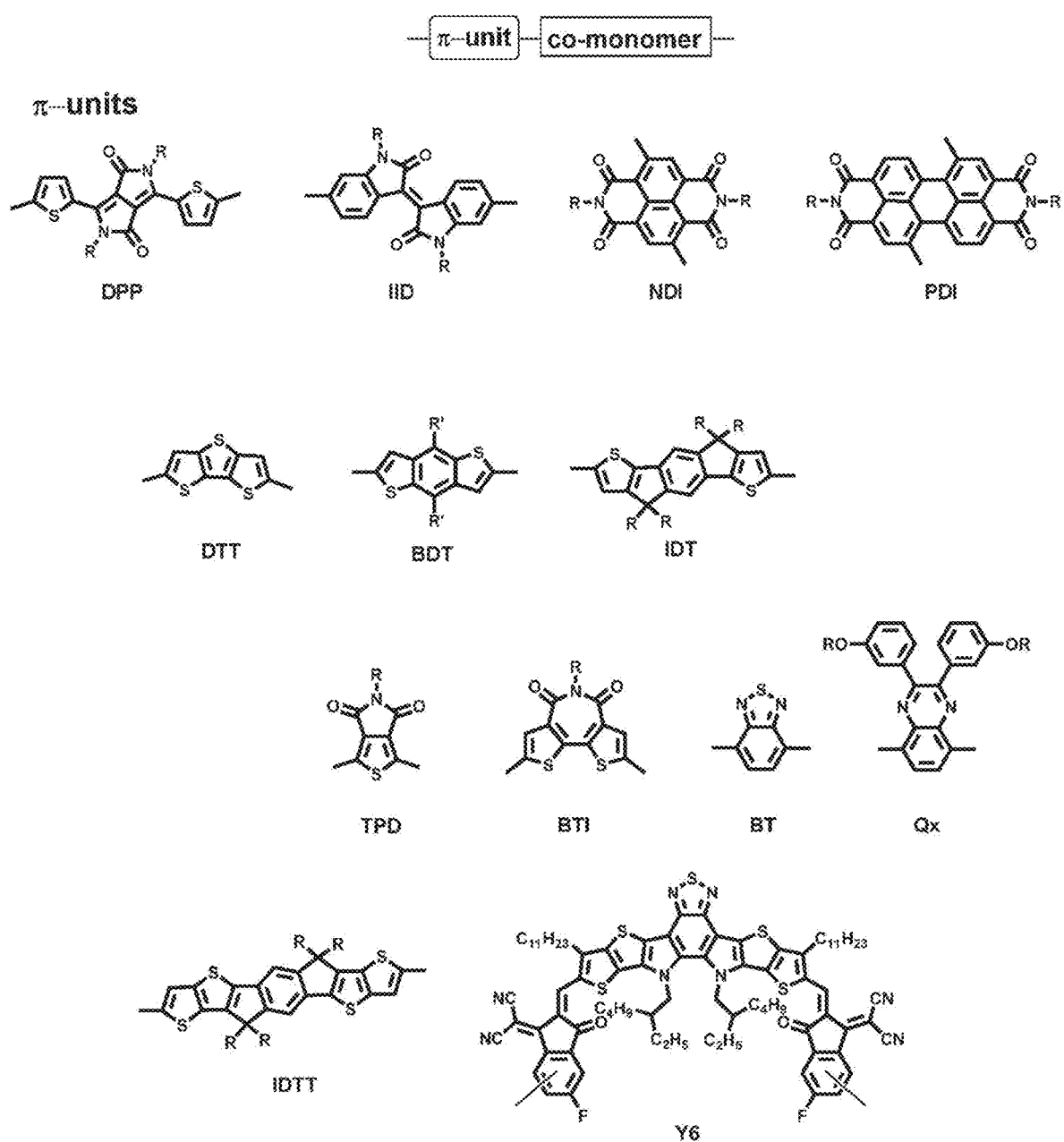

The redox-active semiconducting organic polymers are conjugated organic polymers having carrier-conducting backbones that are able to donate and/or accept electrons. The redox-active semiconducting organic polymers may be homopolymers or copolymers having side-chain substituents for enabling processability from solution. Depending upon the particular polymer, the backbone may be electron-conducting (n-type), hole-conducting (p-type), or may conduct both electrons and holes (ambipolar charge transport). Diketopyrrolopyrrole (DPP), isoindigo (IID), dithienothiophene (DTT), benzodithiophene (BDT), naphthalene diimide (NDI), perylene diimide (PDI), thieno[3,4-c]pyrrole-4,6-dione (TPD), bithiophene imide (BTI), benzothiadiazole (BT), indocenodithiophene (IDTT), (2,2-((2Z,2Z)-((12,13-bis(2-ethylhexyl)-3,9-diundecyl-12,13-dihydro-[1,2,5]thiadiazolo[3,4-e]thieno[2,"3:4',5']thieno[2',3':4,5]pyrrolo[3,2-g]thieno[2',3':4,5]thieno[3,2-b]indole-2,10-diyl)bis(methanylylidene))bis(5,6-difluoro-3-oxo-2,3-dihydro-1H-indene-2,1-diylidene))dimalononitrile) (Y6), quinoxaline (Qx) based homopolymers and copolymers, poly(3,4-ethylenedioxythiophene) polystyrene sulfonate (PEDOT:PSS), and poly(benzimidazobenzophenanthroline) (BBL) are examples of classes of redox-active semiconducting organic polymers that can be used. DPP copolymers include copolymers of DPP and thiophene, bithiophene, and/or dithienovinylene (TVT). The DPP polymers may have ethylene glycol side-chains or other hydrophobic or hydrophilic side-chains. Specific, non-limiting examples of such polymers include those shown on the right side of FIG. 1B and the ethylene glycol-functionalized p-type and n-type redox-active polymers shown in FIG. 1C. FIG. 1D shows the structures of a larger set of backbone units (π-units) for redox-active homopolymers and copolymers. The structures of some suitable comonomers, as well as the structures of various side-chains, are also shown in FIG. 1E.

Figure 1F:
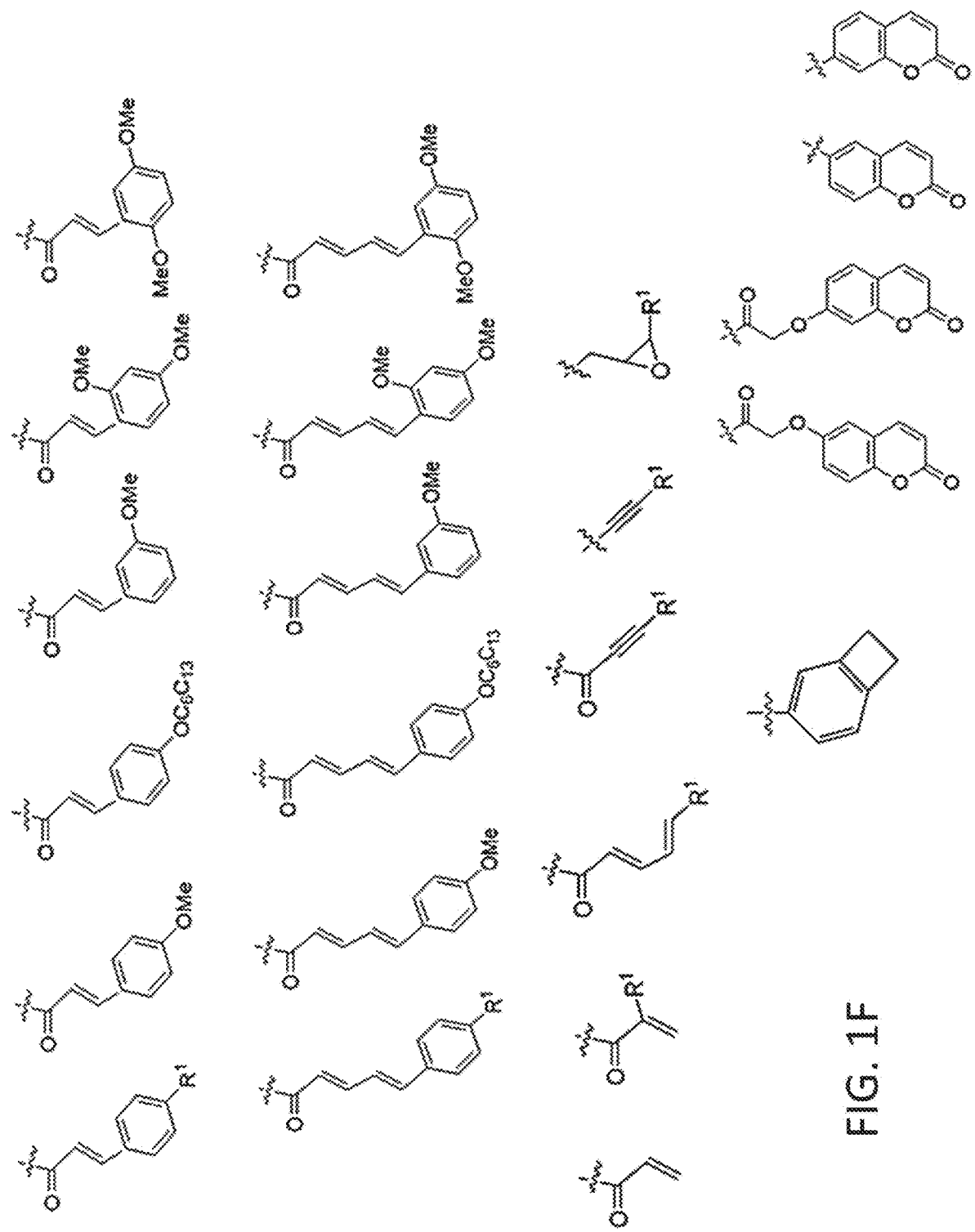
FIG. 1F shows the structures of functional groups that may be present as substituents on a photocurable organic molecule.

The photocurable organic molecules are blended with the redox-active semiconducting organic polymers in order to render the resulting polymer blends photoprocessable. For the purposes of this disclosure, an organic molecule is photocurable if it is able to absorb radiation and undergo radiation-induced crosslinking reactions with other organic molecules to form covalent bonds. The reaction mechanisms by which the covalent crosslinks may be formed include cycloaddition reactions. The wavelengths of the radiation that induce photocuring will depend upon the particular photocurable organic molecules being used. Ultraviolet (UV) radiation (e.g., wavelengths in the range from about 10 nm to about 400 nm) is generally suitable and, therefore, the photocurable organic molecules may be functionalized with ultraviolet wavelength-absorbing groups, such as cinnamate, dienecinnamate, cumarine, vinyl, allyl, acrylate, azide, and oxetane groups. For purposes of illustration, the structures of some functional groups that may be present as substituents on a photocurable organic molecule are shown in FIG. 1F, where $R^1$ is H, F. CN, a $C_{1-10}$ alkyl group, a $C_{1-10}$ haloalkyl group, or a $C_{1-10}$ alkoxy group, Me represents a methyl group, and a wavy line is used to show the attachment point to the organic molecule, consistent with the convention in the art. However, the photocuring reactions described herein are not limited to UV radiation-induced curing reaction; radiation from other regions of the electromagnetic spectrum can be used. For example, the radiation that is typically used in the industrial FAB line of a semiconductor processing can be used to induce the crosslinking reactions, including I-line, H-line, G-line, and flood exposure.

Figure 1G:
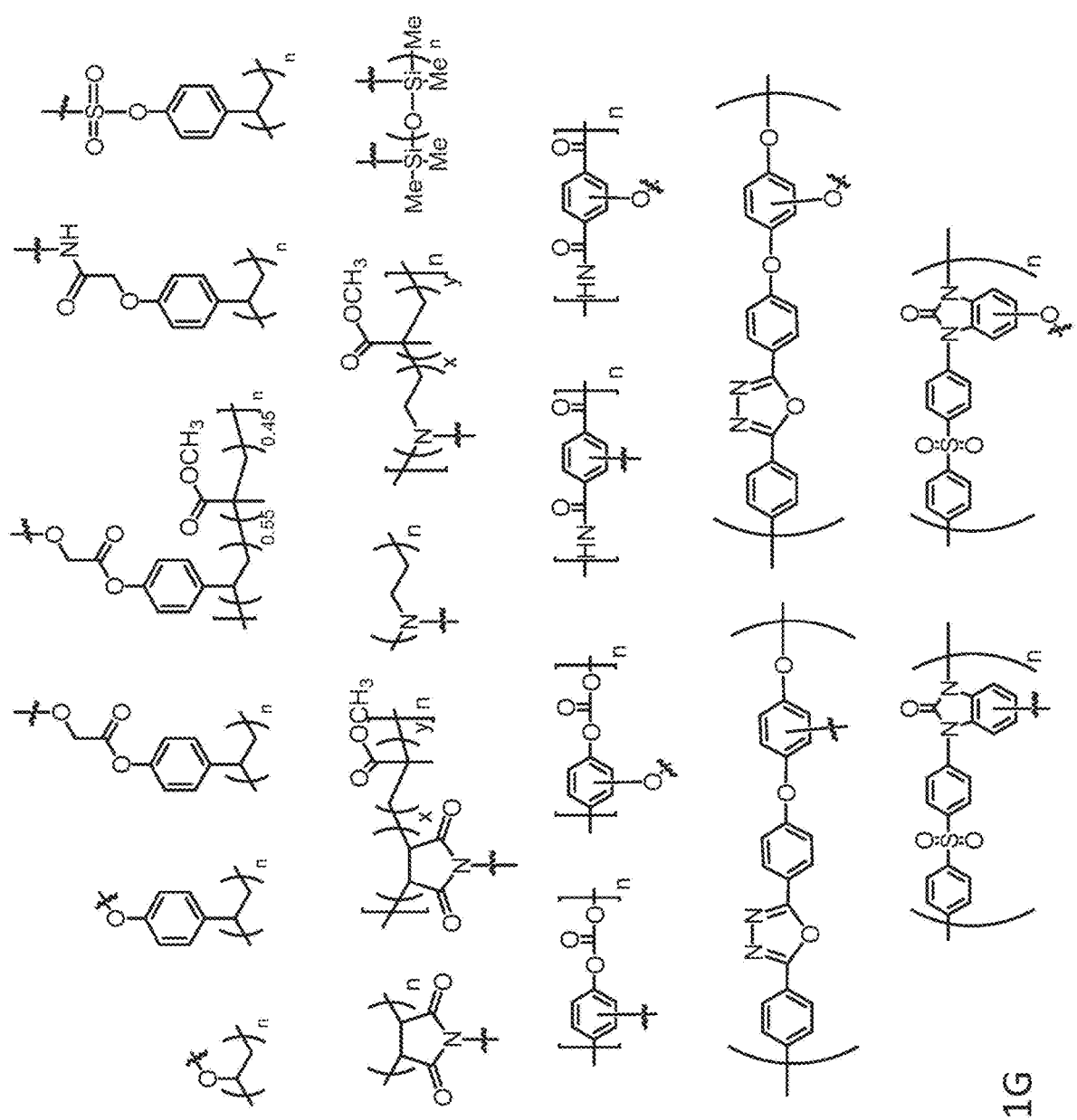
FIG. 1G shows the backbone structures for various polymeric photocurable organic molecules, post-crosslinking.

The photocurable organic molecules can be monomers, dimers, higher order oligomers, and/or polymers that are functionalized with one or more of the radiation-absorbing substituents discussed above, or other radiation-absorbing constituents. In some examples of the polymer compositions, the photocurable organic molecules are carbohydrates that are functionalized with UV absorbing functional groups. However, other types of organic molecules, including polyesters, can also be used. By way of illustration, FIG. 1G shows the backbone structures of various photocurable organic molecules that can be used, where the wavy lines represent the locations of crosslinks. The use of carbohydrates and polyesters is advantageous because they are soluble in environmentally friendly solvents and, therefore, can be photopatterned using those environmentally friendly solvents. The photocurable carbohydrates include cinnamate-functionalized cellulose, glucose, and/or sucrose, examples of which are described in Wang, Zhi, et al. "Cinnamate-Functionalized Natural Carbohydrates as Photopatternable Gate Dielectrics for Organic Transistors." *Chemistry of Materials* 31.18 (2019); 7608-7617.

In order to prevent the photocurable organic molecules from interfering with device function, they are desirably redox-inactive, meaning that their oxidation states do not change upon interaction with the ions from an electrolyte during the operation of an OECT. Thus, the photocurable organic molecules may be dielectric polymers and are typically polymers that do not have a conjugated backbone.

The polymer compositions may take the form of a solution in which the redox-active semiconducting organic polymer and, optionally, the photocurable organic molecules are mixed together in a solvent or solvent mixture in which both polymer components are soluble. The concentration of redox-active semiconducting polymer should be high enough to retain sufficient redox activity and charge carrier conduction for the intended application. By way of illustration, depending upon the particular redox-active semiconducting organic polymer being used and the requirements of the intended application, the solutions and the crosslinked organic films made from the solutions desirably have a concentration of redox-active semiconducting organic polymer of at least 10 weight percent (wt. %), based on the total weight of the redox-active semiconducting organic polymer and the photocurable organic molecules (in the case of a solution) or the total weight of the redox-active semiconducting organic polymer and the crosslinked organic polymer (in the case of a crosslinked organic film). This includes solutions and crosslinked organic polymer films having a redox-active semiconducting organic polymer concentration in the range from 10 wt. % to 90 wt. % and further includes solutions and crosslinked organic polymer films having a redox-active semiconducting organic polymer concentration in the range from 50 wt. % to 90 wt. %, based on the total weight of the redox-active semiconducting organic polymer and the photocurable organic molecules (in the case of a solution) or the total weight of the redox-active semiconducting organic polymer and the crosslinked organic polymer (in the case of a crosslinked organic film). However, concentrations outside of this range can be used for less demanding applications.

Solutions of the redox-active semiconducting organic polymer and the photocurable organic molecules can be processed via various solution-phase processing techniques. For example, a coating formulation comprising a redox-active semiconducting organic polymer and the photocurable organic molecules can be deposited on a substrate, such as an electrically conductive substrate (e.g., source, drain, or gate electrodes in a transistor), a dielectric substrate, or a solid electrolyte, via various solution-phase deposition methods known in the art. In various embodiments, the solution-phase process can be selected from spin-coating, slot coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Spin-coating involves applying an excess amount of the coating solution onto the substrate, then rotating the substrate at high speed to spread the fluid by centrifugal force. The thickness of the resulting film prepared by this technique will be dependent on the spin-coating rate and the concentration of the solution, as well as the solvent used. Printing can be performed, for example, with a rotogravure printing press, a flexoprinting press, pad printing, screen printing or an ink jet printer. The thickness of the resulting film as processed by these printing methods will be dependent on the concentration of the solution, the choice of solvent, and the number of printing repetitions. Ambient conditions such as temperature, pressure, and humidity also can affect the resulting thickness of the film. Depending on the specific printing techniques used, printing quality can be affected by different parameters including, but not limited to, rheological properties of the formulations/compositions such as tension energy and viscosity. For non-contact printing techniques such as inkjet printing, the solubility requirement generally can be less stringent and a solubility range as low as about 1-4 mg/ml can suffice. For gravure printing, a higher solubility range may be necessary, often in the range of about 50-100 mg/mL. Other contact printing techniques such as screen-printing and flexo printing can require even higher solubility ranges, for example, about 100-1000 mg/ml.

For use in applications where structural stability is important, such as in the conducting channel of a vOECT, polymer blends in which the crosslinked organic polymer is at least partially phase separated from the redox-active semiconducting organic polymer can be used. In the phase-separated embodiments of the crosslinked organic films, the crosslinked organic polymer provides structures, such as pillars, within the film that enhance the mechanical robustness of the film.

Crosslinked, redox-active, ion-permeable semiconducting organic films can be made from solutions containing the redox-active semiconducting organic polymer and the photocurable organic molecules. Some such solutions consist of only redox-active semiconducting organic polymer and photocurable organic molecules dissolved in one or more solvents. Depending upon the particular polymers and molecules being used, the solution may be aqueous or non-aqueous. To make the organic films, the solution is first coated onto the surface of a substrate. The substrate may be a component of an electronic device or circuit, such that the redox-active, semiconducting organic films can be formed in situ as active layers in the device or circuit. The composition is then exposed to radiation that is absorbed by the photocurable organic molecules, inducing covalent crosslink formation to produce a crosslinked, redox-active, ion-permeable semiconducting organic film comprising, or consisting of, a blend of the redox-active semiconducting organic polymer and the crosslinked polymer that is formed by the photocuring of the organic molecules. The films may be very thin, which is advantageous for thin film electronics applications such as vOECTs in which the channel length corresponds to the film thickness. By way of illustration, organic films having thicknesses of less than 200 nm, less than 100 nm, and less than 50 nm can be formed.

In addition to the photocurable organic molecules, the photopatternable compositions can include other components that can be used to selectively modify the processability of the composition (e.g., viscosity, photocuring speed, and/or absorption wavelengths) and/or the properties of the resulting material (e.g., dielectric properties, thermal stability, and/or decomposition temperature). For example, the composition can include initiators and/or additional crosslinking agents to enhance its photopatternability (e.g., by speeding up curing time or reducing curing temperature or radiation dosage) and/or to increase the crosslinking density of the present polymers. Examples of initiators can include radical initiators such as azobisisobutyronitrile (AIBN), photoacid generators (PAGs) such as triphenylsulfonium triflate, radical photoinitiators such as diphenyl(2,4,6-trimethylbenzoyl)phosphine oxide (TPO), or photosensitizers such as benzophenone and 1-chloro-4-propoxy-9H-thioxanthen-9-one. Initiators of these types are currently sold under the tradenames Irgacure PAG 103, Irgacure PAG 121, CGI 1907, CGI 725, Irgacure PAG 203, and Irgacure PAG 290, the structures of which are shown in FIG. 11.

To illustrate, in certain embodiments, a crosslinked film can be deposited from a photopatternable composition, where the photopatternable composition includes (a) a redox-active semiconducting organic polymer, and (b) a photoacid generator dispersed in a liquid medium (e.g., an organic solvent or mixtures thereof). The redox-active semiconductor polymer can be present in the photopatternable composition at a concentration between, for example, about 1 wt. % and about 20 wt. %, and the photoacid generator can present in the photopatternable composition at a concentration between, for example, about 0.05 wt. % and about 1 wt. %.

Organic films patterned with fine features can be formed by selectively exposing one or more portions of the coating composition to radiation, while shielding one or more other portions of the coating composition from the radiation in order to selectively photocure the composition in the exposed portion(s). This can be accomplished using, for example, a photomask or a laser writer. As a result of the photocuring, the solubility of the crosslinked portions of the composition is reduced, relative to the solubility of the uncured portions of the coating. Therefore, by exposing the coating to an appropriate organic solvent, the unexposed portions of the coating composition can be selectively removed. The organic solvent used to form the initial coating composition can be used to selectively dissolve the unexposed portions. However, other organic solvents that selectively dissolve the unexposed portions can be used. Features with sub-micron dimensions can be patterned into the organic films in this manner. As a result, arrays comprising many devices, such as vOECTs, having very small footprints can be patterned quickly using a few simple steps.

Figure 3A:
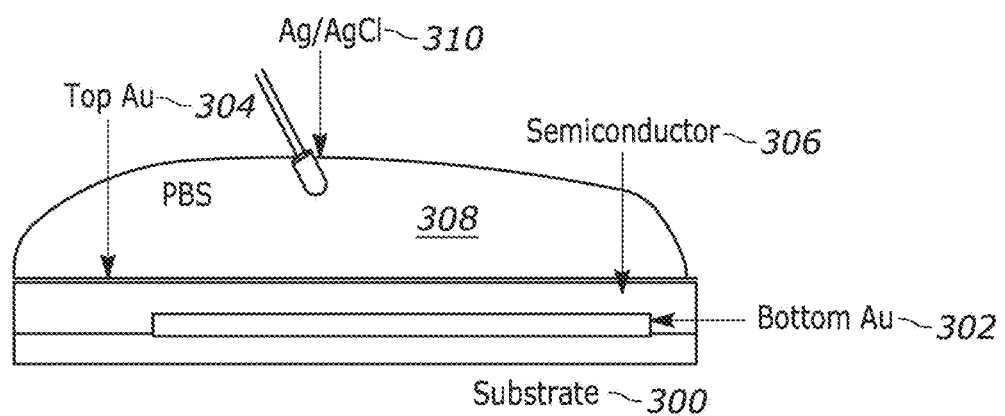
FIG. 3A shows a cross-sectional illustration of one embodiment of a vOECT that uses a liquid electrolyte.
Figure 3B:
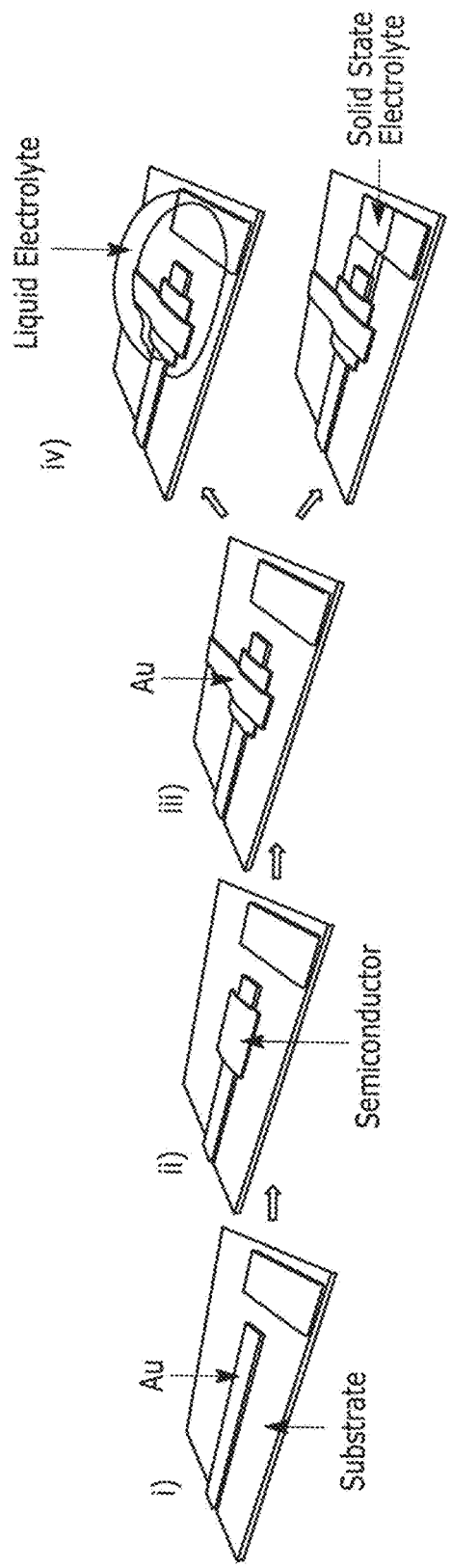
FIG. 3B shows the fabrication of an alternative embodiment of a vOECT that uses a liquid or solid electrolyte, in which the gate electrode is deposited on the same plane as the source or the drain electrode, forming a side-gate OECT architecture. Panel i) shows the thermal evaporation of a gold bottom source electrode and side gate electrode with a shadow mask; panel ii) shows spin-coating/photopatterning of a semiconducting layer; panel iii) shows the thermal evaporation of a gold top drain electrode with a shadow mask; and panel iv) shows the application of a liquid (upper) electrolyte or a solid-state (lower) electrolyte.
Figure 3C:
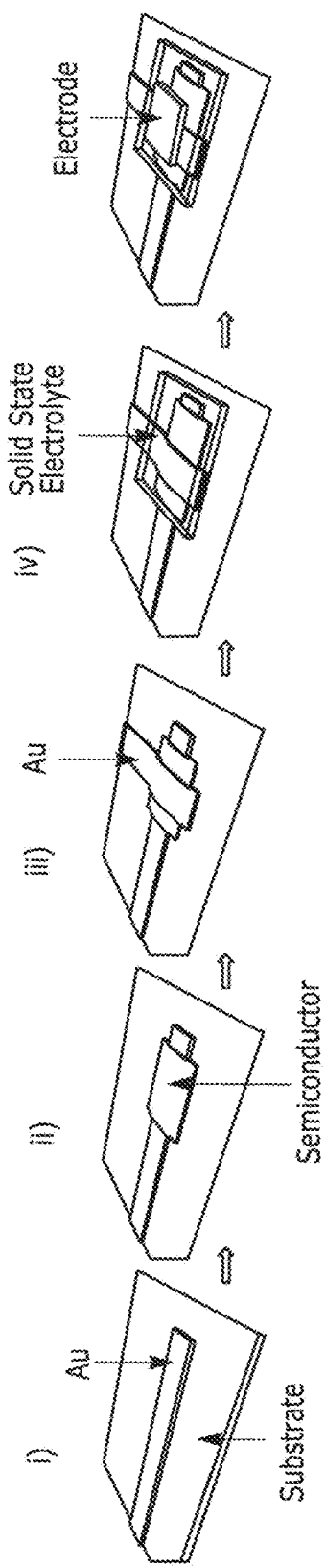
FIG. 3C shows the fabrication of yet another embodiment of a vOECT that uses a solid electrolyte, in which the gate electrode is deposited on top of the solid-state electrolyte. Panel i) shows the thermal evaporation of a gold bottom source electrode with a shadow mask; panel ii) shows spin-coating/photopatterning of a semiconducting layer; panel iii) shows the thermal evaporation of a gold top drain electrode with a shadow mask; and panel iv) shows the application of a solid electrolyte and a top gate electrode.

One example of a vOECT is illustrated in FIG. 3A, which shows a cross-sectional view of the device. The vOECT includes a source 302 on device substrate 300, a drain 304, a crosslinked, redox-active, ion-permeable semiconducting organic film 306 sandwiched between source 302 and drain 304, an electrolyte 308 in contact with film 306, and a gate 310 immersed in electrolyte 308. Although source 302 and drain 304 in this embodiment are shown as the bottom and top electrodes, respectively, the top electrode could also be the source and the bottom electrode the drain. Alternatively, the gate electrode can be deposited on the same plane as the source or the drain electrode, forming a side-gate OECT architecture or on top of a solid-state electrolyte, as illustrated in the fabrication schemes of FIG. 3B or FIG. 3C, respectively. Furthermore, while the source and drain are gold contacts, and the gate is silver/silver chloride, other electrically conductive materials, including other metals, can be used. The source and drain can be formed using, for example, thermal evaporation and masking.

Figure 3D:
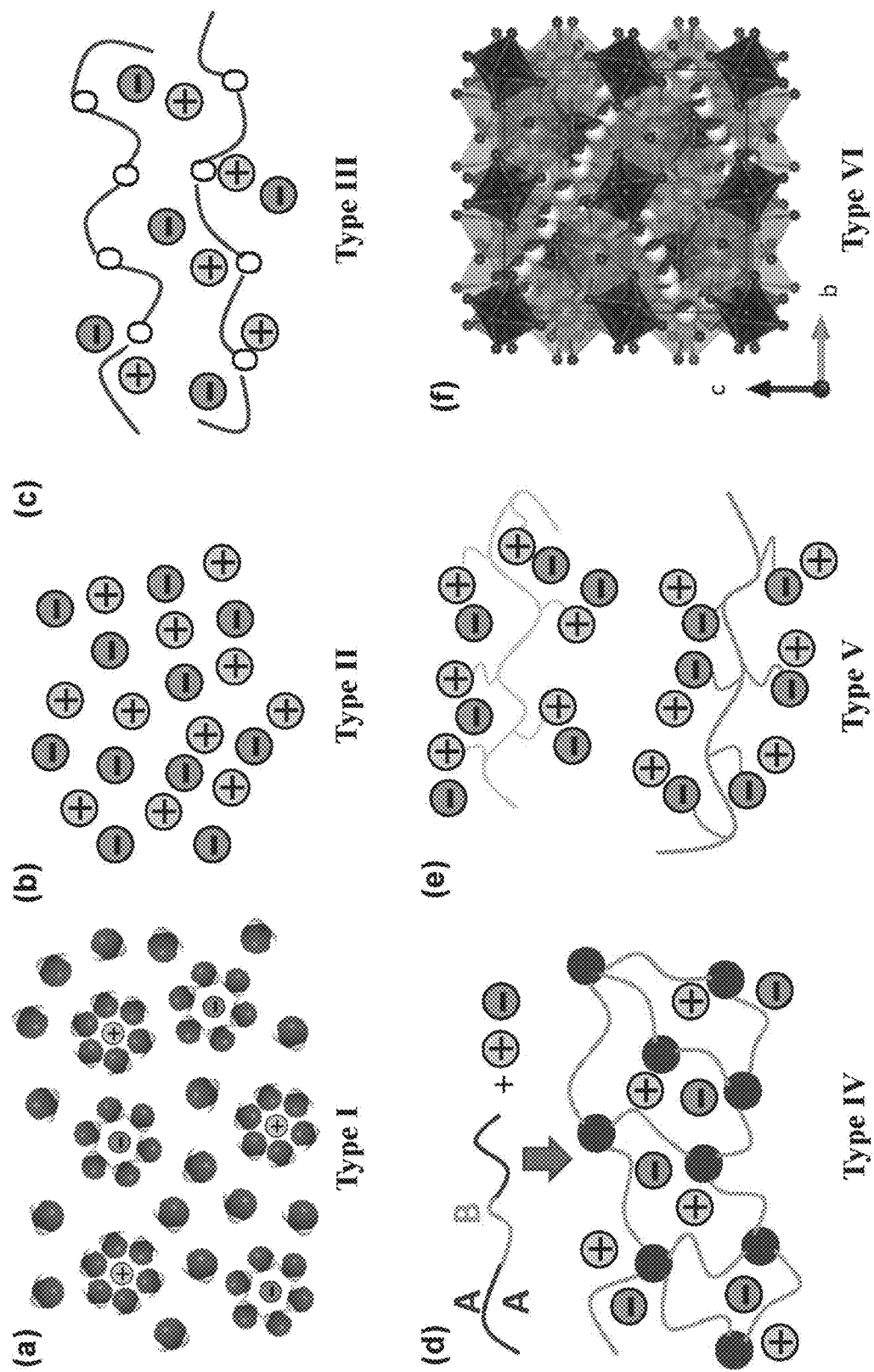
FIG. 3D, panels (a)-(f), shows the structures of various electrolytes.

The electrolyte, which comprises a solution of ions dissolved in a solvent or a solvent mixture, can be a liquid, gel, or solid. For purposes of illustration, examples of some electrolyte materials that can be used are shown in FIGS. 3D-3I. FIG. 3D, panels (a)-(f), illustrates different electrolytes; panel (a) Type I: Aqueous salt solutions, where the first solvation shells of both cations and anions are shown; panel (b) Type II: Ionic liquids (ILs) composed of pure cations and anions; panel (c) Type III: Representative polymer electrolytes, where the salt cations and anions are coordinated with polyethylene oxide like polymer chains; panel (d) Type IV: Representative ion gel electrolytes based on an ABA triblock copolymer and IL, note that the IL is insoluble in the A blocks (lighter shading) and soluble in the B blocks (darker shading); panel (e) Type V: Polyelectrolytes where the upper one is based on the polymerization of cations (polycation), while the lower one is based on the polymerization of anions (polyanion); and panel (f) Type VI: A representative oxide electrolyte based on gamet-type cubic $Li_7La_3Zr_2O_{12}$, where the Li atoms are shown as dark/white spheres.

Figure 3E:
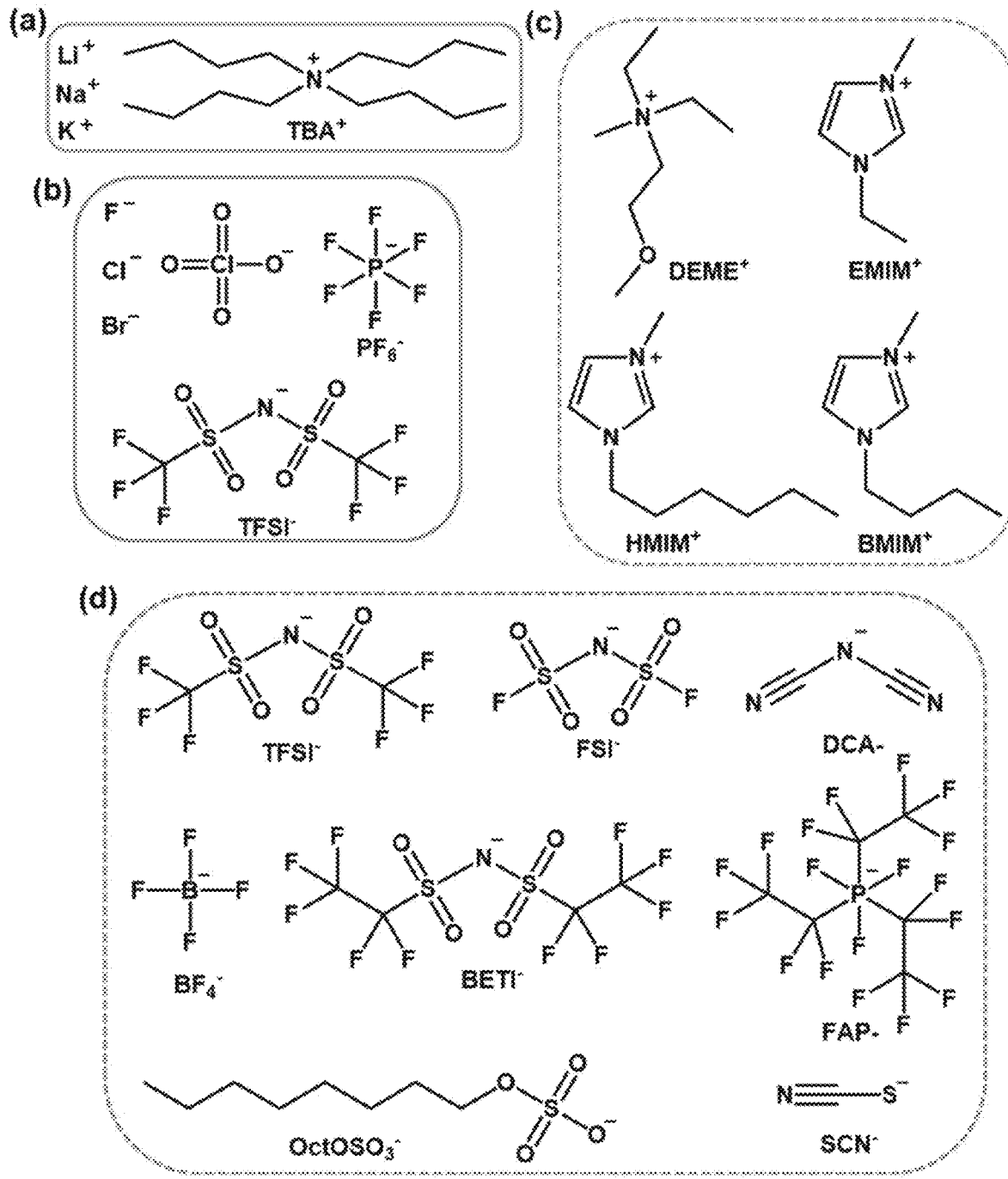
FIG. 3E, panels (a)-(d), shows representative liquid electrolyte chemical structures.

FIG. 3E, panels (a)-(d), shows representative liquid electrolyte e chemical structures: panel (a) shows cations and panel (b) shows anions of salts typically used in salt electrolytes, and panel (c) shows cations and panel (d) shows anions typically used of IL electrolytes.

Figure 3F:
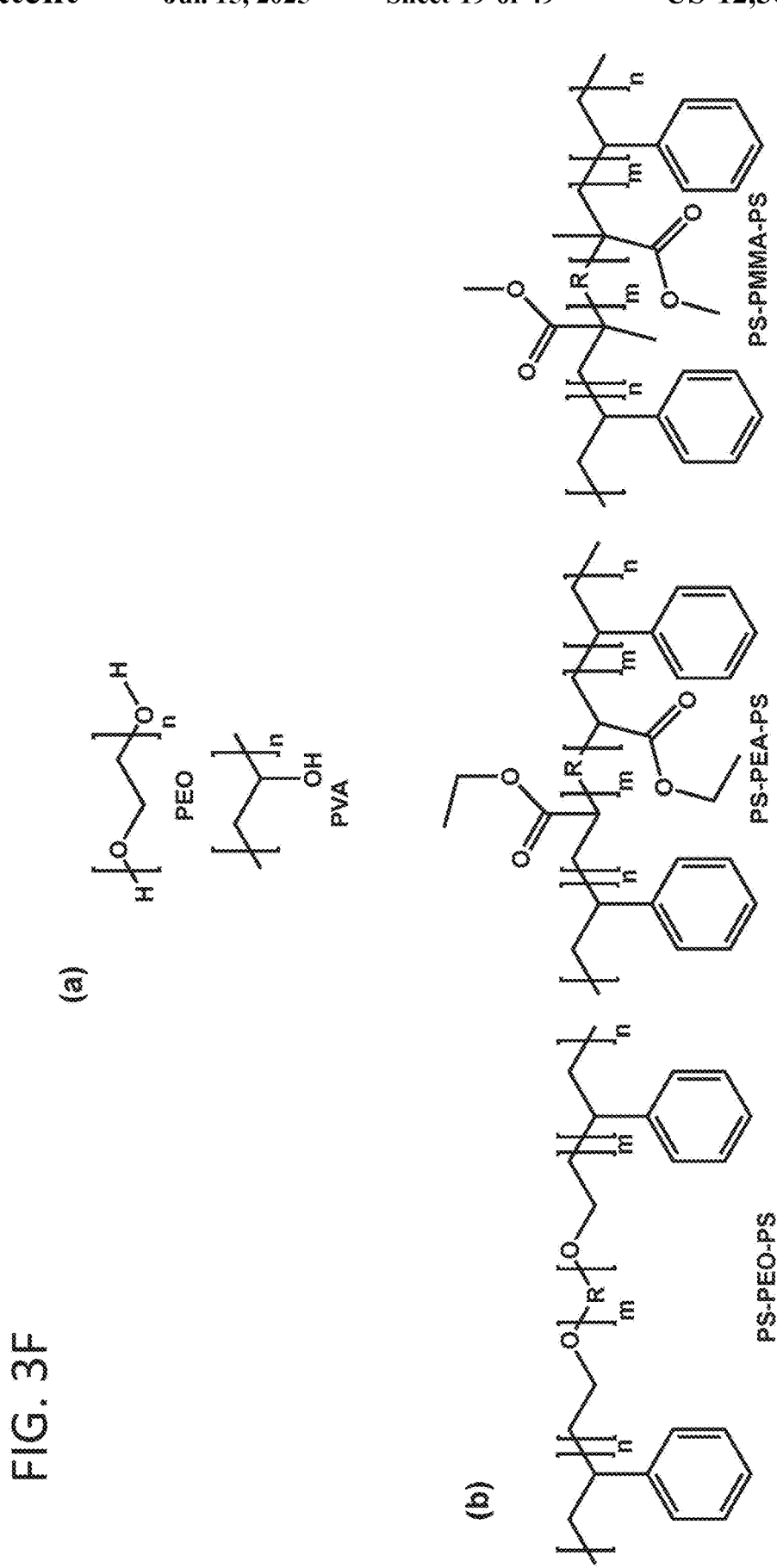
Figure 3G:
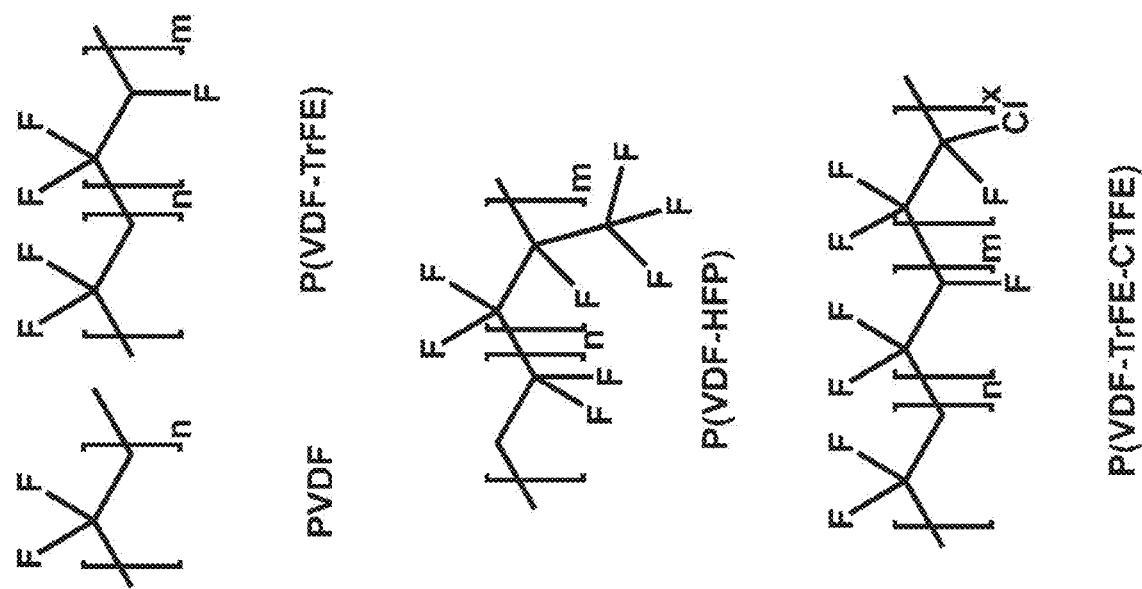
Figure 3H:
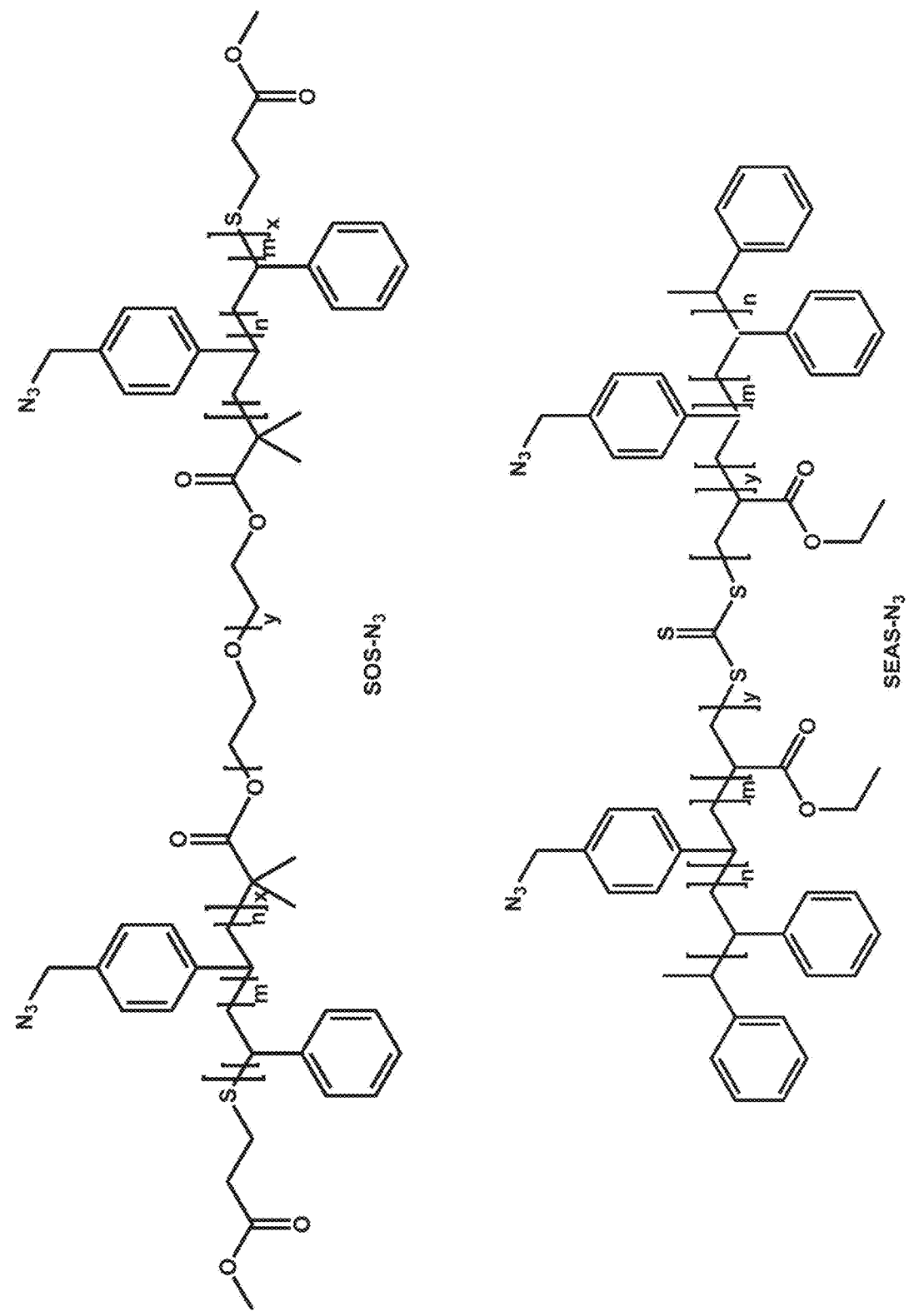
Figure 31:
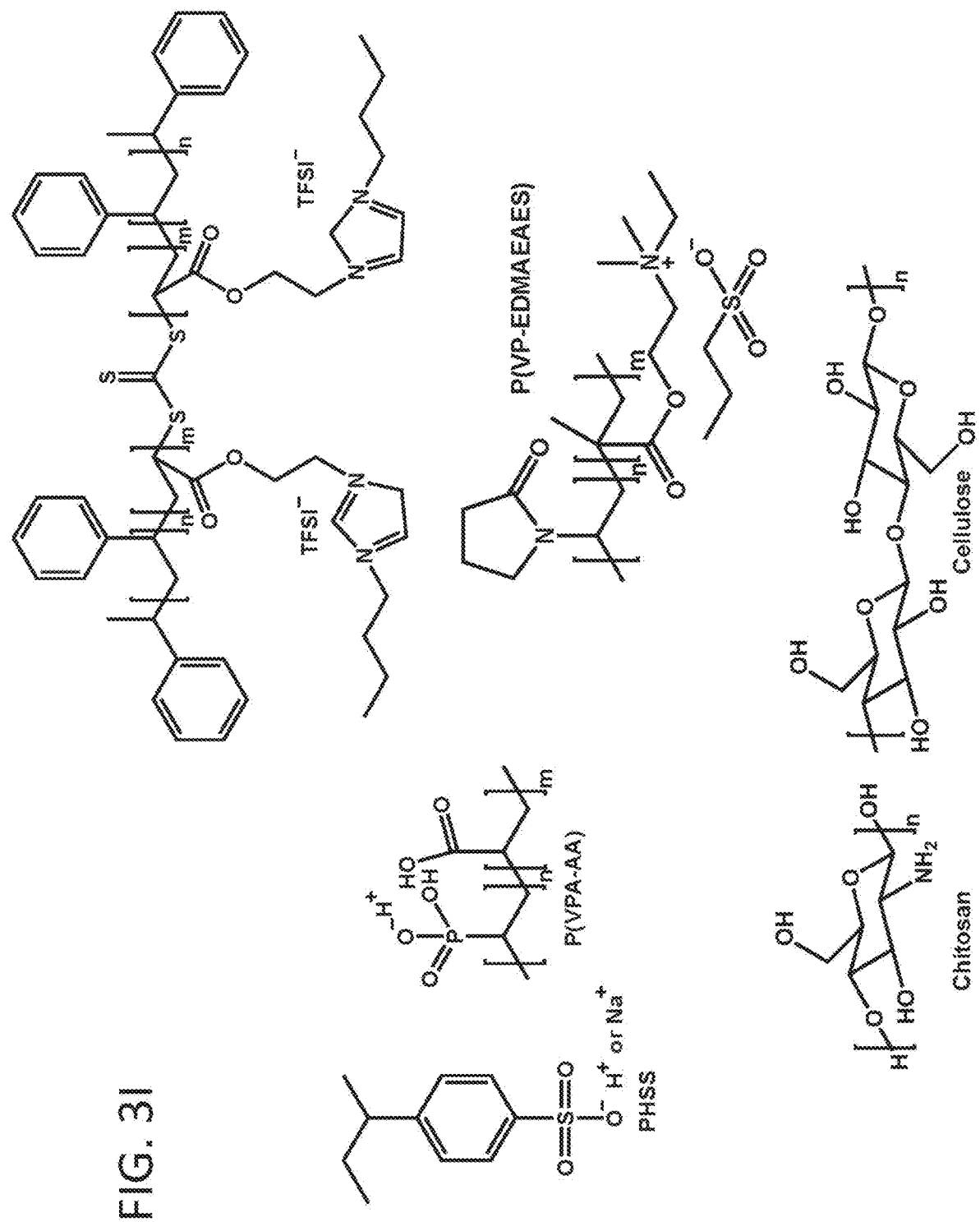

FIGS. 3F-3I show representative chemical structures of polymers that can be used as polymer-based electrolytes: On FIG. 3F, panel (a) shows polymers for polymer electrolytes; FIG. 3F, panel (b) shows ABA triblock-copolymers; FIG. 3G shows fluorinated polymers; FIG. 3H shows representative copolymers (SOS-$N_3$ and SEAS-$N_3$) with photo crosslinkable units; and FIG. 3I shows polyelectrolytes.

In a vOECT, the current flowing between source 302 and drain 304 is modulated by the application of a bias voltage to gate 310. The electrostatic repulsion caused by the application of this gate voltage induces ions from the electrolyte to diffuse into the ion-permeable semiconducting organic film 306 and change the oxidation state of the redox-active semiconducting organic polymer. Depending upon whether the redox-active semiconducting organic polymer is n-type doped (n-channel) or p-type doped (p-channel), and the mode of operation of the transistor (depletion or accumulation), the charge carries may either decrease or increase the drain current.

Complementary circuits can be formed by incorporating a vOECT having a given channel type (n-channel or p-channel) with a second vOECT having a complementary (i.e., opposite) channel type (p-channel or n-channel) in a circuit. In the complementary circuits, one or both of the OECTs may be a vOECT. Examples of complementary circuits that can be fabricated include complementary logic circuits, such as NAND gates, complementary inverters, ring oscillators, and differential pairs. By way of illustration, vertically stacked complementary inverters (VSCIs) are circuits in which an n-type vOECT sits directly on top of p-type vOECT, or vice versa. Such 3D geometry enables much higher integration density as it requires a smaller footprint per inverter, relative to OECTs having a planar construction.

EXAMPLES

Figure 1H:
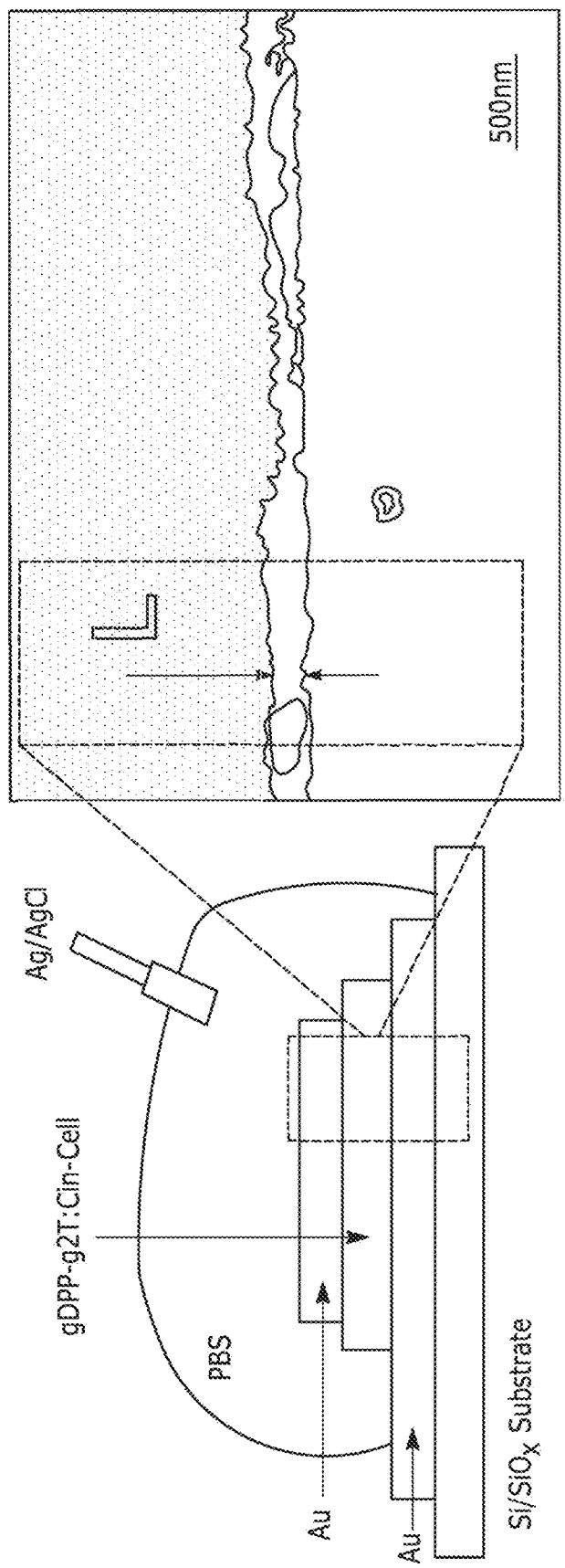
FIG. 1H shows a cross-sectional illustration of a p-type vOECT, along with a schematic line drawing reproduction of a cross-sectional SEM image showing the semiconducting layer sandwiched between two dense Au electrodes (W=L=70 μm) in a vOECT, as described in Example 1.
Figure 1I:
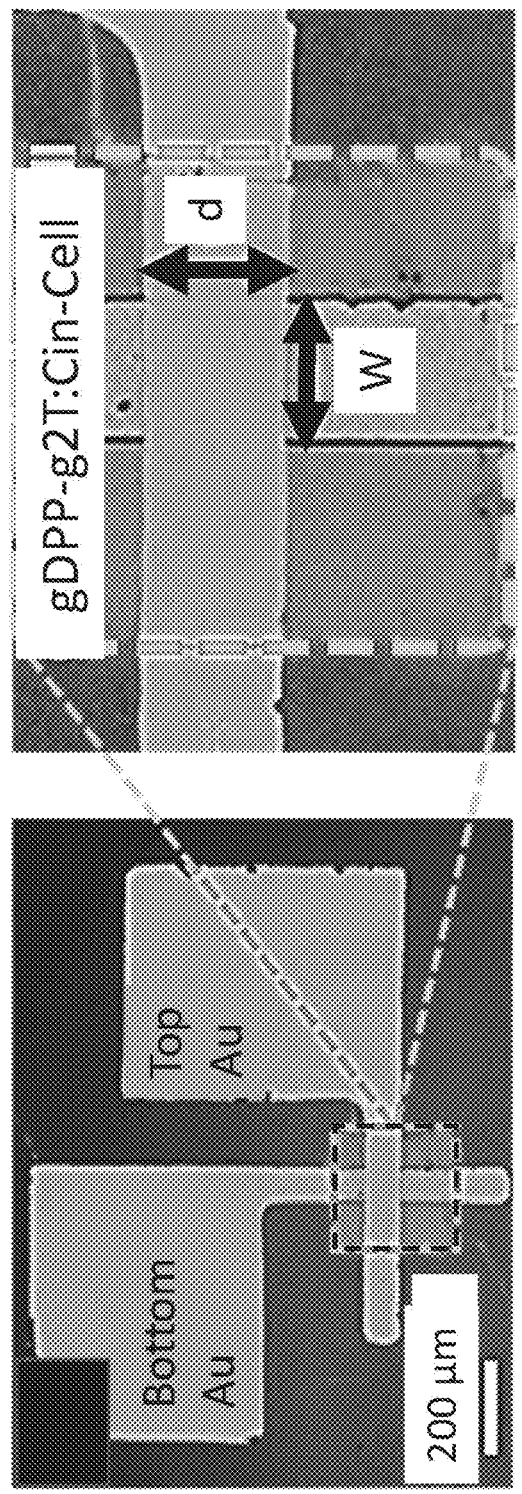
FIG. 1I shows an optical image of the p-type vOECT, where the electrode overlapping area is enlarged.
Figure 5:
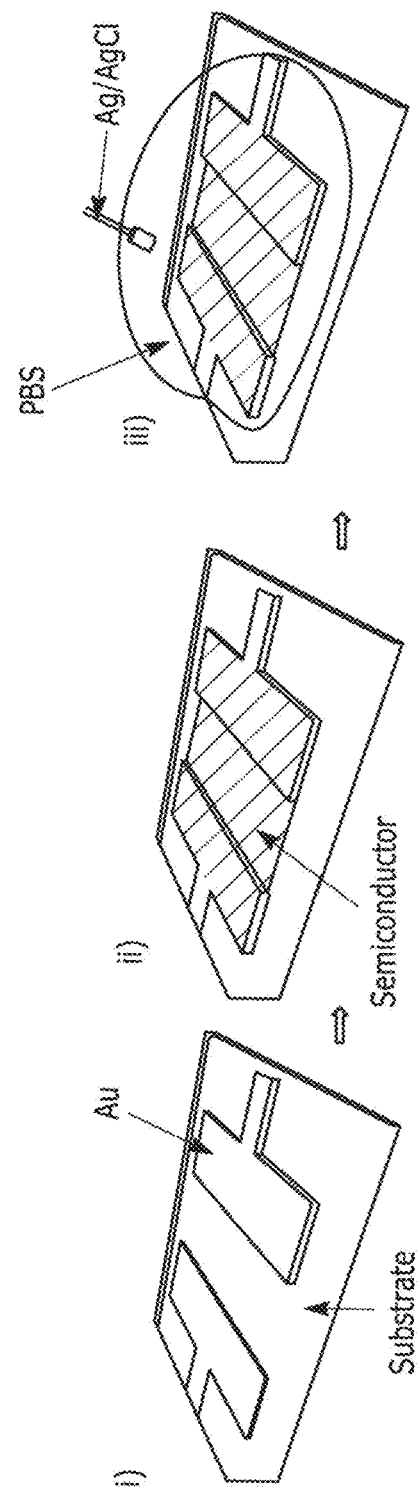
FIG. 5 shows a fabrication process and channel geometry of a conventional planar OECT.

Example 1: vOECTs Based on Redox-Active D-Type gDPP-g2T and n-Type Homo-gDPP Semiconductors This example demonstrates high-performance p- and n-type OECTs and complementary circuits by employing a vertical device architecture (vOECTs) easily fabricated by thermal evaporation/masking of impermeable and dense Au source/drain electrodes and spin-coating/photopatterning of the semiconductor channel. The vOECT fabrication process is illustrated in FIG. 1A and details can be found in Methods. The key to this process is the use of a redox-active [p-type (gDPP-g2T) or n-type (Homo-gDPP)] semiconductor blended with a redox-inert/photocurable polymer component [Cin-Cell] as the OECT channel (see structures in FIG. 1B, synthesis process in Methods). A vOECT geometry cross-section (FIG. 1H) and selected optical and SEM images (FIG. 1I) indicate that the channel length (L) is the semiconductor layer thickness (~100 nm), and the widths of the bottom and the top electrodes define the channel width (W) and the nominal depth (d) of the semiconductor, respectively. Conventional OECTs (cOECTs) were also fabricated as controls (FIG. 5). Briefly; i) Au source and drain electrodes were fabricated on a substrate using photolithography, Au thermal evaporation, and lift-off, ii) a solution of the redox-active semiconducting organic polymer and the photocurable organic molecule was spin-coated (e.g., gDPP-g2T:Cin-Cell) over the source and drain and the exposed surface of the substrate between the source and the drain and subsequently photocured via UV radiation; iii) a phosphate buffered saline (PBS) was applied as the electrolyte over the cured film, and an Ag/AgCl gate electrode was immersed in the electrolyte.

Figure 2A:
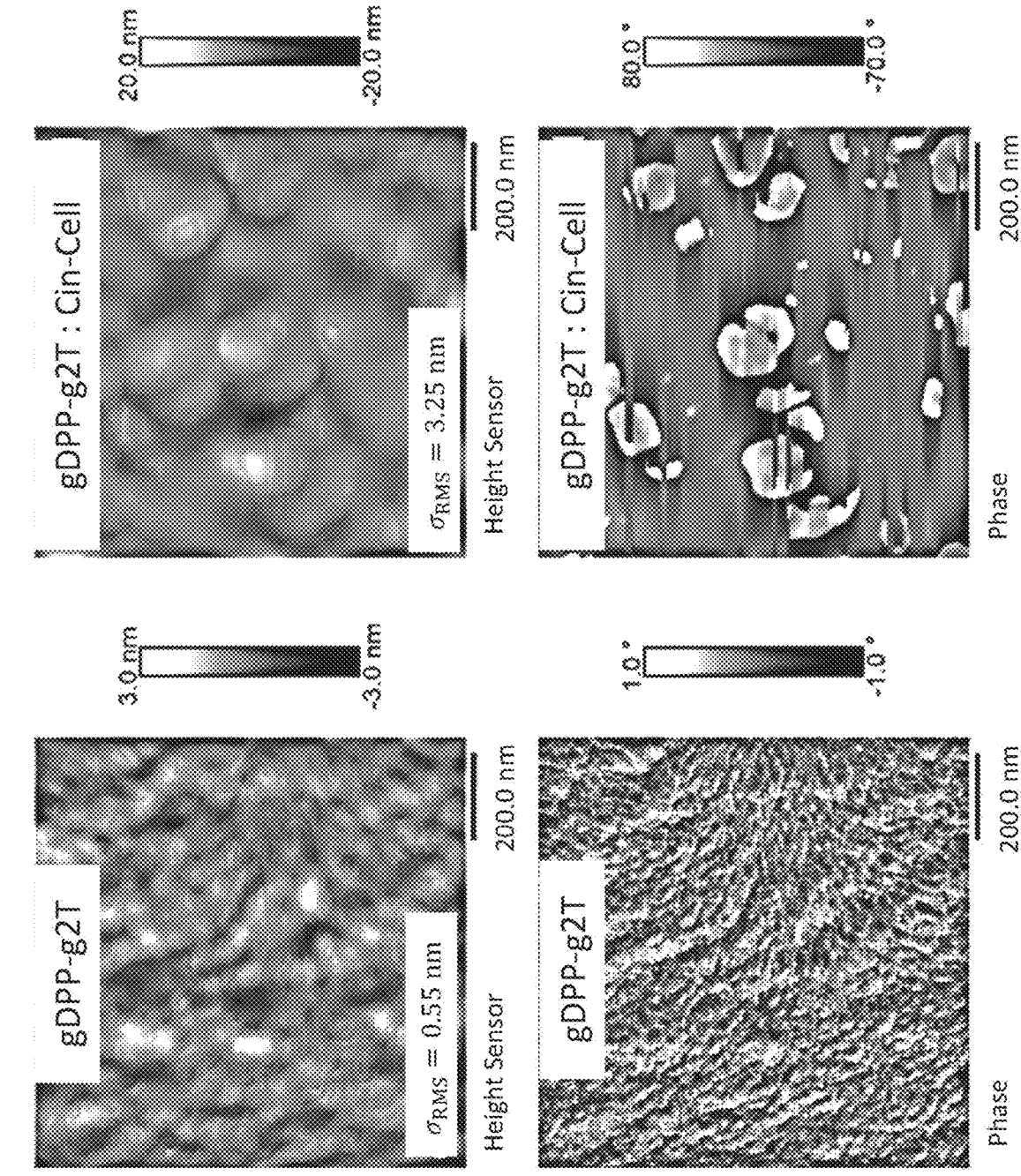
FIG. 2A shows atomic force microscope (AFM) height images and phase images of a pristine gDPP-g2T film and gDPP-g2T:Cin-Cell blend (9:2 in mass) film.
Figure 2B:
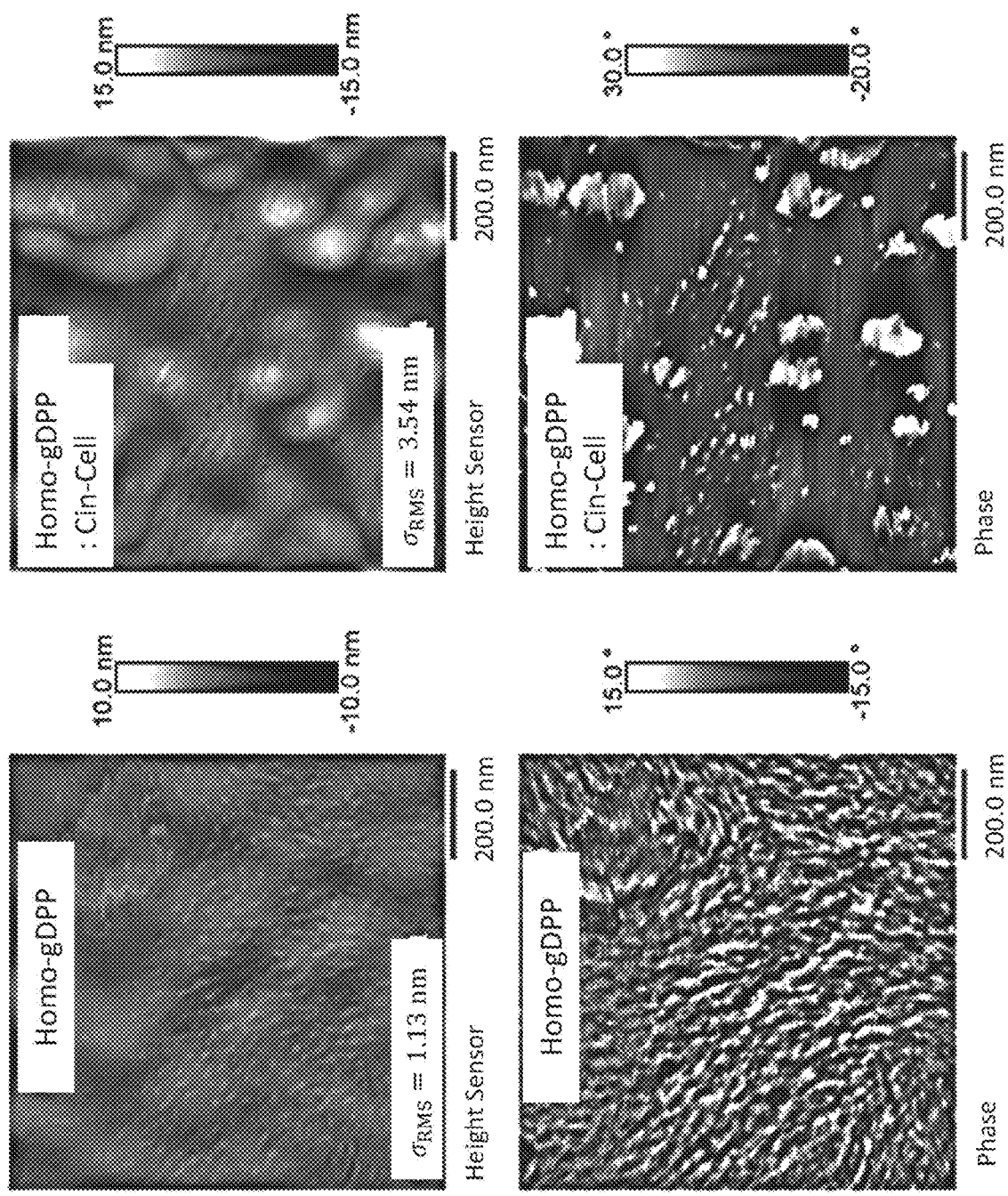
FIG. 2B shows AFM height images and phase images of a pristine Homo-gDPP film and a Homo-gDPP:Cin-Cell blend (9:2 in mass) film.
Figure 2C:
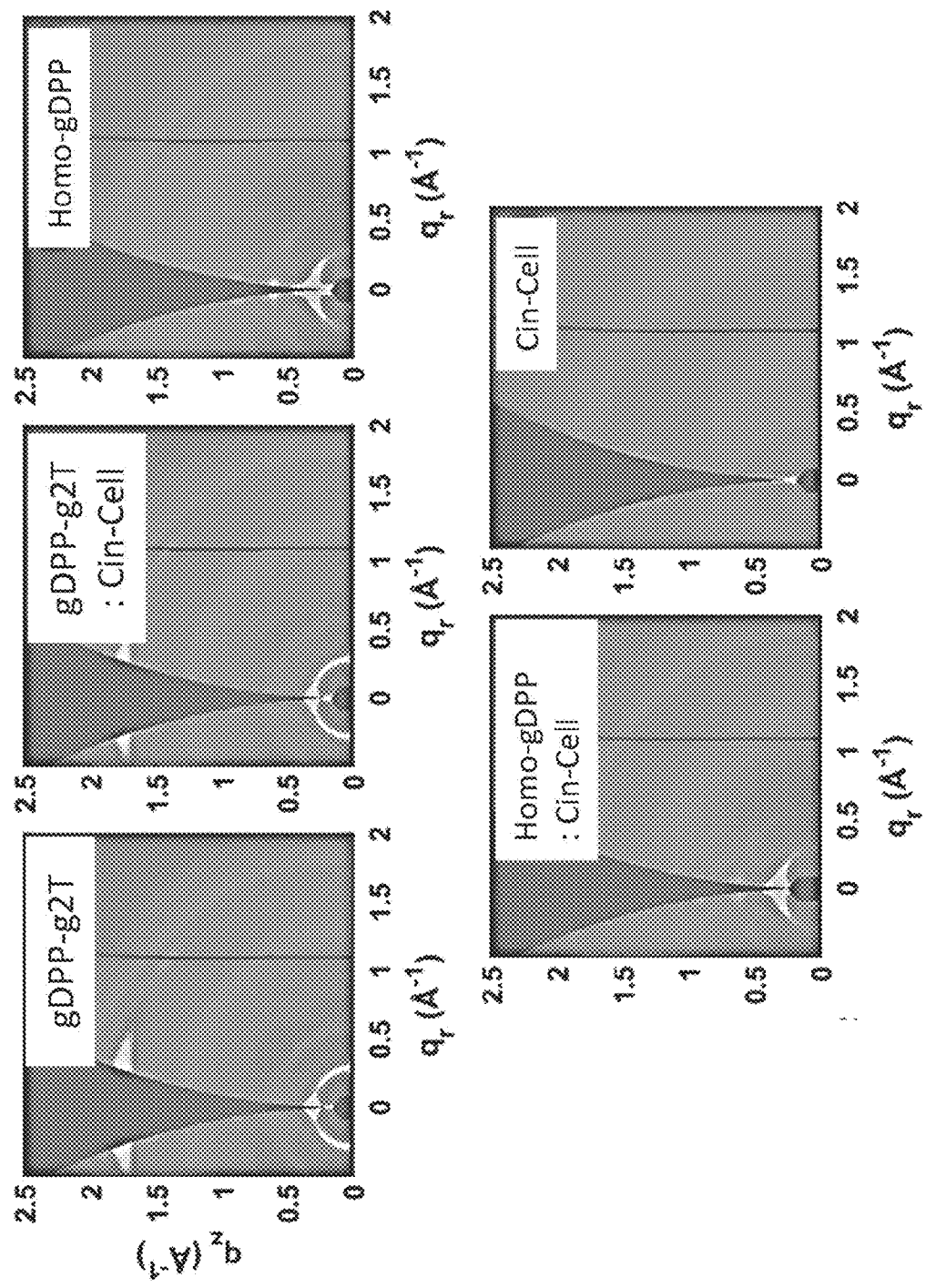
FIG. 2C shows 2D-grazing incidence wide-angle X-ray scattering (GIWAXS) images.
Figure 2D:
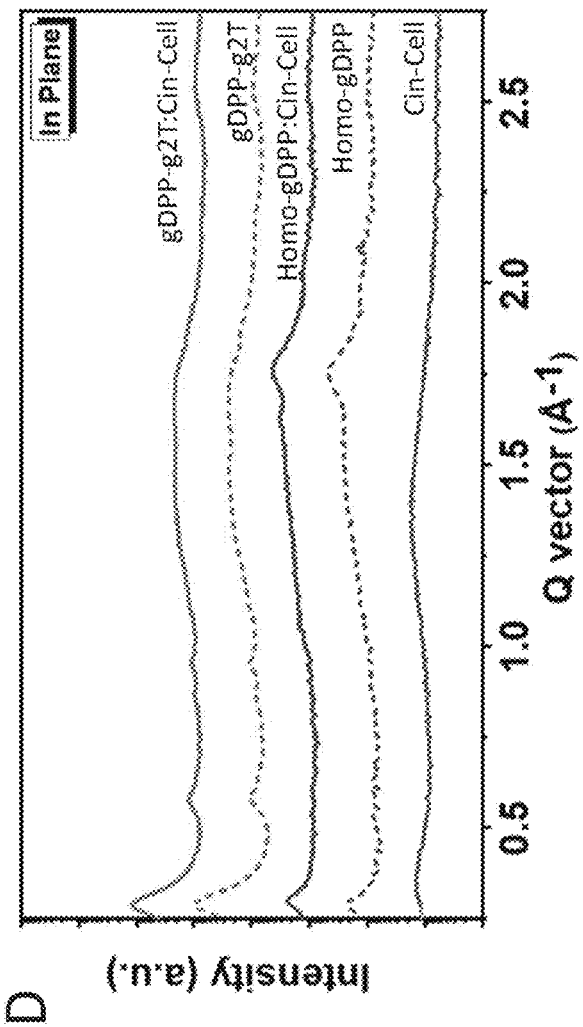
FIG. 2D shows the corresponding in-plane one-dimensional line-cuts for gDPP-g2T, gDPP-g2T: Cin-Cell, Homo-gDPP, Homo-gDPP: Cin-Cell, and Cin-Cell films.
Figure 2E:
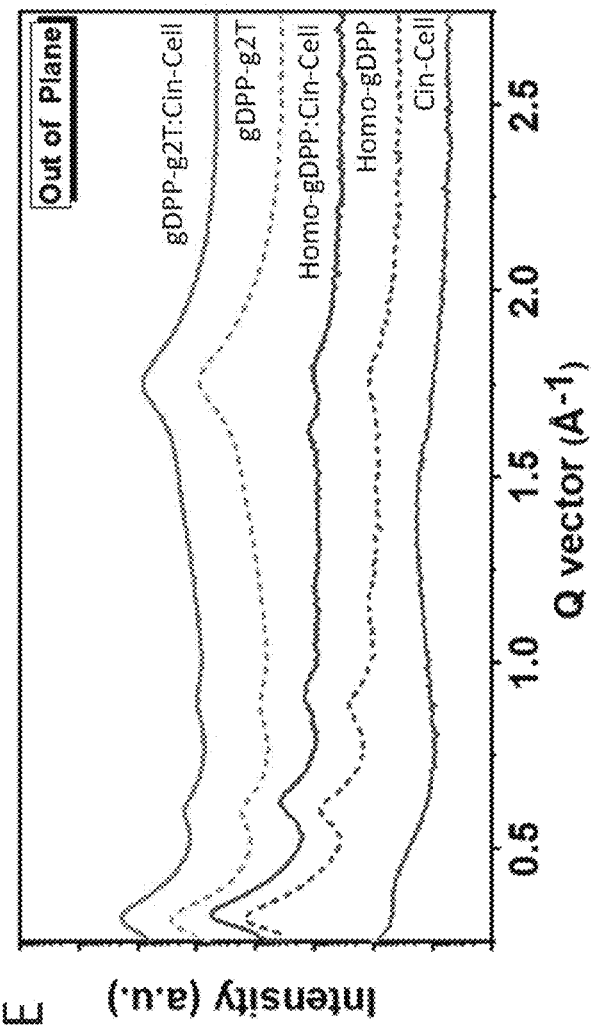
FIG. 2E shows the corresponding out-of-plane one-dimensional line-cuts for gDPP-g2T, gDPP-g2T: Cin-Cell, Homo-gDPP, Homo-gDPP: Cin-Cell, and Cin-Cell films. The gDPP-g2T in both pristine and blend films exhibits a preferential face-on orientation, yet with a considerable portion of crystallites being edge-on oriented. In all cases, the lamellar and π-π periodicities are pinned at 20.2 Å and 3.6 Å, respectively. However, in both Homo-gDPP and Homo-gDPP:Cin-Cell the polymer orientation is preferentially edge-on and while the π-π distance is pinned at 3.6 Å, the lamellar spacing varies slightly (from 20.2 Å to 19.6 Å, respectively).

Before device evaluation, the semiconductor film morphology and microstructure were characterized. As shown in FIGS. 2A-2B, pristine gDPP-g2T and HOMO-gDPP films were continuous and smooth (root-mean-square roughness, $\sigma_{RMS}$~1 nm) while both polymer blends with Cin-Cell were rougher after UV cross-linking/patterning ($\sigma_{RMS}$~3 nm) with evidence of phase separation, where Cin-Cell formed pillar-like structures which enhanced structural robustness and stability. Thus, Cin-Cell in the semiconducting matrix acted not only as a photopatterning component of the channel but, most importantly, an OECT structural stabilizer (vide infra). Two-dimensional grazing incidence wide-angle X-ray scattering (2D-GIWAXS. FIGS. 2C-2E) patterns of the pure polymer and polymer:Cin-Cell mixture films were similar, corroborating phase separation and demonstrating that Cin- Cell addition does not significantly alter the overall film texturing and polymer chain order.

Figure 6A:
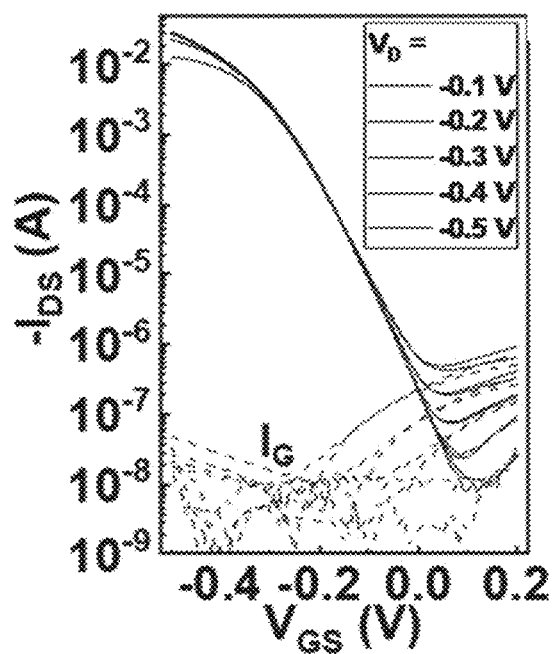
FIGS. 6A-6B show representative transfer characteristics, and FIGS. 6C-CD show corresponding gm and SS curves of a vOECT having a p-type channel comprising gDPP-g2T (W=d=30 μm) (FIGS. 6A, 6C) and a vOECT having an n-type channel comprising Homo-gDPP (W=d=50 μm) (FIGS. 6B, 6D), as described in Example 1.
Figure 6C:
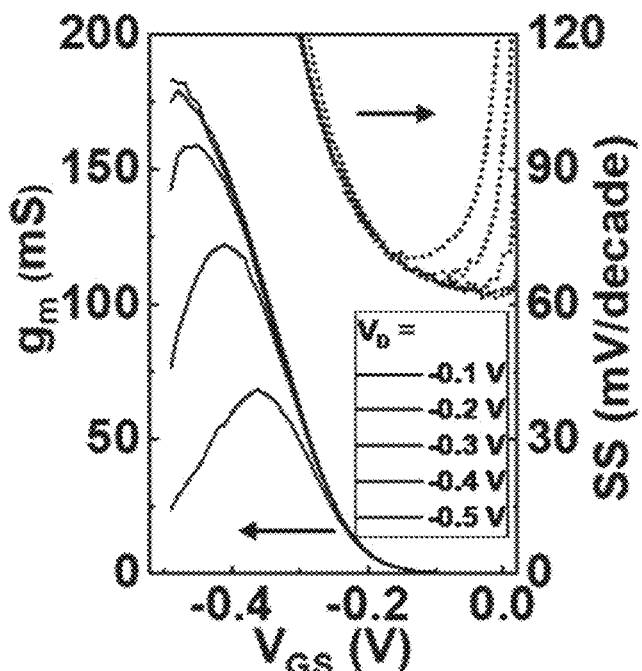
FIGS. 6E-6F show comparisons of current on/off ratio ($I_{ON}/I_{OFF}$) versus (FIG. 6E) gm per unit area ($g_{m,A}$) and (FIG. 6F) on-current per unit area ($I_{ON,A}$) for different OECTs. Note, different * are data of this work based on different W and d (see Table 1). Impressively, these devices exhibit almost identical performance parameters ($I_{ON}$, $V_{ON}$, $g_m$) than those of the corresponding p- and n-type vOECTs having an unpatterned channel, with the exception of a lower off-current for the p-type vOECT. This is due to confinement of the charge transport within the overlapping source/drain electrodes. The ultra-small L prevents significant fringing effects.
FIG. 6G shows $g_m$ as a function of Wd/L for the $I_{ON,A}$ vOECTs and cOECTs of Example 1, as well as previously reported OECTs. (Ohayon, D. et al. *ACS Appl. Mater. Interfaces* 13, 4253-4266 (2021); Giovannitti, A. et al. *Nat. Commun.* 7, 13066 (2016); Sun, H. et al. *Adv. Mater.* 30, 1704916
Figure 6B:
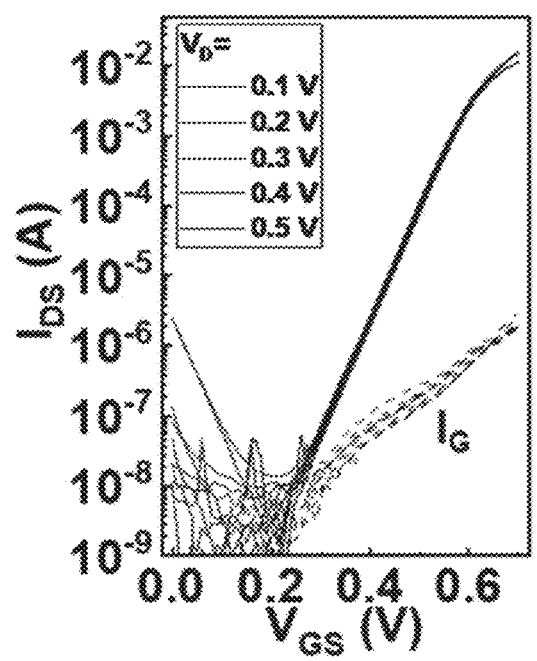
Figure 6D:
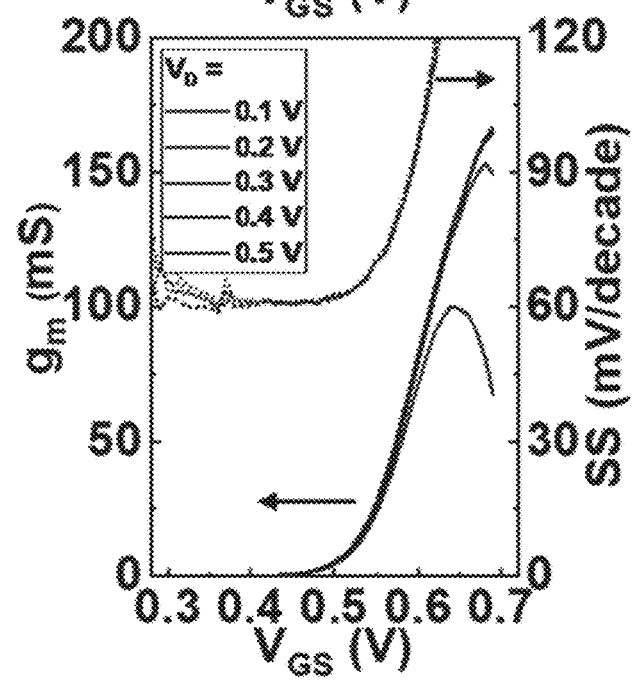
Figure 6G:
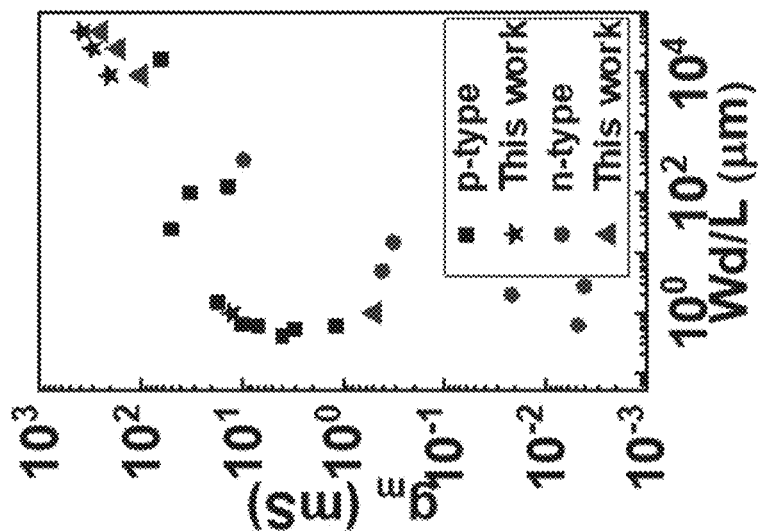
Figure 6E:
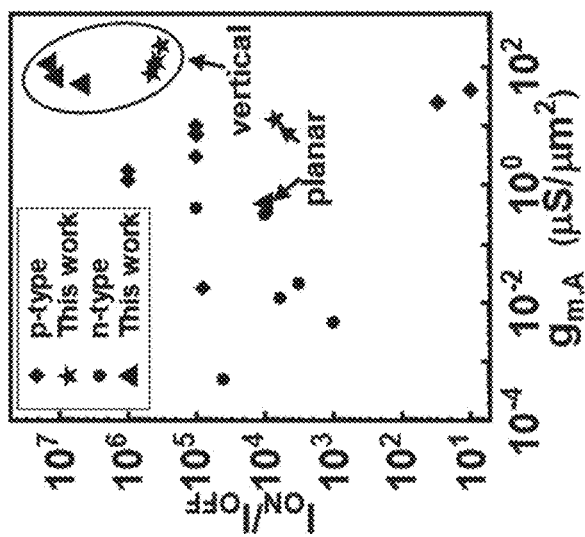
Figure 6F:
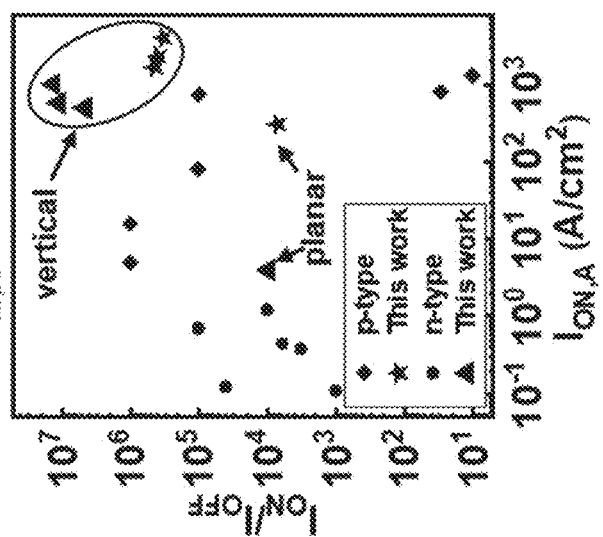

Next, vOECTs and cOECTs were tested and the performance parameters (Table 1) were extracted following standard procedures. (Ohayon, D. et al. *ACS Appl. Mater. Interfaces* 13, 4253-4266 (2021): Moser, M. et al. *Adv. Mater.* 32, e2002748 (2020).) Control vOECTs without the Cin-Cell were also fabricated for comparison. However, the device yield was low and, most importantly, they were unstable after very few repeated gate voltage ($V_G$) scans mainly due to delamination of the top electrode. Consequently, all the data reported here are for crosslinked polymer blends. The device transfer characteristics and the corresponding $g_m$/subthreshold swing (SS) plots (FIGS. 6A-6D) demonstrate extraordinary performance for both the p-type and n-type vOECTs, achieving maximum drain currents ($I_{ONS}$) of $8.2\pm0.5\times10^{-2}$ A ($V_D=-0.5$ V, $V_G=-0.5$ V) and $2.5\pm0.1\times10^{-2}$ A ($V_D=+0.5$ V, $V_G=+0.7$ V) and $g_m$s of $384.1\pm17.8$ mS and $251.2\pm7.6$ mS, respectively (FIG. 6G). Note that despite the ultra-small L (~100 nm), the $I_{ON}/I_{OFF}$ of both devices is impressive ($\geq10^6$). All p- and n-type vOECTs retained stable turn-on voltages ($V_{ON}$) of +0.10 and +0.21 V as well as subthreshold swing (SS) of ~60 and ~62 mV/decade, respectively, upon scanning $V_D$ from ±0.1 to +0.5 V. More relevant parameters for vertical architectures are the area-normalized $g_m$ ($g_{m,A}$) and $I_{ON}$ ($I_{ON,A}$). As shown in FIGS. 6E-6F, $g_{m,A}$ ($I_{ON,A}$) of 226.1 µS/µm$^2$ (4036 A/cm$^2$) and 112.4 µS/µm$^2$ (1015 A/cm$^2$) were achieved for p- and n-type vOECTs, respectively. These values are about 18× (13×) and 100×(1000×) greater than those measured in the corresponding p- and n-type cOECTs, respectively (Table 1). Thus, the p-type vOECTs exhibited the highest $g_{m,A}$ and $I_{ON,A}$ values reported to date, even surpassing those of heavily doped/depletion mode PEDOT:PSS OECTs, while the n-type vOECT performance surpassed all of the previously reported OECTs (including p-type OECTs) known to the inventors in terms of $g_{m,A}$ and $I_{ON}/I_{OFF}$.

trodes and was not confined to the two narrow regions of the semiconductor in direct contact with the electrolyte.

The vOECTs exhibited good transistor behavior even when operated at a $V_D$ of only ±0.001 V. Note, especially for n-type vOECTs, $V_{ON}$ shifted from +0.43 to +0.21 V when $V_D$ was only increased from +0.001 to +0.1 V, due to the drain-induced barrier lowering (DIBL), a short channel effect. For n-type cOECTs reported in the literature, and here specifically for the Homo-gDPP cOECT control, the energy mismatch between the n-type semiconductor LUMO level and the Au electrode work function resulted in a very high $V_{ON}$ (>+0.4 V), and the limited electrochemical window of the aqueous electrolyte prevented the application of large $V_G$ biases. This is one of the key limitations of current n-type cOECTs and where DIBL plays a key role in the n-type vOECT performance enhancement seen here. Equally important, common issues of short channel transistors, such as loss of saturation, $V_T$ roll-off, and reduced current modulation, were absent in the vOECTs (FIGS. 6A-6G). This result is possible only if bulk redox processes occur so that the carrier concentration of the entire semiconducting layer is modulated. The low SS of ~60 mV/decade measured for both vOECTs (FIGS. 6C, 6D) is another convincing proof of the extremely effective gating effect in this architecture. Furthermore, unlike cOECTs where the region with SS~60 mV/decade, if achieved, is narrow, the present vOECTs have a very wide subthreshold region [0.0~-0.2 V for gDPP-g2T and +0.3~+0.6 V for Homo-gDPP] with SS near or equaling the ~60 mV/decade thermal limit. The wide subthreshold region is particularly useful for applications where high voltage gain and low power consumption are vital.

Cycling stability along with transient response of vOECTs were next assessed. As shown in FIGS. 7A, 7B, for both p- and n-type vOECTs, >50000 stable switching cycles were recorded. Aside from the ultra-stable performance, vOECT turn-on transient time ($\tau_{ON}$) was <1 ms for both devices (FIGS. 7C, 7D), which is ~6-9× shorter than those of the

TABLE 1

Summary of OECT performance metrics.

| Device | | $V_D$ (V) | Device area[a] (µm$^2$) | $I_{ON}$ (A) | $I_{ON}:I_{OFF}$ | $V_{ON}$ (V) | $g_m$ (mS) | $I_{ON,A}$ (A/cm$^2$) | $g_{m,A}$ (µS/µm$^2$) |
|---|---|---|---|---|---|---|---|---|---|
| p-type | vOECT | -0.1 | 30 × 30 | (1.2 ± 0.2) × 10$^{-2}$ | 1.2 × 10$^6$ | +0.10 ± 0.02 | 66.6 ± 9.7 | 1318 ± 173 | 74.0 ± 10.8 |
| | | | 50 × 50 | (1.9 ± 0.2) × 10$^{-2}$ | 1.0 × 10$^6$ | +0.11 ± 0.02 | 115.0 ± 10.7 | 760 ± 63 | 46.0 ± 4.3 |
| | | | 50 × 50 | (2.5 ± 0.2) × 10$^{-2}$ | 9.6 × 10$^5$ | +0.12 ± 0.01 | 150.8 ± 9.1 | 505 ± 35 | 30.8 ± 1.9 |
| | cOECT | | 100 × 10 | (9.1 ± 1.4) × 10$^{-4}$ | 3.8 × 10$^4$ | -0.05 ± 0.02 | 4.1 ± 0.4 | 91 ± 14 | 4.1 ± 0.4 |
| | vOECT | -0.5 | 30 × 30 | (3.6 ± 1.1) × 10$^{-2}$ | 3.3 × 10$^5$ | +0.06 ± 0.01 | 203.5 ± 34.4 | 4036 ± 1323 | 226.1 ± 38.2 |
| | | | 50 × 50 | (5.8 ± 0.4) × 10$^{-2}$ | 3.9 × 10$^5$ | +0.08 ± 0.01 | 299.4 ± 27.8 | 2322 ± 156 | 119.8 ± 11.1 |
| | | | 50 × 50 | (8.2 ± 0.5) × 10$^{-2}$ | 4.5 × 10$^5$ | +0.10 ± 0.01 | 384.1 ± 17.8 | 1668 ± 100 | 78.4 ± 3.6 |
| | cOECT | | 100 × 10 | (3.1 ± 0.4) × 10$^{-3}$ | 7.1 × 10$^3$ | -0.11 ± 0.01 | 12.7 ± 1.3 | 308 ± 42 | 12.7 ± 1.3 |
| n-type | vOECT | +0.1 | 30 × 30 | (6.3 ± 0.9) × 10$^{-3}$ | 2.4 × 10$^7$ | +0.22 ± 0.01 | 59.5 ± 6.6 | 698.1 ± 103.1 | 66.1 ± 7.3 |
| | | | 50 × 50 | (1.1 ± 0.5) × 10$^{-2}$ | 2.3 × 10$^7$ | +0.21 ± 0.01 | 99.4 ± 3.3 | 456.0 ± 21.9 | 39.8 ± 1.3 |
| | | | 70 × 70 | (1.7 ± 0.1) × 10$^{-2}$ | 3.5 × 10$^7$ | +0.20 ± 0.01 | 150.0 ± 3.6 | 356.1 ± 14.8 | 30.6 ± 0.7 |
| | cOECT | | 100 × 10 | (4.2 ± 0.6) × 10$^{-5}$ | 9.9 × 10$^3$ | +0.51 ± 0.01 | 0.48 ± 0.28 | 4.2 ± 0.6 | 0.48 ± 0.28 |
| | vOECT | +0.5 | 30 × 30 | (9.1 ± 0.9) × 10$^{-3}$ | 1.3 × 10$^7$ | +0.22 ± 0.01 | 101.2 ± 6.9 | 1014.8 ± 94.7 | 112.4 ± 7.7 |
| | | | 50 × 50 | (1.4 ± 0.1) × 10$^{-2}$ | 1.1 × 10$^7$ | +0.21 ± 0.01 | 167.4 ± 6.9 | 576.0 ± 45.6 | 67.0 ± 2.8 |
| | | | 70 × 70 | (2.5 ± 0.1) × 10$^{-2}$ | 4.6 × 10$^6$ | +0.20 ± 0.01 | 251.2 ± 7.6 | 500.0 ± 27.4 | 51.3 ± 1.6 |
| | cOECT | | 100 × 10 | (4.0 ± 0.6) × 10$^{-5}$ | 9.5 × 10$^3$ | +0.41 ± 0.01 | 0.49 ± 0.28 | 4.0 ± 0.6 | 0.49 ± 0.28 |

The vOECTs were fabricated using simple thermal evaporation of dense and thick (150 nm) Au electrodes through a shadow mask, in combination with a photo-patternable semiconductor layer, to create a structure with excellent ion intercalation. Using a semi-transparent Au top electrode (FIG. 3A), it was demonstrated that the electrochromic switch associated with the redox chemistry encompassed the entire semiconductor area between the top/bottom eleccorresponding cOECTs ($\tau_{ON}$=6.75 ms and 9.73 ms for p-type and n-type cOECTs). To understand the mechanism of the faster vOECT switching process, electrolyte capacitors with the structure shown in FIG. 8 were fabricated, and the electrochromic process associated with the charging/discharging process dynamics was monitored. When $V_G$ was switched from 0 V to -0.7 V, the polymer film located in direct contact with the Au electrode oxidized immediately (within 100 ms in a 2×0.5 mm² area). This reflects the very high electric field (E) near Au increasing the ion drift velocity, s ($s=\mu_i E$, where $\mu_i$=ion mobility), thus effecting faster doping. Next, as the charging process continued, the entire electrolyte area covered semiconductor (~6×2.5 mm²) oxidized slowly (~2 s), starting from the semiconductor near the Au electrode.

Similarly, the reduction also began from the semiconductor in direct contact with the Au electrode, followed by the portion near the edges. Therefore, since the entire vOECT channel layer was in direct contact with the Au electrode, the redox process was intrinsically fast. This mechanism is fundamentally different from that for lateral cOECT architectures, where even for ultra-small channel dimensions, the vast majority of the redox chemistry occurs in the semiconductor film located distant from the contacting electrodes, resulting in significantly slower switching. Thus, the present vOECTs exhibited the shortest is among known n-type OECTs and rival those of the fastest p-type OECTs to date, without extensive optimization of the vOECT electrolyte or electrode patterning.

Figure 4A:
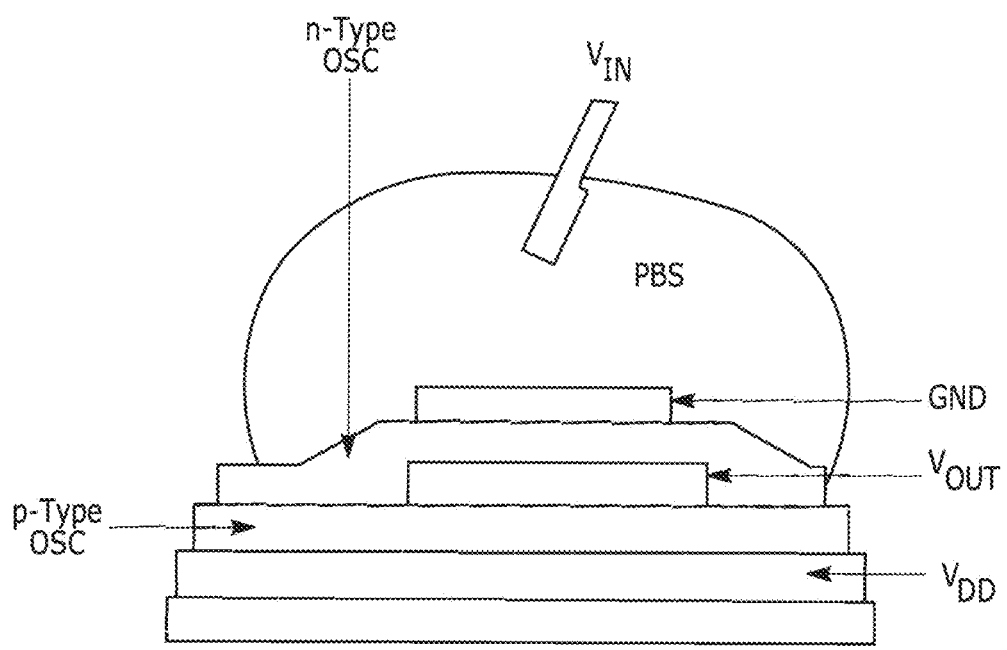
FIGS. 4A-4J show vertically stacked complementary circuits based on vOECTs.
Figure 4B:
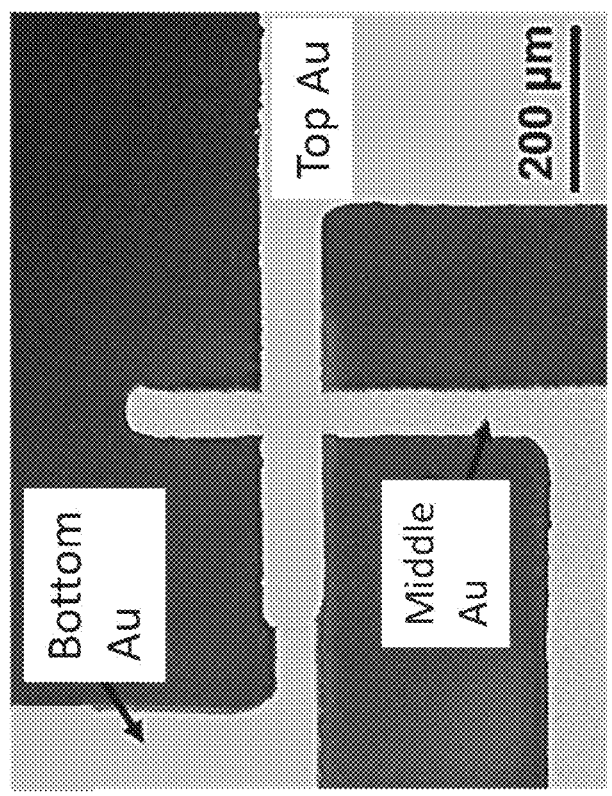
Figure 4C:
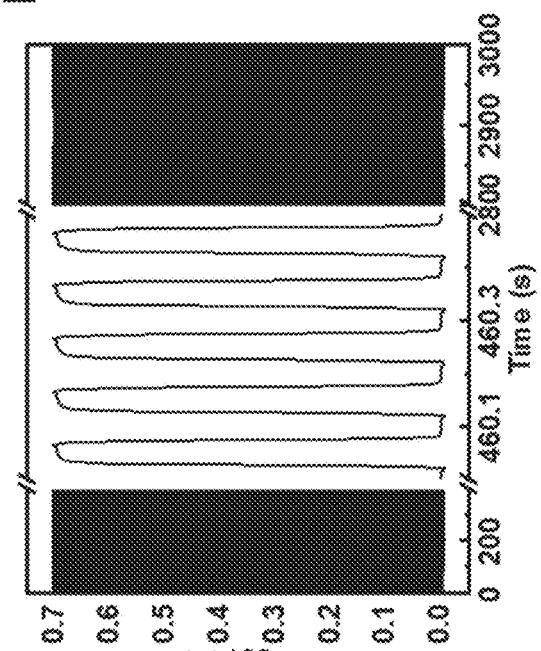
Figure 4D:
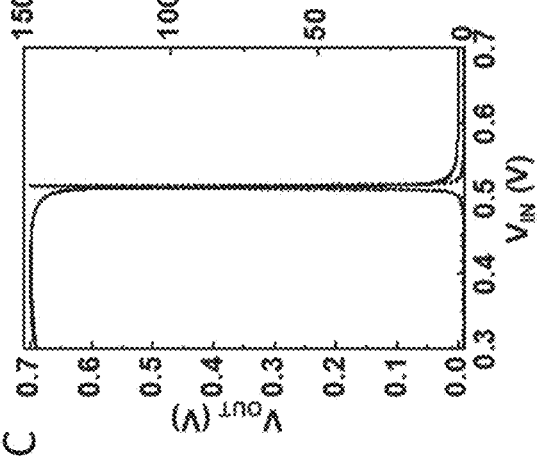
Figure 4E:
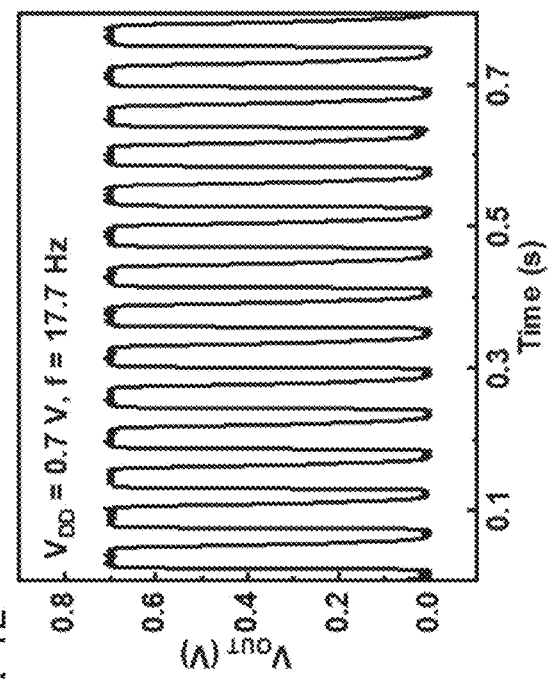
Figure 4F:
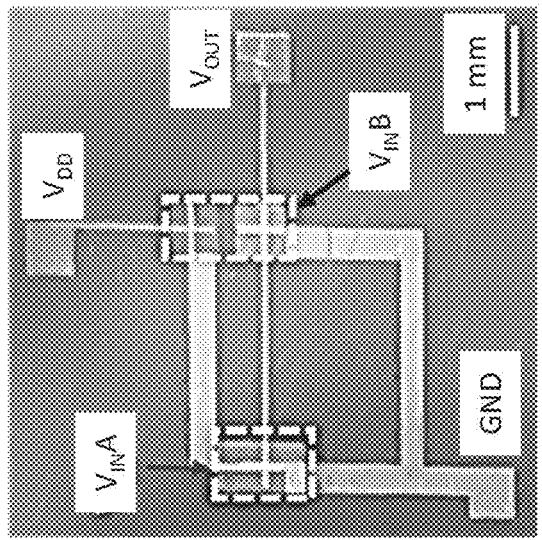
Figure 4G:
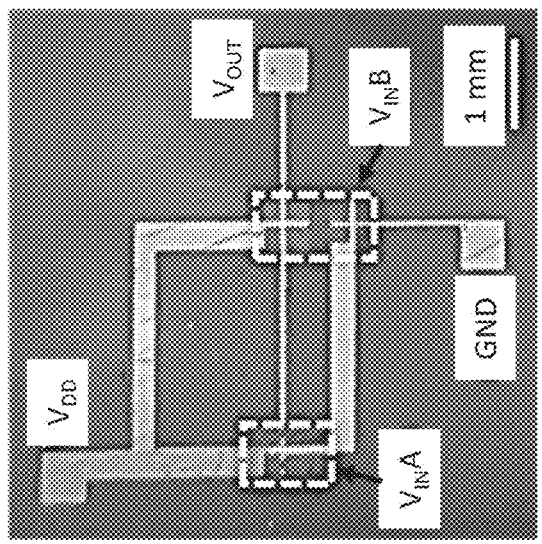
Figure 4H:
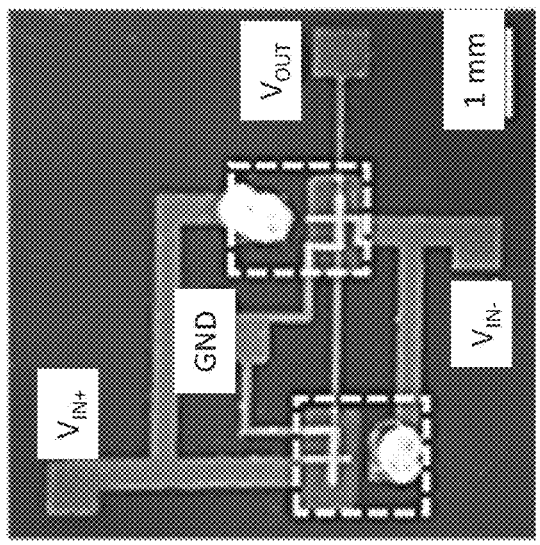
Figure 4I:
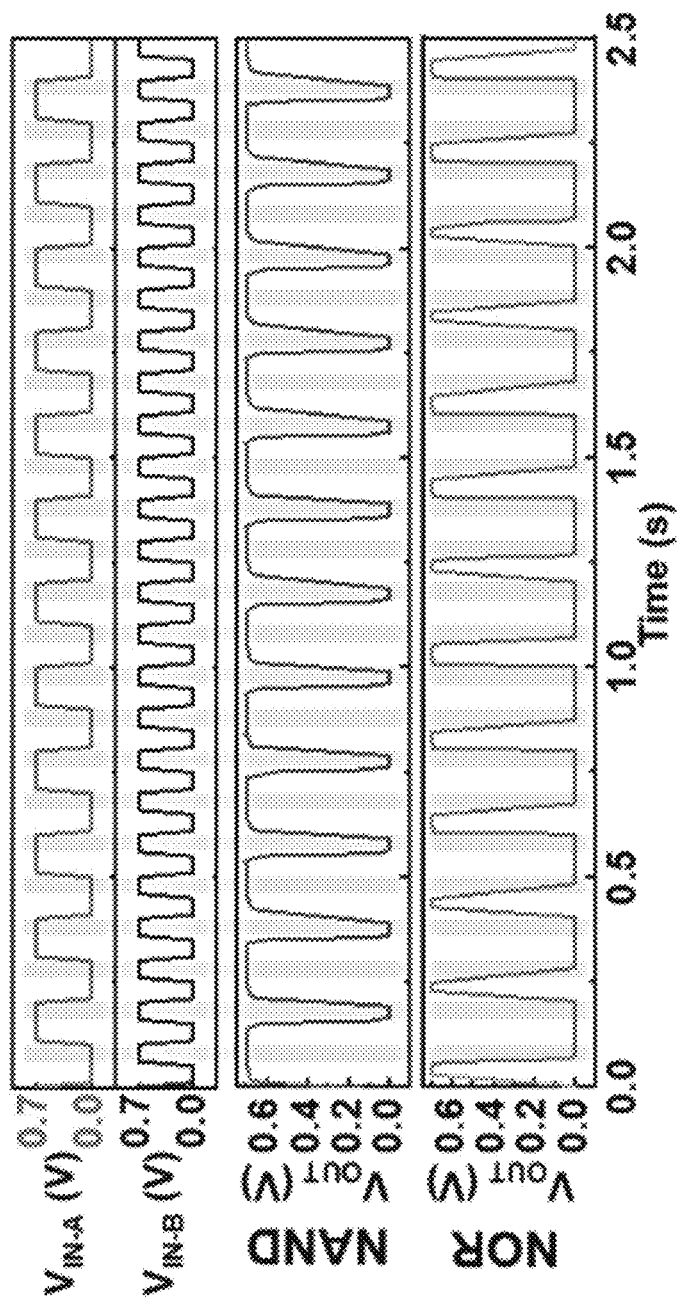
Figure 4K:
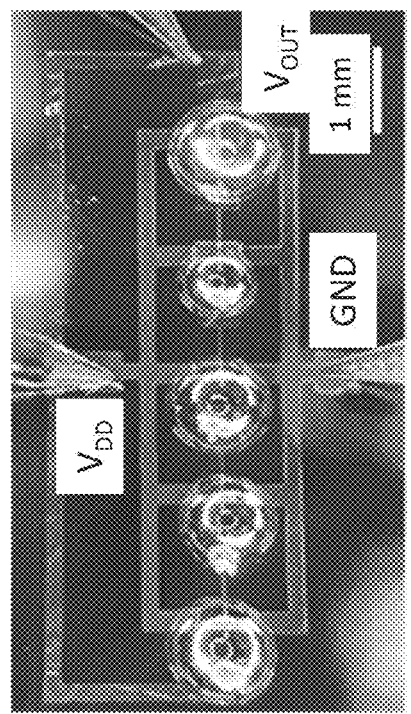
FIG. 4K shows an image of the oscillator.
Figure 4J:
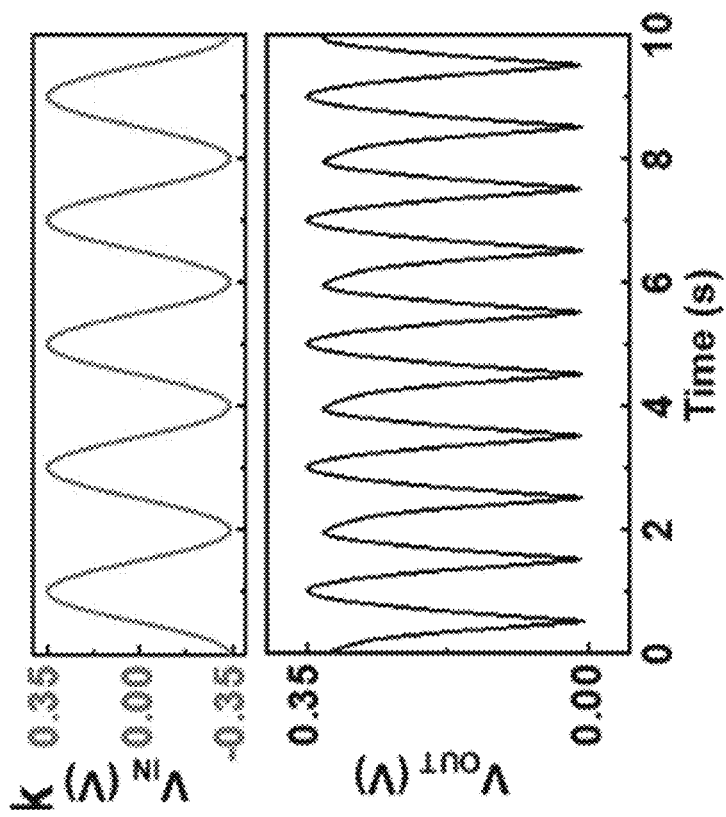

The fabrication of vertically stacked complementary inverters (VSCIs) was possible due to the unique operation mechanism, simple fabrication process, and high stability of the present vOECTs. FIG. 4A shows a schematic of the VSCI, where the n-type vOECT sits directly on top of p-type vOECT. Such 3D geometry enables much higher integration density as it requires 50% less footprint per inverter (FIG. 4B). The voltage output characteristics indicate that the VSCI possessed a sharp voltage transition with a gain up to ~150 (driving voltage=+0.7 V, FIG. 4C), and it was stable for >30000 switching cycles (FIG. 4D), further corroborating the excellent stability of both n-type and p-type vOECTs. Thus, a 5-stage ring oscillator (FIG. 4K) was fabricated based on the VSCI (FIGS. 9A-9B), and the output signal began to oscillate between 0.0 and +0.7 V at a frequency of 17.7 Hz ($V_{DD}$=+0.7 V. FIG. 4E). This corresponds to a propagation delay of ~5.6 ms for each inverter. Finally, NAND and NOR logic gates operating between 0.0 and +0.7 V (FIGS. 4F-4H, FIGS. 10A-10B) as well as a rectifier based on VSCI (0.35V amplitude, FIGS. 4I-4J and FIG. 10C) were fabricated demonstrating a library of circuit units. Note, previous cOECT-based ring oscillators, NANDs, and NORs were constructed with unipolar p-type cOECTs while complementary circuits were limited at the preliminary stage of an inverter due to the low performance of the n-type cOECTs. Thus, the vOECTs enable not only VSCI, far outperforming the corresponding state-of-the art cOECT inverters, but also facilitate integration of this electrochemical technology into more complex complementary electronics.

Experimental Details

Materials Synthesis

The synthetic route to the new polymers gDPP-g2T and Homo-gDPP is illustrated in Scheme 1 in FIG. 12. Unless otherwise stated, all reactions were carried out under argon and the solvents were used without any purification. 2,5,8,11,14-Pentaoxahexadecan-16-yl 4-methylbenzenesulfonate (1), 3,6-di(thiophen-2-yl)-2,5-dihydropyrrolo[3,4-c]pyrrole-1,4-dione (2), and 5,5'-bis(trimethyltin)-3,3'-bis(2-(2-(2-methoxyethoxy)ethoxy)ethoxy)-2,2'-bithiophene (5) were synthesized according to previously reported procedures. (M. D. Tzirakis, et al., Chemistry 20, 16070-16073 (2014); J. Chen et al., J. Mater. Chem. A 4, 4952-4961 (2016); C. K. Song et al., ACS Appl. Mater. Interfaces 6, 19347-19354 (2014).) Hexabutyldistannane (6) was purchased from Sigma-Aldrich. The Cinnamate Cellulose polymer (Cin-Cell) was prepared according to a previous publication. (Z. Wang et al., Chem. Mater. 31, 7608-7617 (2019).)

Synthesis of 2.5 di(2,5,8,11,14-pentaoxahexadecan-16-yl)-3,6-di(thiophen-2-yl)-2,5-dihydropyr-rolo[3,4-c]pyrrole-1,4-dione (3). Compound 1 (6.00 g, 14.76 mmol), compound 2 (1.84 g, 6.15 mmol), $K_2CO_3$ (4.25 g, 30.75 mmol), and 40 mL DMF were added to a 100 mL single-neck round-bottom flask. The reaction mixture was purged with argon for 15 min and then heated to 150° C. overnight. After cooling to 25° C., the solvent was removed under reduced pressure. The residue was next dissolved in chloroform and then washed with water and brine 3 times each. The organic phase was then dried over anhydrous $Na_2SO_4$, filtered, and the solvent was removed under vacuum to leave the crude product which was then purified by silica gel chromatography, eluting with chloroform/methanol (100:1 to 20:1). Compound 3 was obtained as a red solid (1.71 g, yield: 36%). $^1$H NMR (500 MHz, $CDCl_3$): δ (ppm)=8.75 (d, J=3.9 Hz, 2H), 7.64 (d, J=5.0 Hz, 2H), 7.26 (dd. J=5.0 Hz, 3.9 Hz, 2H), 4.26 (t, J=6.3 Hz, 4H), 3.78 (t, J=6.4 Hz, 4H), 3.66-3.51 (m, 32H), 3.36 (s, 6H). $^{13}$C NMR (126 MHz, $CDCl_3$): δ (ppm)=161.54, 140.44, 134.78, 130.91, 129.68, 128.46, 107.89, 71.94, 70.72, 70.62, 70.60, 70.58, 70.57, 70.52, 68.94, 59.04, 41.88. HRMS (MALDI): calcd for $C_{36}H_{52}N_2NaO_{12}S_2$ (M+Na$^+$): 791.2859; found, 791.2851.

Synthesis of 3,6-bis(5 bromothiophen-2-yl)-2,5-di(2,5,8,11,14-pentaoxahexadecan-16-yl)-2,5-dihydropyrrolo[3,4-c]pyrrole-1,4-dione (4). Compound 3 (1.00 g, 1.30 mmol) was dissolved in 30 mL of chloroform in a 100 mL single-neck round-bottom flask. The reaction mixture was cooled to 0° C. and NBS (0.48 g, 2.73 mmol) was added in one portion under argon. The reaction mixture was slowly warmed to room temperature and stirred overnight in the dark, 100 mL of water was added and stirred for 30 minutes. The organic layer was separated and dried over anhydrous $Na_2SO_4$, filtered, and the solvent was removed under vacuum to leave a residue which was purified by silica gel chromatography with chloroform/methanol (100:1 to 50:1). Compound 4 was obtained as a purple solid (0.86 g, yield: 71%). $^1$H NMR (500 MHz, $CDCl_3$): δ (ppm)=8.48 (d, J=4.2 Hz, 2H), 7.20 (d, J=4.2 Hz, 2H), 4.16 (t, J=6.0 Hz, 4H), 3.76 (t, J=6.0 Hz, 4H), 3.66-3.51 (m, 32H), 3.36 (s, 6H). $^{13}$C NMR (126 MHz, $CDCl_3$): δ (ppm)=161.26, 139.48, 134.86, 131.41, 131.12, 119.35, 107.97, 71.93, 70.76, 70.61, 70.58, 70.56, 70.50, 68.94, 59.03, 42.24, 29.60. HRMS (MALDI): calcd for $C_{36}H_{50}Br_2N_2NaO_{12}S_2$ (M+Na$^+$): 949.1049; found, 949.1044.

Synthesis of polymer gDPP-g2T. Compound 4 (92.67 mg, 0.10 mmol), compound 5 (81.62 mg, 0.1 mmol), $Pd_2(dba)_3$ (3.00 mg), and P(o-Tol)$_3$ (7.60 mg) were added to a 10 mL reaction vessel. After the reaction mixture was pump/purged 3 cycles with argon, anhydrous toluene (1.5 mL) and DMF (1.5 mL) were added. The sealed vessel was next heated at 110° C. for 12 h. The polymer was then end-capped with 20 μL of 2-(tributylstannyl)-thiophene and next 50 μL of 2-bromothiophene; each step was carried out at 110° C. for 1h. After cooling to room temperature, the mixture was poured into 100 mL of MeOH+1 mL of concentrated HCl. The resulting precipitate was collected by filtration and then purified by Soxhlet extraction using methanol, acetone, hexane, and then chloroform. The chloroform portion was concentrated and then poured into MeOH (~100 mL). The resulting precipitate was collected by vacuum filtration as a black solid (106.51 mg, yield: 86%). $^1$H NMR (500 MHz, $C_2D_2Cl_4$): δ (ppm)=8.73-8.69 (br, 2H), 7.43-6.84 (br, 4H), 4.34-4.25 (br, 8H), 3.94-3.45 (m, 56H), 3.29 (s, 12H). Anal. Calcd for [$C_{58}H_{84}N_2O_{20}S_4$]n: C, 55.40; H, 6.73; N, 2.23. Found: C, 55.41; H, 6.67; N, 2.37.

Synthesis of polymer Homo-gDPP The polymer Homo-gDPP was synthesized using the same method as used for gDPP-g2T. Compound 4 (199.00 mg, 0.21 mmol), compound 6 (124.57 mg, 0.21 mmol). $Pd_2(dba)_3$ (5.00 mg), $P(o\text{-}Tol)_3$ (13.00 mg) were used as starting materials. The pure polymer was obtained as a black solid (100.00 mg, yield: 62%). $^1$H NMR (500 MHz, $C_2D_2Cl_4$): δ (ppm)=8.91-8.69 (br, 2H), 7.43-7.22 (br, 2H), 4.25 (br, 4H), 3.78-3.54 (br, 36H), 3.46 (br, 6H). Anal. Calcd for [$C_{36}H_{52}N_2O_{12}S_2$]n; C, 56.23; H, 6.82; N, 3.64. Found: C, 56.26; H, 6.83; N, 3.76.

Materials Characterization $^1$H and $^{13}$C NMR spectra of intermediates were recorded on a Bruker Ascend 500 MHz spectrometer using deuterochloroform ($CDCl_3$) as solvent at room temperature. $^1$H spectra of polymers were recorded on a Bruker Ascend 500 MHz spectrometer using dideutero-1, 1, 2, 2-tetrachloroethane ($C_2D_2Cl_4$) at 100° C., which was also used to estimate the molecular weight. The purity of polymers was verified by elemental analyses (EA) carried out at Midwest Microlabs Inc.

VT-NMR and $M_n$ Estimation Via End-Group Analysis

Solutions for NMR experiments were prepared by dissolving ~5 mg of polymer in 0.7 mL $C_2D_2Cl_4$. The solution was heated at 100° C. for 16 hours before measurement to ensure complete dissolution of the polymer. Measurements were performed on a 400 MHz Bruker Avance III HD Nanobay at 100° C., and spectra were referenced to $CDHCl_4$ at 5.90 ppm. End-groups were identified based on literature compounds of similar structure. (K. Wang et al., *J Polym. Sci. Part A: Polym. Chem.* 55, 1040-1047 (2017); A. Punzi et al., *Eur. J. Org. Chem.* 2016, 3233-3242 (2016).) Calculation of the $M_n$ from end-group analysis was based on equation 1, which is described in the literature. (J. U. Izunobi et al., *J. Chem. Educ.* 88, 1098-1104 (2011).)

$$n_x = \frac{a_x m_y n_y}{a_y m_x} \quad (1)$$

where $a_x$ is the corrected number of repeat unit protons, $m_y$ is the number of end-group protons used for the calculation, $a_y$ is the area of the end-group protons, and mx is the number of repeat unit protons.

For Homo-gDPP: $n_x$=[(10.65)(2)(2)]/[(1)(2)]=21.3≈21. $M_n$=(21×0.76893)=16.4 kDa.

For gDPP-g2T: $n_x$=[(16.8)(22)]/[(1)(2)]=33.6≈34. $M_n$=(34×1.16744)=39.7 kDa.

OECT and Complementary Circuits Fabrication

Semiconductor Solution Preparation. The gDPP-g2T, Homo-gDPP, and Cin-Cell were first dissolved in chloroform at a concentration of 20 mg/mL and filtered through a 0.45 μm PVDF filter. Then, the gDPP-g2T or Homo-gDPP solution was mixed with the Cin-Cell solution in a volume ratio of 9:2 for device fabrication using the blends.

Conventional OECT Fabrication (FIG. 5). A Si wafer with a 300 nm thick $SiO_2$ layer was used as the substrate. It was first ultrasonically cleaned in an IPA bath for 20 min and then with oxygen plasma for 5 min. S1813 photoresist was spin-coated at 4000 rpm for 45 s, followed by annealing at 110° C. for 60 s and exposing under a maskless aligner system (MLA150; Heidelberg Instruments), developed in AZ400k (Microchemicals) for 40 s, rinsed with DI water, and blow-dried. Next, 3 nm Cr and 50 nm Au were deposited by thermal evaporation and developed by soaking in acetone for 5 min to remove the S1813. Here, the patterned planar Au source/drain electrodes defined the channel dimension of W=300 μm and L=10 μm. The p- or n-type semiconductor blend solution was then spin-coated at 3000 rpm for 20 s and UV cross-linked for 30 s (Inpro Technologies F300S). At last, a droplet (1~20 μL, based on the channel area) of PBS (1×) was applied on the electrode overlapping area, and an Ag/AgCl electrode was inserted in the droplet acting as the OECT gate electrode.

Vertical OECT Fabrication, vOECTs were also fabricated on a pre-cleaned Si/300 nm $SiO_2$ wafer. First, 3 nm of Cr and 150 nm of Au (rate: 0.5~2.0 Å/s) were thermally evaporated with a shadow mask as the bottom source electrode. Next, the semiconductor blend solution was spin-coated on the substrate at 3000 rpm for 20 s. The semiconducting layer was then UV cross-linked for 30 s (Inpro Technologies F300S). Note, the semiconducting layer can be further patterned by developing in chloroform for 3 s and blow-dried, if cross-linked with a photomask. The top drain electrode (150 nm Au) was then thermally evaporated (rate: 0.5~2.0 Å/s) with a shadow mask while maintaining the substrate at a temperature ~ 20° C. with a back water-cooling system. Finally, a droplet (1~20 μL, based on the channel area) of PBS (1×) was applied on the electrode overlapping area, and an Ag/AgCl electrode was inserted in the droplet acting as the OECT gate electrode. Control devices using the pure semiconductors were fabricated following the same procedure but using pure polymer solutions and without UV exposure.

Complementary Inverter Fabrication. An illustration of the fabrication process can be found in FIG. 9A. For inverter fabrication, a layer of the opposite type semiconductor blend was spin-coated (3000 rpm for 20 s) directly on the first vOECT (before applying the PBS electrolyte and the Ag/AgCl electrode), and UV cross-linked for 30s. Next, the third Au electrode (150 nm) was evaporated with a shadow mask as describe above. Note, the third Au electrode was carefully aligned to overlap the active area of the bottom vOECT. Finally, a droplet (1~20 μL, based on the channel area) of PBS (1×) was applied on the electrode overlapping area, and an Ag/AgCl electrode was inserted in the droplet acting as $V_{IN}$ of the inverter.

Complementary Ring Oscillator Fabrication. An illustration of the fabrication process can be found in FIG. 9B. The 5-stage ring oscillator was also fabricated on a pre-cleaned Si/300 nm $SiO_2$ wafer. First, 3 nm Cr and 150 nm Au were thermally evaporated with a shadow mask as the bottom electrode ($V_{DD}$). Next, the p-type gDPP-g2T:Cin-Cell mixture solution was spin-coated on the substrate at 3000 rpm for 20 s and crosslinked under UV for 30 s with a shadow mask. The film was patterned by immersing in chloroform for 3 s and blow dried. Next, 150 nm Au was thermally evaporated with a shadow mask as the middle electrode ($V_{OUT}$). The n-type Homo-gDPP:Cin-Cell mixture was then spin-coated/photopatterned as that of the p-type polymer blend. Then, 150 nm Au top electrode (GND) was thermally evaporated with a shadow mask. Pure Cin-Cell solution was then spin-coated at 5000 rpm for 20 s, crosslinked under UV for 60 s with a shadow mask, and developed in chloroform for 3 s, to leave openings for the active channel areas and $V_{OUT}$ electrodes. Ag/AgCl paste (Creative Materials, 125-20) was applied on the $V_{OUT}$ electrodes of each inverter and vacuum dried for 30 min. Finally, a drop of PBS electrolyte (~2 μL) was applied on each $V_{OUT}$ electrode and its adjacent inverter active channel area.

NAND and NOR Fabrication. An illustration of the fabrication process can be found in FIGS. 10A-10B. NAND and NOR logic gates were also fabricated on a pre-cleaned Si/300 nm $SiO_2$ wafer. First, 3 nm Cr and 150 nm Au were thermally evaporated with a shadow mask as the bottom electrode. Next, the p-type gDPP-g2T:Cin-Cell mixture solution was spin-coated on the substrate at 3000 rpm for 20 s and crosslinked under UV for 30 s with a shadow mask. The film was patterned by immersing in chloroform for 3 s and blow dried. Next, 150 nm Au was thermally evaporated with a shadow mask as the middle electrode (Vou r). The n-type Homo-gDPP:Cin-Cell mixture was then spin-coated/photopatterned as that of the p-type polymer blend but with a different shadow mask. Then, 150 nm Au top electrode was thermally evaporated with a shadow mask. Pure Cin-Cell solution was spin-coated at 5000 rpm for 20 s, crosslinked under UV for 60 s with a shadow mask, and developed in chloroform for 3 s, to leave openings for the active channel areas. Finally, two drops of PBS electrolyte (~2 μL) were applied on each $V_{IN}$ area along with two Ag/AgCl electrodes as $V_{IN-A}$ and $V_{IN-B}$, respectively.

Rectifier Fabrication. An illustration of the fabrication process can be found in FIG. 10C. The rectifier was also fabricated on a pre-cleaned Si/300 nm $SiO_2$ wafer. First, 3 nm Cr and 150 nm Au were thermally evaporated with a shadow mask as the bottom electrode ($V_{OUT}$). Next, the p-type gDPP-g2T:Cin-Cell mixture solution was spin-coated on the substrate at 3000 rpm for 20 s and crosslinked under UV for 30 s with a shadow mask. The film was patterned by immersing in chloroform for 3 s and blow dried. Next, 150 nm Au was thermally evaporated with a shadow mask as the middle electrode ($V_{IN+}$ and $V_{IN-}$). The n-type Homo-gDPP: Cin-Cell mixture was then spin-coated/photopatterned as that of the p-type polymer blend. Then, 150 nm Au top electrode (GND) was thermally evaporated with a shadow mask. Pure Cin-Cell solution was then spin-coated at 5000 rpm for 20 s, crosslinked under UV for 60 s with a shadow mask, and developed in chloroform for 3 s, to leave openings for the active channel areas and VN electrodes. Ag/AgCl paste (Creative Materials, 125-20) was applied on the VN electrodes and vacuum dried for 30 min. Finally, two drops of PBS electrolyte (~ 2 μL) were applied on each $V_{IN}$ electrode and its adjacent active channel area.

Device Characterization

Electrical characterization of the OECTs and inverters was carried with an Agilent B1500A semiconductor parameter analyzer in ambient. The voltage sweeping speed was 0.1 V/s for the OECT measurements. For transistor and inverter cycling tests, the voltage pulse was generated by a Keysight waveform generator (33500B), while the current/voltage variation was monitored with an Agilent B1500A. During the cycling tests, to maintain a relatively stable PBS electrolyte concentration, a PDMS mold was placed on top of the device active area to confine the electrolyte displacement and slow water evaporation. For the inverter, to access accurate OECT transient behavior, a resistor was added between the source electrode and ground (see insets of FIGS. 7C, 7D), while an oscilloscope (Tektronix, T D S 2014) was utilized to measure the variation of the voltage on the resistor. A $V_D$ of ±0.5 V was applied to the vOECT, and a square pulse (from 0.0 to ±0.7 V) was applied on the gate electrode. Note, the resistance of the resistor should be small enough to ensure the highest voltage measured by the oscilloscope is not higher than $\frac{1}{10}$ of the drain voltage. For the ring oscillator characterization, a constant $V_{DD}$ of +0.7 V was applied with an Agilent B1500A, and the $V_{OUT}$ was monitored by an oscilloscope (Tektronix, T D S 2014). For NAND and NOR characterization, square pulses (from 0.0 to ±0.7 V) with a frequency of 5 Hz and 10 Hz were applied as $V_{IN-A}$ and $V_{IN-B}$, respectively, by a Keysight waveform generator (33500B), and the $V_{OUT}$ was monitored by an Agilent B1500A. For rectifier characterization, two sinusoidal $V_{IN}$ ($V_{IN+}$ and $V_{IN-}$ have a phase difference of 180°) with an amplitude of 0.35 V were generated by a Keysight waveform generator (33500B), and the $V_{OUT}$ was monitored by an Agilent B1500A. All measurements were carried out in ambient.

Semiconductor Film Characterization

SEM characterizations were carried out on a Hitachi SU8030 FE-SEM. AFM characterizations were acquired with a Bruker ICON System. GIWAXS measurements were performed at Beamline 8-ID-E1 at the Advanced Photon Source (APS) at Argonne National Laboratory. Samples were irradiated with a 10.9 keV X-ray beam at an incidence angle 0.125° to 0.135° in vacuum for two summed exposures of 2.5 s (totaling 5 s of exposure), and scattered X-rays were recorded by a Pilatus 1 M detector located 228.16 mm from the sample at two different heights.

Example 2: OECTs Based on Redox-Active p-Type 22T-T, -Type PIBET-AO, n-Type PEG-N2200, and n-Type BTI2 Semiconductors Additional n-type and p-type semiconducting organic polymers blended with a redox-inert/photocurable polymer component [Cin-Cell] were tested as ion-permeable semiconducting channels for OECTs, using the methods described in Example 1. These other semiconducting organic polymers were the p-type polymers g2T-T and the isoindigo-based polymer PIBET-AO and the n-type polymers PEG-N2200 (polyethylene glycol-poly{[N,N'-bis(2-octyldodecyl)-1,4,5,8-naphthalenediimide-2,6-diyl]-alt-5,5' (2,2'-bithiophene)}) and BTI2 (bithiophene imide), the structures of which are shown in FIG. 13. The semiconducting organic polymers were blended with Cin-Cell with a mass ratio of 9:2 and the resulting blends were used as channel materials in both planar and vertical OECT structures. The other semiconductors were synthesized according to known procedures or are commercially available.

FIGS. 14A-14H show representative transfer characteristics for the OECTs. The transfer characteristics show that the OECT transconductances and on-currents were greatly enhanced in vOECTs (Table 2) and, similar to what was observed in the homo-gDPP-based OECTs, the OECTs based on the two n-type semiconducting polymers showed tremendous performance enhancement when incorporated into the vertical structure.

TABLE 2

Summary of the transconductance, on-currents, off-currents, and current on/off ratio of OECTs based on different semiconducting polymers blended with Cin-Cell with a weight ratio of 9:2.

| | Device | Materials | $I_{ON}$ (A) | $I_{OFF}$ (A) | $I_{ON}$:$I_{OFF}$ | $g_m$ (mS) |
|---|---|---|---|---|---|---|
| p-type | vOECT | g2T-T | $(6.7 \pm 0.1) \times 10^{-2}$ | $(6.0 \pm 1.2) \times 10^{-6}$ | $1.1 \times 10^4$ | $270.9 \pm 30.7$ |
| | cOECT | | $(8.2 \pm 0.3) \times 10^{-3}$ | $(9.6 \pm 0.8) \times 10^{-6}$ | $8.5 \times 10^2$ | $30.8 \pm 2.4$ |
| | vOECT | PIBET-AO | $(4.0 \pm 0.2) \times 10^{-2}$ | $(1.5 \pm 0.3) \times 10^{-7}$ | $2.7 \times 10^5$ | $225.5 \pm 17.9$ |
| | cOECT | | $(5.3 \pm 0.4) \times 10^{-4}$ | $(1.1 \pm 0.4) \times 10^{-7}$ | $4.8 \times 10^3$ | $3.8 \pm 0.4$ |
| n-type | vOECT | PEG-N2200 | $(4.9 \pm 0.3) \times 10^{-3}$ | $(1.6 \pm 0.2) \times 10^{-8}$ | $3.1 \times 10^5$ | $17.5 \pm 3.2$ |
| | cOECT | | $(1.2 \pm 0.6) \times 10^{-6}$ | $(4.8 \pm 0.7) \times 10^{-9}$ | $2.5 \times 10^2$ | $0.0042 \pm 0.0007$ |
| | vOECT | BTI2 | $(7.8 \pm 0.6) \times 10^{-3}$ | $(2.8 \pm 0.3) \times 10^{-9}$ | $2.8 \times 10^6$ | $86.6 \pm 10.8$ |
| | cOECT | | $(2.1 \pm 0.5) \times 10^{-7}$ | $(2.5 \pm 2.3) \times 10^{-10}$ | $8.4 \times 10^2$ | $0.0014 \pm 0.0003$ |

[a] The standard deviation of the OECT metrics is from the performance of at least 10 devices.

Example 3: OECT Based on PEDOT:PSS Operating in Depletion Mode

This example demonstrates depletion mode operation of an OECT having a semiconducting channel based on PEDOT:PSS. PEDOT-PSS is used as the semiconductor for fabricating planar OECTs which operate in depletion mode because, in its pristine state. PEDOT:PSS has a high carrier density and, thus, a high conductivity. This stands in contrast to the other semiconducting polymers in the previous examples, which have low carrier densities in their pristine state and, therefore, are suited for OECTs that operate in an accumulation mode. The depletion-mode vertical and planar OECTs based on PEDOT:PSS were fabricated using procedures described in Example 1. The vOECT exhibited excellent transistor behavior relative to the OECT having a conventional planar architecture and it could be efficiently turned off (FIGS. 15A-15C). Such a result would not be observed if only interfacial redox chemistry was occurring in the vOECTs. Therefore, this example demonstrates not only that bulk doping/de-doping occurred but that the OECT architectures are not limited to accumulation-mode semiconductors.

Example 4: Vertically Stacked Complementary Invertor Matrix

This example illustrates the integration of a VSCI into a 10×10 matrix, demonstrating the great fidelity of this process. Matrices of this type can be used for sensing at bio-interfaces and for controlling cell activities and growth, such as those of neurons. FIG. 16 shows an optical image of the matrix (left) with a magnified view of the central part of the matrix (right). FIG. 17 shows a schematic of a cross-sectional view of a single VSCI pixel of a matrix. FIG. 18 shows representative $V_{out}$-$V_{in}$ (and Gain) plots (inset: VSCI circuit schematic). FIGS. 19A and 19B show statistical distributions of the gains across the VSCI matrix.

Additionally, the ion sensing capabilities of a VSCI were studied, and it was demonstrated that the VSCI could sense different ions and, for the same ion, different ion concentrations. FIGS. 20A-20C show the measured transfer characteristics of the vertically stacked complementary inverter based on a vOECT at the indicated concentrations using: (FIG. 20A) NaCl, (FIG. 20B) KCl, and (FIG. 20C) $CaCl_2$ as the electrolytes. This capability has important applications in biosensors.

Example 5: OECT Based on BBL Operating in Accumulation Mode

This example demonstrates accumulation mode OECT devices having a semiconducting channel based on BBL. BBL has unique solubility properties and can be processed using particular solvents, such as trifluoromethanesulfonic acid. Also, it strongly packs in the solid state providing unique film morphologies. This stands in contrast to other semiconducting polymers in the previous examples, which are soluble in more conventional solvents. The vertical and planar OECTs based on BBL were fabricated using procedures described in Example 1, but using trifluoromethanesulfonic acid as the solvent and omitting the photocurable additive. The vOECT exhibited excellent transistor behavior relative to the OECT having a conventional planar architecture (FIGS. 21A-21C). Long term stability was not accessed.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" can mean only one or can mean "one or more." Embodiments of the inventions consistent with either construction are covered.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A polymer composition comprising an organic film comprising:
   a redox-active, semiconducting organic polymer blended with;
   a photocurable crosslinked carbohydrate polymer, wherein the redox-active, semiconducting organic polymer and the photocurable crosslinked carbohydrate polymer are at least partially phase-separated.

2. The composition of claim 1, wherein the photocurable crosslinked carbohydrate polymer is functionalized with a radiation-absorbing functional group.

3. The composition of claim 1, wherein the photocurable crosslinked carbohydrate polymer is functionalized with a cinnamate group, a dienecinnamate group, a cumarine group, a vinyl group, an allyl group, an acrylate group, an azide group, and/or an oxetane group.

4. The composition of claim 1, wherein the redox-active, semiconducting organic polymer is a diketopyrrolopyrrole homopolymer or a diketopyrrolopyrrole copolymer.

5. The composition of claim 1, wherein the redox-active, semiconducting organic polymer is an isoindigo (IID)-based homopolymer or copolymer, a dithienothiophene (DTT)-based homopolymer or copolymer, a benzodithiophene (BDT)-based homopolymer or copolymer, a naphthalene diimide (NDI)-based homopolymer or copolymer, a perylene diimide (PDI)-based homopolymer or copolymer, a thieno[3,4-c]pyrrole-4,6-dione (TPD)-based homopolymer or copolymer, a bithiophene imide (BTI)-based homopolymer or copolymer, a benzothiadiazole (BT)-based homopolymer or copolymer, a indocenodithiophene (IDTT)-based homopolymer or copolymer, a (2,2-((2Z,2Z)-((12,13-bis(2-ethylhexyl)-3,9-diundecyl-12,13-dihydro-[1,2,5]thiadiazolo[3,4-e]thieno[2,"3:4,5]thieno[2,3:4,5]pyrrolo[3,2-g]thieno[2,3:4,5]thieno[3,2-b]indole-2,10-diyl)bis(methanylylidene))bis(5,6-difluoro-3-oxo-2,3-dihydro-1H-indene-2,1-diylidene))dimalononitrile) (Y6)-based homopolymer, a quinoxaline (Qx) based homopolymer or copolymer, poly(3,4-ethylenedioxythiophene) polystyrene sulfonate (PEDOT:PSS), or poly(benzimidazobenzophenanthroline) (BBL).

6. The composition of claim 1, having a concentration of the redox-active, semiconducting organic polymer of greater than 10 weight percent, based on the combined weight of the redox-active, semiconducting organic polymer and the photocurable crosslinked carbohydrate polymer.

7. The composition of claim 1, wherein the redox-active, semiconducting organic polymer and the photocurable crosslinked carbohydrate polymer are dissolved in a solvent or a solvent mixture.

8. A method of forming an ion-permeable, electrically conductive crosslinked organic film, the method comprising:
forming a coating of a composition on a substrate, the composition comprising a redox-active semiconducting organic polymer and photocurable carbohydrate molecules dissolved in a solvent or a solvent mixture on a substrate; and
exposing at least a portion of the coating to radiation that induces crosslinking between the photocurable carbohydrate molecules to form a photocurable crosslinked carbohydrate polymer blended with the redox-active semiconducting organic polymer, wherein the redox-active, semiconducting organic polymer and the photocurable crosslinked carbohydrate polymer are at least partially phase-separated.

9. The method of claim 8, wherein exposing at least a portion of the coating to radiation comprises:
exposing a first portion of the coating to the radiation; and
shielding a second portion of the coating from the radiation.

10. The method of claim 9, further comprising selectively dissolving the composition in the second portion of the coating to form a patterned crosslinked organic film.

11. A vertical organic electrochemical transistor comprising:
a source;
a drain;
an ion-permeable semiconducting channel comprising an organic film in electrical communication with the source and the drain, the organic film comprising: a redox-active, semiconducting organic polymer blended with a photocurable crosslinked carbohydrate polymer that is functionalized with a radiation-absorbing functional group, wherein the redox-active, semiconducting organic polymer and the photocurable crosslinked carbohydrate polymer are at least partially phase-separated;
an electrolyte in contact with the ion-permeable semiconducting channel; and
a gate in contact with the organic electrolyte.

12. The transistor of claim 11, wherein the electrolyte comprises an aqueous salt solution and ionic liquids, a polymer electrolyte comprising salt cations and anions coordinated with a polymer chain, an ion gel, a polyelectrolyte, or a lithium metal oxide.

13. A complementary circuit comprising: a first vertical organic electrochemical transistor electrically connected to a complementary channel vertical organic electrochemical transistor, wherein the first vertical organic electrochemical transistor comprises:
a source;
a drain;
an ion-permeable semiconducting channel comprising an organic film in electrical communication with the source and the drain, the organic film comprising: a redox-active, semiconducting organic polymer blended with a photocurable crosslinked carbohydrate polymer that is functionalized with a radiation-absorbing functional group, wherein the redox-active, semiconducting organic polymer and the photocurable crosslinked carbohydrate polymer are at least partially phase-separated;
an electrolyte in contact with the ion-permeable semiconducting channel; and
a gate in contact with the organic electrolyte.

14. A method of making a vertical organic electrochemical transistor, the method comprising:
forming a first electrode;
applying a composition on a surface of the first electrode, the composition comprising a blend of a redox-active, semiconducting organic polymer and a photocurable carbohydrate molecules;
exposing at least a portion of the composition to radiation that induces crosslinking the photocurable carbohydrate molecules to form a crosslinked organic film comprising a photocurable crosslinked carbohydrate polymer blended with the redox-active, semiconducting organic polymer, wherein the redox-active, semiconducting organic polymer and the photocurable crosslinked carbohydrate polymer are at least partially phase-separated;
forming a second electrode on a surface of the crosslinked organic film;
placing an electrolyte in contact with the crosslinked organic film; and
placing a gate in contact with the electrolyte.

15. The method of claim 14, wherein the composition comprises the redox-active, semiconducting organic polymer and the photocurable carbohydrate molecules dissolved in a solvent or a solvent mixture.

16. The method of claim 14, wherein exposing at least a portion of the composition to radiation comprises:
exposing a first portion of the composition to the radiation; and
shielding a second portion of the composition from the radiation, and the method further comprises selectively dissolving the composition in the second portion of the coating.

* * * * *